United States Patent
Miyasaka et al.

(10) Patent No.: US 6,180,957 B1
(45) Date of Patent: *Jan. 30, 2001

(54) THIN-FILM SEMICONDUCTOR DEVICE, AND DISPLAY SYSTEM USING THE SAME

(75) Inventors: Mitsutoshi Miyasaka; Yojiro Matsueda; Satoshi Takenaka, all of Suwa (JP)

(73) Assignee: Seiko Epson Corporation, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/827,732

(22) Filed: Apr. 8, 1997

Related U.S. Application Data

(62) Division of application No. 08/406,892, filed as application No. PCT/JP94/01229 on Jul. 26, 1993.

(30) Foreign Application Priority Data

Jul. 26, 1993 (JP) .................................................. 5-184134
Jun. 3, 1994 (JP) .................................................. 6-122838

(51) Int. Cl.$^7$ ............................................... H01L 27/088
(52) U.S. Cl. ............................ 257/57; 257/61; 257/336; 257/344; 257/347; 257/351; 257/353; 257/408; 438/306
(58) Field of Search ........................... 257/408, 336, 257/344, 350, 352, 353, 354, 351, 49, 57, 59, 61, 347; 438/306

(56) References Cited

U.S. PATENT DOCUMENTS

| | | | |
|---|---|---|---|
| 5,208,476 | * | 5/1993 | Inoue ..................................... 257/408 |
| 5,308,998 | * | 5/1994 | Yamazaki et al. ...................... 257/57 |
| 5,323,042 | * | 6/1994 | Matsumoto ............................ 257/350 |
| 5,412,493 | * | 5/1995 | Kunii et al. ............................. 359/59 |
| 5,767,930 | * | 6/1998 | Kobayashi et al. ..................... 349/42 |

FOREIGN PATENT DOCUMENTS

| | | |
|---|---|---|
| 0 383 230 A3 | 8/1990 | (EP) . |
| 0 474 289 A1 | 3/1992 | (EP) . |
| 480635A | 4/1992 | (EP) . |

(List continued on next page.)

OTHER PUBLICATIONS

Faraone, L., et al., "Surface Roughness and Electrical Conduction of Oxide/Polysilicon Interfaces," *J. Electrochem. Soc.*, vol. 133, No. 7, Jul. 1986, pp. 1410–1413.

Agarwal. A, et al., "Microx tm—An All Silicon Microwave Technology" Oct. 1992, *Institute of Electrical Engineers*, pp. 144–145.

(List continued on next page.)

*Primary Examiner*—William Mintel
(74) *Attorney, Agent, or Firm*—Oliff & Berridge, PLC

(57) ABSTRACT

A high-performance thin-film semiconductor device and a simple fabrication method is provided. After a silicon film is deposited at approximately or less 580° C. and at a deposition rate of at least approximately 6 Å/minute, thermal oxidation is performed. This ensures an easy and simple fabrication of a high-performance thin-film semiconductor device. A thin-film semiconductor device capable of low-voltage and high-speed drive is provided. The short-channel type of a TFT circuit with an LDD structure reduces a threshold voltage, increases speed, restrains the power consumption and increases a breakdown voltage. The operational speeds of the thin-film semiconductor device is further increased by optimizing the maximum impurity concentration of an LDD portion, a source portion a drain portion, as well as optimizing the LDD length and the channel length. A display system is provided using these TFTs having drive signals at or below approximately the TTL level.

14 Claims, 56 Drawing Sheets

(2 of 56 Drawing Sheet(s) Filed in Color)

FOREIGN PATENT DOCUMENTS

| | | |
|---|---|---|
| 544229A | 6/1993 | (EP). |
| 62-234372 | 10/1987 | (JP). |
| 62-241375 | 10/1987 | (JP). |
| 63-66969 | 3/1988 | (JP). |
| 63-239936 | 10/1988 | (JP). |
| 63-239937 | 10/1988 | (JP). |
| 2-45972 | 2/1990 | (JP). |
| 2-58274 | 2/1990 | (JP). |
| 2-246277 | 10/1990 | (JP). |
| 3-243771 | 10/1991 | (JP). |
| 5-72555 | 3/1993 | (JP). |
| 5-173179 | 7/1993 | (JP). |
| 5-275701 | 10/1993 | (JP). |
| 6-102531 | 4/1994 | (JP). |

OTHER PUBLICATIONS

Tsutsumi, K, et al., A High Performance Scram Memory Cell with LDD–TFT Loads, *Institute of Electrical Engineers*, pp. 23–24; May 1991.

Journal of Applied Physics. vol. 63, No. 7, Apr. 1, 1988, "Large grain polycrystalline chemical vapor deposited amosphous silicon films".

Extended Abstracts of the 1992 International Conference on Solid State Devices and Materials, Tsukuba, 1992, pp. 693–694, "A Novel Fabrication Method for Poly–Si TFTs with a Self–Aligned LDD Structure".

Patents Abstract of Japan, JP–a–04–180617, published Jun. 26, 1992, "Manufacture of Large Crystal Grain–Sized Polycrystal Silicon and Thin Film Semiconductor Using Same".

Satoshi Takenaka et al., "High Mobility Poly–Si Thin Film Transistors Using Solid Phase Crystallized a–Si Films Deposited by Plasma–Enhanced Chemical Vapor Deposition," Japanese Journal of Applied Physics, v. 29, No. 12, Dec. 1990, pp. L2380–L2383.

Takashi Noguchi et al., "Advanced Superthin Polysilicon Film Obtained By Si+ Implantation and Subsequent Annealing," J. Electrochem. Soc.: Solid–State Science and Technology, Jul. 1987, pp. 1771–1777.

H. Ohshima et al., "Full–Color LCDS With Completely Integrated Drivers Utilizing Low–Temperature Poly–Si a TFTs," SID 93 Digest, pp. 387–390.

J. Levinson et al. "Conductivity Behavior in Polycrystalline Semiconductor Thin Film Transistors," J. Appl. Phys. 53(2), Feb. 1982, pp. 1193–1202.

* cited by examiner

PRESENT EMBODIMENT

SEM PHOTOGRAPH (AFTER THERMAL OXIDATION, DEPOSITION TEMPERATURE = 510°C)

←—— 300 n m ——→

COMPARATIVE EXAMPLE

SEM PHOTOGRAPH (AFTER THERMAL OXIDATION, DEPOSITION TEMPERATURE = 600°C)

← 300 nm →

30 NUCLEUS          31

FIG. 7A

34 ISLAND          35
30   32   33   31

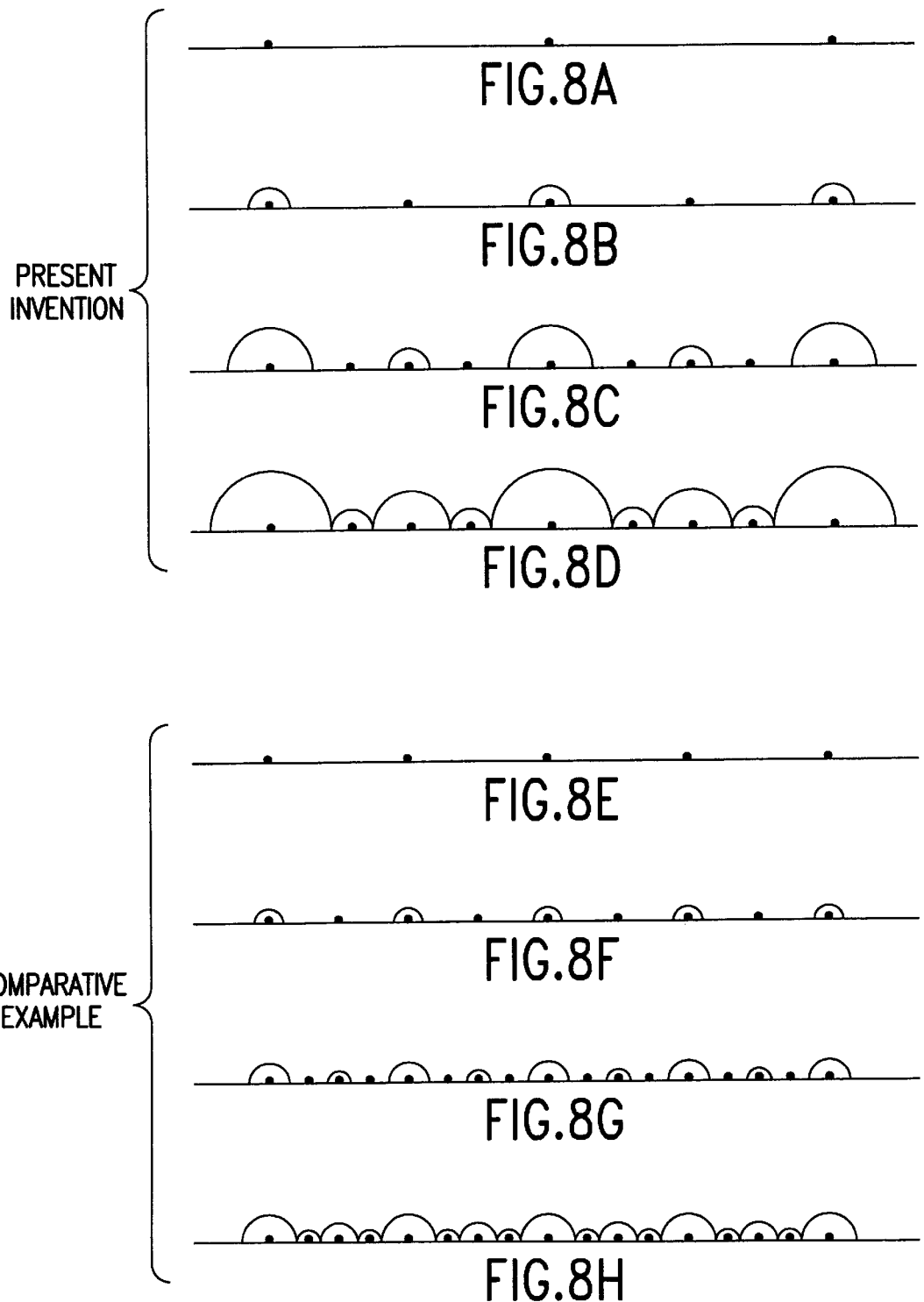

PRESENT EMBODIMENT

SEM PHOTOGRAPH (BEFORE THERMAL OXIDATION, DEPOSITION TEMPERATURE = 510°C)

←  300 n m  →

PRESENT EMBODIMENT

AFM PHOTOGRAPH (BEFORE THERMAL OXIDATION, DEPOSITION TEMPERATURE = 510°C)

PRESENT EMBODIMENT

AFM PHOTOGRAPH (BEFORE THERMAL OXIDATION, DEPOSITION TEMPERATURE = 570°C)

PRESENT EMBODIMENT

SEM PHOTOGRAPH (BEFORE THERMAL OXIDATION, DEPOSITION
TEMPERATURE = 570°C)

←→
300 n m

COMPARATIVE EXAMPLE

SEM PHOTOGRAPH (BEFORE THERMAL OXIDATION, DEPOSITION TEMPERATURE = 600°C)

300 nm

| GRAIN AREA \ DEPOSITION TEMP. | 470°C | 490°C | 530°C | 550°C | 570°C |
|---|---|---|---|---|---|
| 0 ~ 5000 | 45 | 27 | 9 | 14 | 52 |
| 5000 ~ 10000 | 9 | 8 | 2 | 6 | 9 |
| 10000 ~ 15000 | 11 | 6 | 5 | 1 | 8 |
| 15000 ~ 20000 | 6 | 4 | 2 | 7 | 4 |
| 20000 ~ 25000 | 4 | 1 | 5 | 0 | 11 |
| 25000 ~ 30000 | 1 | 1 | 0 | 1 | 7 |
| 30000 ~ 35000 | 1 | 3 | 0 | 2 | 4 |
| 35000 ~ 40000 | 0 | 3 | 0 | 0 | 1 |
| 40000 ~ 45000 | 0 | 0 | 1 | 0 | 0 |
| 45000 ~ 50000 | 0 | 0 | 1 | 1 | 0 |
| 50000 ~ 55000 | 2 | 0 | 0 | 0 | 2 |
| 55000 ~ 60000 | 0 | 0 | 1 | 1 | 0 |

FIG. 15

| TESTPIECE \ No | 1 | 2 | 3 |
|---|---|---|---|
| 1 | AT LEAST 100V | AT LEAST 100V | AT LEAST 100V |
| 2 | AT LEAST 100V | AT LEAST 100V | AT LEAST 100V |
| 3 | AT LEAST 100V | AT LEAST 100V | AT LEAST 100V |
| 4 | AT LEAST 100V | AT LEAST 100V | AT LEAST 100V |
| 5 | AT LEAST 100V | AT LEAST 100V | AT LEAST 100V |
| 6 | 65V | 71V | 69V |
| 7 | AT LEAST 100V | 88V | 93V |
| 8 | AT LEAST 100V | AT LEAST 100V | AT LEAST 100V |
| 9 | AT LEAST 100V | AT LEAST 100V | AT LEAST 100V |
| 10 | AT LEAST 100V | AT LEAST 100V | AT LEAST 100V |
| 11 | AT LEAST 100V | AT LEAST 100V | AT LEAST 100V |

FIG. 17

PRESENT EMBODIMENT

THERMAL OXIDATION TEMPERATURE = 1160°C)

600 n m

PRESENT EMBODIMENT

THERMAL OXIDATION TEMPERATURE = 1050°C)

← 600 nm →

PRESENT EMBODIMENT

THERMAL OXIDATION TEMPERATURE = 900°C)

← 600 n m →

COMPARATIVE EXAMPLE

THERMAL OXIDATION TEMPERATURE = 1160°C)

←—— 600 n m ——→

COMPARATIVE EXAMPLE

THERMAL OXIDATION TEMPERATURE = 1050°C)

←——— 600 n m ———→

COMPARATIVE EXAMPLE

THERMAL OXIDATION TEMPERATURE = 900°C)

← 600 nm →

Yjn ............ N-CHANNEL OVERLAPPING PORTION
Yjp ............ P-CHANNEL OVERLAPPING PORTION
Leffn .......... EFFECTIVE CHANNEL LENGTH. N-CHANNEL
Leffp .......... EFFECTIVE CHANNEL LENGTH. P-CHANNEL
Lgaten ........ GATE ELECTRODE LENGTH. N-CHANNEL
Lgatep ........ GATE ELECTRODE LENGTH. P-CHANNEL
Lldnn ......... LDD LENGTH. N-CHANNEL
Llddp ......... LDD LENGTH. P-CHANNEL Yjn ............... N-CHANNEL OVERLAPPING PORTION
Yjp ............... P-CHANNEL OVERLAPPING PORTION
Leffn ........... EFFECTIVE CHANNEL LENGTH. N-CHANNEL
Leffp ........... EFFECTIVE CHANNEL LENGTH. P-CHANNEL
Lgaten ........ GATE ELECTRODE LENGTH. N-CHANNEL
Lgatep ........ GATE ELECTRODE LENGTH. P-CHANNEL 41, 43....TRANSFER CHARACTERISTICS OF
        ORDINARY-STRUCTURE TFT
42, 44....TRANSFER CHARACTERISTICS OF
        LDD-TYPE TFT

|  | COMPARATIVE EXAMPLE | PRESENT EMBODIMENT |
|---|---|---|
| CONTACT RESISTANCE (PMOS) | 1.4KΩ AT 10μm×10μm ($DOSE=1\times10^{15} cm^{-2}$, $Nmax=1\times10^{20} cm^{-3}$) | 1.18KΩ AT 10μm×10μm ($DOSE=1\times10^{15} cm^{-2}$, $Nmax=1\times10^{20} cm^{-3}$) |
| CONTACT RESISTANCE (NMOS) | 1.4KΩ AT 10μm×10μm ($DOSE=1\times10^{15} cm^{-2}$, $Nmax=1\times10^{20} cm^{-3}$) | 1.2KΩ AT 10μm×10μm ($DOSE=1\times10^{15} cm^{-2}$, $Nmax=1\times10^{20} cm^{-3}$) |
| SOURCE/DRAIN SHEET RESISTANCE (PMOS) | 2.6KΩ/□ ($DOSE=1\times10^{15} cm^{-2}$, $Nmax=1\times10^{20} cm^{-3}$) | 50KΩ/□ ($DOSE=1\times10^{15} cm^{-2}$, $Nmax=1\times10^{20} cm^{-3}$) |
| SOURCE/DRAIN SHEET RESISTANCE (NMOS) | 2.6KΩ/□ ($DOSE=1\times10^{15} cm^{-2}$, $Nmax=1\times10^{20} cm^{-3}$) | 530KΩ/□ ($DOSE=1\times10^{15} cm^{-2}$, $Nmax=1\times10^{20} cm^{-3}$) |
| LDD SHEET RESISTANCE (PMOS) | 375KΩ/□ ($DOSE=1\times10^{13} cm^{-2}$, $Nmax=1\times10^{18} cm^{-3}$) | 13KΩ/□ ($DOSE=1\times10^{13} cm^{-2}$, $Nmax=1\times10^{18} cm^{-3}$) |
| LDD SHEET RESISTANCE (NMOS) | 360KΩ/□ ($DOSE=1\times10^{13} cm^{-2}$, $Nmax=1\times10^{18} cm^{-3}$) | 72KΩ/□ ($DOSE=1\times10^{13} cm^{-2}$, $Nmax=1\times10^{18} cm^{-3}$) |

FIG. 45

| | CARRIER MOBILITY μ (cm²/V·s') | ON CURRENT I(A) \|Vds\|=4V, W=5μm \|Vgs\|=10V |
|---|---|---|
| AMORPHOUS TFT (ORDINARY STRUCTURE) | 0.1~1 | $10^{-7}$ (L=5μm) |
| POLYCRYSTALLINE TFT (ORDINARY STRUCTURE) | 10~20 | $1 \times 10^{-5}$ (L=5μm) |
| POLYCRYSTALINE TFT (LDD STRUCTURE) | 10~20 | $2 \times 10^{-5}$ (L=2.5μm) |
| PRESENT EMBODIMENT (ORDINARY STRUCTURE) | 100~150 | $10^{-4}$ (L=5μm) |
| PRESENT EMBODIMENT (LDD STRUCTURE) | 200~300 | $2$~$3 \times 10^{-4}$ (L=2.5μm) |
| SINGLE-CRYSTAL MOSFET | 500~600 | $10^{-3}$ (L=2.5μm) |

FIG. 55

THIN-FILM SEMICONDUCTOR DEVICE, AND DISPLAY SYSTEM USING THE SAME

This is a Division of application Ser. No. 08/406,892 filed Mar. 27, 1995 (U.S. National Stage of PCT/JP94/01229 filed Jul. 26, 1993).

FIELD OF THE INVENTION

The present invention relates to a thin-film semiconductor device comprising a non-single-crystal semiconductor film, a method of fabricating such a thin-film semiconductor device, and a display system in which the thin-film semiconductor device is used.

BACKGROUND OF THE INVENTION

Thin-film semiconductor devices formed using non-single-crystal semiconductor films such as polycrystalline and amorphous semiconductor films are used in the display portions and peripheral circuitry of active matrix liquid crystal display devices, image sensors and SRAM devices. "Thin film semiconductor device" refers to a semiconductor film, a thin-film transistor (TFT), or a CMOS type of TFT having a p-channel TFT and an n-channel TFT. "Thin-film semiconductor device" and "TFT" are used interchangeably in this document.

Thin-film semiconductor devices are required to operate at high speeds when used in peripheral circuitry such as a liquid crystal display device. When the operational speed of the thin film semiconductor devices is sufficiently high, switching devices of the display portion and all the peripheral circuitry such as shift registers and analog switches can be integrated onto the liquid crystal substrate using the thin-film semiconductor devices.

If the speed of the thin-film semiconductor devices were to be increased, the range of applications of the thin-film semiconductor devices would be much wider than in the prior art. Prior art applications of the thin-film semiconductor devices are limited to liquid crystal display devices. It has been very difficult to extend the application of the thin-film semiconductor devices to digital and analog circuits where single-crystal MOSFETs are used. This is because the thin-film semiconductor device has a smaller carrier mobility than the carrier mobility of a single-crystal MOSFET. Thus, the speed of the thin-film semiconductor device is slower than the speed of the single crystal MOSFET. However, if the thin-film semiconductor device operates at a speed comparable to that of a single-crystal MOSFET, the thin-film semiconductor devices may be used in digital and analog circuits where only single-crystal MOSFETs are used in the prior art.

The thin-film semiconductor device differs from a single-crystal MOSFET in that it is formed on an insulating substance. This means that it is not affected by the problems experienced by the single-crystal MOSFET. Problems such as noise transmitted through the substrate and latch-up caused by current flowing through the substrate are examples. Therefore, increasing the speed of a thin-film semiconductor device is a technical objective.

In order to increase the speed of the thin-film semiconductor device, the following problems described must be solved. An example of a thin-film semiconductor device is shown in FIG. 56A and an equivalent circuit diagram of this thin-film semiconductor device is shown in FIG. 56B. In FIG. 56B, Rc1 and Rc2 are contact resistances of a contact portion 412 between wiring 408 and a source portion 404 and a contact portion 414 between wiring 410 and a drain portion 406. Rs is the source resistance of the source portion 404, Rch is the channel resistance of a channel portion 402, and Rd is the drain resistance of the drain portion 406.

In order to increase the speed of this thin-film semiconductor device, it is first necessary to reduce the total value of the serially connected resistances Rc1, Rs, Rch, Rd, and Rc2 when the transistor is ON. If the total resistance when the transistor is ON is denoted by Ron, Ron is the sum of the on-state channel resistance Rch(on) and the overall parasitic resistance Rp of the rest of the components. In other words:
Page 02

$$Ron = Rch(on) + Rp$$
$$= Rch(on) + (Rc1 + Rs + Rd + Rc2)$$

Therefore, in order to achieve a faster thin-film semiconductor device, both the on-state channel resistance Rch(on) and the overall parasitic resistance Rp must be reduced. In order to reduce Rch(on), it is necessary to find new methods to fabricate the semiconductor films which form the thin-film semiconductor device. More specifically, the carrier mobility of the semiconductor films must be increased and the channel portion 402 must be shortened.

The resistances Rs and Rd may be reduced by either increasing the impurity concentration of the source portion and the drain portion or improving the quality of the semiconductor films forming the source and drain portions. To reduce Rc1 and Rc2, barrier metal can be placed at the contact portions 412 and 414. However, it is more effective to simplify the fabrication process by increasing the impurity concentration of the source and drain portions rather than using barrier metal.

The carrier mobility of the semiconductor films are increased by forming the thin-film semiconductor device using polycrystalline silicon (polysilicon). A polycrystalline silicon thin-film semiconductor device generally has carrier mobility of at least approximately 10 cm$^2$/V.s, which is far higher than that of an amorphous silicon thin-film semiconductor device.

Three fabrication methods are known in the prior art for fabricating a polycrystalline silicon thin-film semiconductor device of this type, as described below. In the first fabrication method, a polycrystalline silicon film is first deposited by a low-pressure chemical vapor deposition (LPCVD) method at a deposition temperature of approximately 600° C. or more. The size of the regions (islands) of the polycrystalline silicon ranges approximately from 20 nm to 80 nm. The polycrystalline silicon film surface is then thermally oxidized to form the semiconductor layer and gate insulation layer of the thin-film semiconductor device. The boundary surface roughness (center line average height, Ra) between the gate insulation film and gate electrode is at least approximately 3.1 nm. One example of an n-channel type thin-film transistor fabricated by this method has a carrier mobility of approximately 10 cm$^2$/V.s to 20 cm$^2$/V.s. The average grain area of the semiconductor film is approximately 4,000 to 6,000 nm$^2$.

In the second fabrication method, an amorphous silicon film is first formed by plasma-enhanced CVD (PECVD). The amorphous silicon film is then annealed in a nitrogen atmosphere at the temperature of 600° C. from about 20 hours to 80 hours. This annealing process converts the amorphous silicon film into a polycrystalline silicon film known as solid-phase crystallization method. The surface of this polycrystalline silicon film is thermally oxidized to form a semiconductor layer and gate insulation layer of the thin-film semiconductor device. After the thin-film semiconductor device is structured, a hydrogen plasma is applied. In this case, an n-channel type thin-film transistor has the carrier mobility of approximately 150 cm$^2$/V.s. See S. Takenaka, et al., Jpn. J. Appl. Phys. 29, L2380 (1990).

Page 03

In the third fabrication method, a polycrystalline silicon film is first deposited by LPCVD at a deposition temperature of 610° C. Si$^+$ is implanted into the polycrystalline silicon film at a dose of approximately $1.5 \times 10^{15}$ cm$^{-2}$, which converts the polycrystalline silicon film into an amorphous film. The film is then annealed at 600° C. in a nitrogen atmosphere from tens to several hundreds of hours, so that the amorphous silicon is recrystallized into a polycrystalline silicon film. The surface of this polycrystalline silicon film is then thermally oxidized to form a semiconductor layer and gate insulation layer of the thin-film semiconductor device. After the basic structure of the thin-film semiconductor device is completed, a hydrogenated silicon nitride (p-Si N:H) film is deposited by PECVD over the device, and then the device is annealed in a furnace at 400° C. to hydrogenate the device. In this case, an n-channel type thin-film transistor has the carrier mobility of approximately 100 cm$^2$/V.s. See T. Noguchi, et al., J. Electrochemical Soc., 134, page 1771 (1987).

The three fabrication methods described above have inherent problems. The second fabrication method provides a thin-film semiconductor device with high carrier mobility, but requires several tens of hours of furnace annealing after the amorphous silicon film is deposited. This process seriously reduces productivity because of the long process time. In addition, a large quantity of particles are generated in the reaction chamber by the PECVD. These particles cause a large number of device defects because they fall on the substrate during the deposition. Therefore, the yield is very poor.

The third fabrication method requires even longer furnace annealing and has a more complicated process than the second fabrication method. If the number of process steps is increased by even one step, the product yield is reduced. The need for several tens of hours to several hundreds of hours of furnace annealing is unrealistic from the mass-production point of view, and is thus not practicable.

The first fabrication method involves the simple method of depositing a polycrystalline silicon film by LPCVD and then forming a thin-film semiconductor device by thermal oxidation. This method is extremely simple and stable and thus well adapted for mass production. However, the first fabrication method produces small average grain area of approximately 4,000 to 6,000 nm$^2$ and low carrier mobility of 10 cm$^2$/V.s to 20 cm$^2$/V.s.

The reduction of the contact resistance Rc and the resistances Rs and Rd is described below. TFTs include ordinary TFT structure and a lightly doped drain (LDD) TFT structure. In order to reduce the overall parasitic resistance Rp and the total ON resistance Ron, the LDD-type TFT is preferred.

A method of fabricating ordinary TFTs is described with reference to FIG. 27. In this fabrication method, a gate insulation film 25 is first formed on thin semiconductor films 22 that have been patterned into islands on an insulating substrate 21 and gate electrodes 26 are formed over the semiconductor films 22. Next, donor impurity ions are implanted at high concentration into the thin semiconductor film 22 to form the source and drain regions of the n-channel TFT and form thin n$^+$ semiconductor films 23. Acceptor impurity ions are implanted at high concentration into the thin semiconductor film 22 which are the source and drain regions of the p-channel TFT and form thin p$^+$ semiconductor films 24. Since this method implants the impurities by using the gate electrode as a channel mask, the resultant TFT is called a self-aligned TFT. A non-self-aligned TFT is produced by first forming the thin n$^+$ semiconductor islands and the thin p$^+$ semiconductor islands that contain appropriate impurities. These TFTs are covered with an interlayer insulation film 27, and then thin metal films 28 are patterned to complete the TFTs.

Page 04

Single-crystal MOSFETs possessing LDD structure are widely used in semiconductor integrated circuits which are made using single-crystal substrates. The LDD MOSFETs restrain the device from generating hot carriers and have high reliability. Conventional fabrication techniques of LDD-type MOSFETs are described in JP 2-58274, JP 2-45972, JP 62-241375 and JP 62-234372.

Since the diffusion coefficient of the impurities in the single-crystal semiconductor material is low, the LDD length can be shortened to approximately one-tenth of the channel length. Therefore, the source-drain current of the transistor on-state (ON-current) of an LDD-type MOSFET is reduced to only about one-tenth of that of an ordinary-structure MOSFET.

In contrast, since TFTs use non-single-crystal thin semiconductor films, the impurity ions have increased diffusion along the grain boundaries of the semiconductor films. The actual diffusion coefficient in poly-Si (polysilicon) films increases by at least one order of magnitude over the diffusion coefficient in the single-crystal semiconductor. Therefore, the LDD length of the LDD-type TFT is long. The longer LDD results in high electric resistance of this LDD portion which cause the ON current to be one-half or less than that of an ordinary TFT structure. For this reason the LDD-type TFT has not been used in circuits that require high speeds.

In the self-aligned ordinary TFTs shown in FIG. 27, impurities are implanted at high concentration into the source and drain portions. Therefore, the parasitic resistance at the source and drain regions is low. However, other problems prevent increasing the speed of the self-aligned ordinary TFTs. The increased diffusion along the grain boundaries increases a parasitic capacitance of the TFT between the gate and the source/drain overlapped regions which results in an increase of MOS capacitance.

As shown in FIG. 27, an overlapping portion of the n-channel TFT indicated by Yjn and an overlapping portion of the p-channel TFT indicated by Yjp form parasitic capacitances. The effective n-channel channel length Leffn and the effective p-channel channel length Leffp are the lengths obtained by subtracting twice the corresponding overlapping portion Yjn or Yjp from the n-channel gate electrode length, Lgaten or the p-channel gate electrode length Lgatep for the p-channel device. These gate electrode lengths are also known as gate electrode widths.

For an effective channel length of 4 μm, a gate electrode length of at least 6 μm is required because these overlapping portions are at least 1 μm long. The increase in the parasitic capacitance of the TFTs is at least a factor of 1.5 compared to the originally desired device. This results in a reduced operating speed of two-thirds or less of the speed of the originally desired TFT. Accordingly, ordinary self-aligned TFTs of the prior art are not used to increase operating speeds.

Page 05

The prior art technique described in JP 5-173179 uses the ordinary TFTs shown in FIG. 27 for the peripheral circuitry because the LDD-type TFTs are not suitable for high-speed operation. LDD-type TFTs are used in the display portion because the liquid crystal of this display portion is a high-resistance material. Thus, it is necessary to restrain the OFF current of the pixel TFTs.

Another prior art using the LDD-type TFTs in the peripheral circuitry and the display portion is described in JP 6-102531. However, even in this prior art, the ON current of each LDD-type TFT is small. The ON current is increased by adding novel processing steps such as solid-phase crystallization and hydrogenation. See page 7, left column, lines 26 to 36 of JP 6-102531.

Although the utilization of the LDD structure has the advantage of preventing leakage currents, additional processing steps must be introduced to compensate for the low ON-current inherent in the LDD structure. JP 6-102531 discloses that the impurity dose implanted into the LDD region is $1\times10^{14}$ $cm^{-2}$ or less. See page 5, left column, lines 45 to 48. This numerical limit is not intended for optimizing the ON/OFF current ratio but for reducing the OFF current and restraining leakage currents.

Therefore, the ON current cannot be increased even though the OFF current can be reduced because, as the impurity dose implanted into the LDD region becomes smaller, the resistance of this LDD region increases and the ON current decreases. Similarly, the impurity dose implanted into the source and drain portions is disclosed to be in the range of between $1\times10^{14}$ and $1\times10^{17}$ $cm^{-2}$. See page 5, right column, lines 11 to 14 of JP 6-102531. This numerical limit is neither intended for optimizing the diffusion length due to increased diffusion, nor reducing the resistances Rc, Rs, and Rd.. Furthermore, the channel length is set to 6 $\mu$m and no technique is disclosed for reducing the channel length of the TFT to 5 $\mu$m or less.

Page 06

As described above, it is difficult to increase the ON current, and to reduce the parasitic resistances Rc, Rs, and Rd while optimizing the diffusion length. Further, it is difficult to reduce channel length. Therefore, it is difficult to apply LDD-type TFTs to high-speed circuits without additional processing steps such as solid-phase crystallization.

An objective of the invention is the provision of a thin-film semiconductor device which can be fabricated by a simple, effective process and which also has good characteristics. A method of fabricating such a thin-film semiconductor device and a display device using this thin-film semiconductor device is provided.

Another objective of the invention is to provide an LDD-type thin-film semiconductor device that is capable of operating at high speed without requiring any additional processing steps. The invention also provides a method for fabricating such a thin-film semiconductor device and a display device using this thin-film semiconductor device.

A further objective of the invention is to provide higher speeds for thin-film semiconductor devices, and to provide a thin-film semiconductor device that replaces single-crystal MOSFETS used in the digital and analog circuits thus broadening the field of application for the thin-film semiconductor devices. A method of fabricating this thin-film semiconductor device is also provided.

SUMMARY OF THE INVENTION

A first aspect of the invention provides a method of fabricating a thin-film semiconductor device comprising a non-single-crystal semiconductor film formed on an insulating material portion which covers at least one portion of a surface of a substrate. This method includes a step of depositing a semiconductor film by a chemical vapor deposition method under conditions that retards the generation rate of nuclei that act as seeds for film formation and accelerates the growth rate of islands formed from the nuclei.

This first aspect of the invention accounts for the fact that nucleus generation and island growth are competing processes. Retarding the nucleus generation rate while accelerating the island growth rate during the deposition of a semiconductor film ensures that the islands grow fast to cover the insulating material portion before a large number of nuclei are generated on the insulating material portion. This ensures that the island regions are large, so that it is possible to enlarge the area of the grains which appear after the semiconductor film is annealed. This enables an increase in the carrier mobility of the thin-film semiconductor device.

Another effect of making the island regions large is the way in which the semiconductor film surface becomes smooth. Thus, the present invention enables a dramatic improvement in the characteristics of a thin-film semiconductor device using an extremely simple process, in which a silicon film is formed by a chemical vapor deposition method alone, and without using complicated and unnecessary processes such as silicon ion implantation, lengthy furnace annealing, or hydrogenation. The semiconductor film deposited by this embodiment is not limited to an amorphous film.

Page 07

The nucleus generation rate is controlled by the deposition temperature and the island growth rate is controlled by the deposition rate. The deposition temperature is preferred to be approximately 580° C. or less and the deposition rate is preferred to be approximately 6 Å/minute or more. Thus, the island regions can be made extremely large by setting the deposition temperature and deposition rate to within the above ranges. The nucleus generation rate could be controlled by a suitable choice of the type of substrate. The deposition rate could be determined by the flow rate of the reactant gas or the deposition pressure.

A second aspect of the invention provides that the deposition temperature is preferably approximately 550° C. or less. The average grain area is maximized by setting the deposition temperature to approximately 550° C. or less.

A third aspect of the invention provides that the deposition temperature is preferably approximately 530° C. or less. The defects within the crystals is reduced by setting the deposition temperature to approximately 530° C. or less. The lower limit of the deposition temperature can be set to suit the type of reactant gas. For example, a lower deposition temperature is approximately 460° C. for mono-silane or approximately 370° C. for di-silane will produce the same results.

A fourth aspect of the invention provides that either mono-silane ($SiH_4$) or di-silane ($Si_2H_6$) is used as at least one type of reactant gas while the semiconductor film is being deposited by the chemical vapor deposition method. The basic principle of the invention is not substantially affected by the type of reactant gas used, and thus other reactant gases may be used.

A fifth aspect of the invention provides a step of subjecting a surface of the semiconductor film to thermal oxidation, after the semiconductor film deposition step. This thermal oxidation provides an oxide film. If the semiconductor film is in an amorphous state, it is converted into a polycrystalline state.

A sixth aspect of the invention provides a step of irradiating the semiconductor film with optical energy or electromagnetic-wave energy, after a semiconductor film deposition step. The maximum processing temperature after the irradiation step is approximately 350° C. or less. Using a low-temperature process allows using inexpensive glass as the substrate and prevents warping of the substrate under its own weight.

A step of annealing the semiconductor film at a temperature of approximately 600° C. or less is included after the semiconductor film deposition step. The maximum processing temperature after the annealing step could be held to approximately 600° C. or less. By combining this low-temperature process with solid-phase crystallization, a semiconductor film of an even higher quality is obtained. The maximum processing temperature after the annealing step is preferably approximately 350° C. or less.

A seventh aspect of the invention provides a step of annealing the semiconductor film at a temperature in the range of between approximately 500° C. and approximately 700° C., after the semiconductor film deposition step. Annealing the semiconductor film in such a manner in accordance with the invention ensures that a semiconductor film in an amorphous state, can be converted it into a polycrystalline state at a comparatively low temperature. This makes it possible to obtain a thin-film semiconductor device having even better quality characteristics. The temperature range for the annealing in this case is preferably between approximately 550° C. and approximately 650° C.

An eighth aspect of the invention provides a thin-film semiconductor device comprising a non-single-crystal semiconductor film formed on an insulating material portion which covers at least one portion of a surface of a substrate, wherein the average grain area of the semiconductor film is at least approximately 10,000 nm$^2$. Since the average grain area is large, the carrier mobility is increased enabling an increase in speed of the thin-film semiconductor device.

A ninth aspect of the invention provides a thin-film semiconductor device comprising a non-single-crystal semiconductor film formed on an insulating material portion which covers at least one portion of a surface of a substrate, wherein the average area of islands grown from nuclei that act as seeds for forming the semiconductor film is at least approximately 10,000 nm$^2$.

Since the average island area is large, the average grain area after annealing is also large enabling an increase in speed of the thin-film semiconductor device. In addition, the invention provides the further advantage of a smooth semiconductor film surface.

A tenth aspect of the invention provides a thin-film semiconductor device comprising a non-single-crystal semiconductor film formed on an insulating material portion which covers at least one portion of a surface of a substrate, wherein the boundary surface roughness (center line average height, Ra) between a gate insulation film formed by thermal oxidation of the semiconductor film and a gate electrode formed on the gate insulation film is no more than approximately 2.00 nm.

Since the center line average height Ra is no more than approximately 2.00 nm, the gate insulation film formed on the semiconductor film has a smooth surface, resulting in a high breakdown voltage between source and gate. This reduces the number of pixel defects, for example. In addition, the thermal oxidation temperature is reduced, enabling the implementation of both lower costs and high-density processing. Also, the low oxidation temperature extends the lifetime of the fabrication apparatus as well as ease their maintenance.

An eleventh aspect of the invention provides a thin-film semiconductor device comprising a non-single-crystal semiconductor film formed on an insulating material portion which covers at least one portion of a surface of a substrate, where the semiconductor film includes a first impurity-doped semiconductor film located in source and drain portions of a thin-film transistor. A high-resistance second impurity-doped semiconductor film is located in at least one area between drain and channel portions or between source and channel portions of the thin-film transistor. The maximum impurity concentration of the second impurity-doped semiconductor film is in the range of between approximately $1 \times 10^{18}$ cm$^{-3}$ and approximately $1 \times 10^{19}$ cm$^{-3}$.

The thin-film semiconductor device has an LDD structure with a shorter channel and thus operates at a higher speed. The breakdown voltage between source and drain is also heightened. The maximum impurity concentration of the second impurity-doped semiconductor film which is the LDD portion is optimized. The breakdown voltage is heightened by setting this maximum impurity concentration to be approximately $1 \times 10^{19}$ cm$^{-3}$ or less. The sheet resistance of the LDD portion is reduced and consequently the ON current is prevented from dropping by setting this maximum impurity concentration to approximately $1 \times 10^{18}$ cm$^{-3}$ or more. To achieve further optimization, the maximum impurity concentration is preferred to be in the range of between approximately $2 \times 10^{18}$ cm$^{-3}$ and approximately $5 \times 10^{18}$ cm$^{-3}$ which enables an optimum ratio between ON current and OFF current.

A twelfth aspect of the invention provides a thin-film semiconductor device comprising a non-single-crystal semiconductor film formed on an insulating material portion which covers at least one portion of a surface of a substrate, where the semiconductor film includes a first impurity-doped semiconductor film located in the source and drain portions of a thin-film transistor. A high-resistance second impurity-doped semiconductor film is located in at least one area between the drain and the channel portions or between the source and the channel portions of the thin-film transistor. The maximum impurity concentration of the first impurity-doped semiconductor film is in the range of between approximately $5 \times 10^{19}$ cm$^{-3}$ and approximately $1 \times 10^{21}$ cm$^{-3}$.

The maximum impurity concentration of the first impurity-doped semiconductor film is optimized. The diffusion of impurities from the source and the drain portions into the LDD portion is restrained and the breakdown voltage between the source and the drain portions of the thin-film semiconductor device is heightened by setting this maximum impurity concentration to be approximately $1 \times 10^{21}$ cm$^{-3}$ or less. Both the contact resistance and the source and the drain resistance are reduced, thus the operational speed of the thin-film semiconductor device is increased, when setting this maximum impurity concentration to be approximately $5 \times 10^{19}$ cm$^{-3}$ or more. To achieve further optimization, the maximum impurity concentration is set to be between approximately $1 \times 10^{20}$ cm$^{-3}$ and approximately $3 \times 10^{20}$ cm$^{-3}$. This enables faster operation of the devices and even further miniaturization of components, while increasing the breakdown voltage.

A thirteenth aspect provides a thin-film semiconductor device comprising a non-single-crystal semiconductor film formed on an insulating material portion which covers at least one portion of a surface of a substrate, where the semiconductor film includes a first impurity-doped semiconductor film located in the source and the drain portions of a thin-film transistor. A high-resistance second impurity-doped semiconductor film is located in at least one area between the drain and the channel portions or between the source and the channel portions of the thin-film transistor. An LDD length in the drain portion or the source portion is in the range of between approximately 0.6 μm and approximately 4 μm.

The invention miniaturizes components by setting the LDD length to be approximately 4 μm or less. An LDD length of approximately 0.6 μm or more prevents the effective LDD length from being reduced to zero by the diffusion of the impurities from the source and the drain portions. Thus, further lowering of the breakdown voltage is prevented. To achieve further optimization, the LDD length is preferred to be between approximately 1 μm and approximately 2 μm.

Page 08

A fourteenth aspect provides a thin-film semiconductor device comprising a non-single-crystal semiconductor film formed on an insulating material portion which covers at least one portion of a surface of a substrate where the semiconductor film includes a first impurity-doped semiconductor film located in the source and the drain portions of a thin-film transistor. A high-resistance second impurity-doped semiconductor film is located in at least one area between the drain and the channel portions or between the source and the channel portions of the thin-film transistor. The length of a gate electrode formed on the semiconductor film with a gate insulation film in between is approximately 5 μm or less.

The channel is decreased in length as the gate electrode length is set to approximately 5 μm or less. A reduction in the ON current caused by the LDD structure is sufficiently compensated enabling faster operation of the devices. The gate electrode length is preferably approximately 3 μm or less. Such a short channel length further increases the operational speed of the device and also reduce the supply voltage to the device.

A fifteenth aspect of the invention provides a thin-film semiconductor device comprising a non-single-crystal semiconductor film formed on an insulating material portion which covers at least one portion of a surface of a substrate, where the semiconductor film includes a first impurity-doped semiconductor film located in the source and the drain portions of a thin-film transistor. A high-resistance second impurity-doped semiconductor film is located in at least one area between the drain and the channel portions or between the source and the channel portions of the thin-film transistor. When an LDD length of a drain portion is Llddd and the distance from an edge of the drain portion on a channel portion side of a contact hole in the drain portion to a gate electrode is Lcontd, the following relationship is preferred:

$$0.8 \times Llddd < Lcontd < 1.2 \times Llddd.$$

Lcontd can be set to a range of ±20% of Llddd.

This prevents any excessive increase in the contact resistance and also reduces the parasitic resistance based on factors such as the resistance of the LDD portion.

In a similar manner, when the LDD length of a source portion is Lldds and the distance from an edge of the source portion on a channel portion side of a contact hole in the source portion to a gate electrode is Lconts, the following relationship is preferred:

$$0.8 \times Lldds < Lconts < 1.2 \times Lldds.$$

A sixteenth aspect of the invention provides a p-type thin-film transistor having a first and a second impurity-doped semiconductor films in which the implanted impurities are p-type. An n-type thin-film transistor is also provided having a first and a second impurity-doped semiconductor films in which the implanted impurities are n-type. This CMOS configuration permits faster device operation while consuming less power. An optimum thin-film semiconductor device is provided for the peripheral circuitry of a liquid crystal display device, for example.

The gate electrode length of the p-type thin-film transistor is preferably shorter than the gate electrode length of the n-type thin-film transistor. This balances the ON currents of the p-type and n-type thin-film transistors and allows implementation of high density circuits because the circuits can be configured with the same channel width.

The channel width of the n-type thin-film transistor is preferred to be smaller than the channel width of the p-type thin-film transistor. This enables an even further increase in speed because the ON currents are balanced. When all the gate electrode lengths are set to the minimum dimensions of the design rules, management of the fabrication process also becomes easier.

The gate electrode length of the p-type thin-film transistor and the gate electrode length of the n-type thin-film transistor are preferably approximately 5 μm or less. This permits a further increase in the speed of the TFTs.

A seventeenth aspect of the invention provides a method of fabricating a thin-film semiconductor device comprising a non-single-crystal semiconductor film formed on an insulating material portion which covers at least one portion of a surface of a substrate. This method includes implanting an impurity by using a gate electrode as a mask and implanting an impurity by using a photoresist as a mask, where an impurity dose implanted by using the gate electrode as a mask is between approximately $1 \times 10^{13}$ cm$^{-2}$ and approximately $1 \times 10^{14}$ cm$^{-2}$. An impurity dose implanted by using the photoresist as a mask is between $5 \times 10^{14}$ cm$^{-2}$ and $1 \times 10^{16}$ cm$^{-2}$.

The impurities are implanted at a low energy but with a high throughput. Moreover, the LDD length is set freely so that the LDD structure is formed only as necessary in required areas. Thus the degree of freedom of circuit design is increased. Optimization of the implanted impurities is also facilitated.

An impurity is first implanted using the gate electrode as a mask. Then an insulation film is formed on the surface of the gate electrode. Finally, an impurity is again implanted to the semiconductor film.

Preferably, the method further includes forming an impurity-doped semiconductor film in an island shape in the source and the drain portions of the thin-film transistor. Then an intrinsic semiconductor film is formed on the island shaped impurity-doped semiconductor film. This improves the TFT characteristics by making the channel portion thin and lowers the contact resistance by making the source and the drain portions thick. This method provides a sufficiently large margin against overetching so that even when dry etching is used to open contact holes, yield is improved.

An insulation film on the gate electrode surface layer portion is either formed by thermal oxidation, anodic oxidation of the material of the gate electrode or by chemical vapor deposition methods. The chemical vapor deposition method forms an insulation film at a low temperature with a high throughput. Suitable combinations of these methods can be used to form a multi-layer insulation film, which further reduces defects.

Page 10

An eighteenth aspect of the invention provides a display system using thin-film semiconductor devices comprising a non-single-crystal semiconductor film formed on an insulating material portion which covers at least one portion of a surface of a substrate, where the display system includes an active matrix portion and data and scan driver portions formed on the insulating material portion. The semiconductor film includes a first impurity-doped semiconductor film located in the source and the drain portions of a thin-film transistor. A high-resistance second impurity-doped semiconductor film is located in at least one area between the drain and the channel portions or between the source and the channel portions of the thin-film transistor.

The maximum impurity concentration of the second impurity-doped semiconductor film is in the range of between approximately $1 \times 10^{18}$ cm$^{-3}$ and approximately $1 \times 10^{19}$ cm$^{-3}$.

The data and scan driver portions use the LDD-type TFTs. Thus, high-speed operation is achieved while the voltage supply and current consumption are also low. The maximum impurity concentration of the first impurity-doped semiconductor film and/or the LDD length can be optimized by the invention further reducing the length of the channel.

A nineteenth aspect of the invention provides a clocked gate bidirectional shift register circuit for the data driver portion and the scan driver portion. This enables a simple method of reversing a screen image either horizontally or vertically, thus broadening the range of applications of the display device.

A twentieth aspect of the invention provides a plurality of shift register circuits. Each of the shift register circuits has a different clock signal phase. Gate circuits are also provided which receives outputs from the plurality of shift register circuits. The shift registers and gate circuits generate various timing pulses at high speed. For example, the serial input of data driver signals for the Japanese high-definition television (HDTV) system may be generated.

A twenty-first aspect of the invention provides a level-shifter circuit and a shift register circuit. The shift register circuit is driven at or below the TTL level. This ensures that the entire interface for external signals operates at or below the TTL level. This allows smaller, less expensive, less power-consuming external circuits to be implemented.

A twenty-second aspect of the invention provides a p-type thin-film transistor and an n-type thin-film transistor connected in series. This enables stable operation even when the difference between input and output voltages is large.

A twenty-third aspect of the invention provides that the data driver portion includes at least one shift register circuit, at least one video line and analog switches. One of outputs of the shift register circuit is input to a gate terminal of the analog switch, either directly or through a level-shifter circuit. An analog signal is supplied to each of picture elements in a dot-sequential manner. This enables the construction of an extremely compact data driver that has low power consumption permitting a compact display device to be implemented.
Page 11

A twenty-fourth aspect of the invention provides that the data driver portion includes first-stage analog latches. Each of the analog latches is connected to at least one video line. The data driver portion also includes second-stage analog latches. Each of the second-stage analog latches has at least one input connected to an output from the first-stage analog latch. Analog buffers are included and each of the analog buffers is connected to an output from the second-stage analog latches. An analog signal is supplied to each of picture elements in a line-sequential manner which enables a large active-matrix type of LCD to be driven.

A twenty-fifth aspect of the invention provides that the data driver portion includes a group of n first-stage latches connected to n digital signal input lines. A group of n second-stage latches receives the outputs of the first-stage latches. A decoder is connected to $2^n$ analog switch gates which receives the outputs of the second-stage latches. Digital signals are supplied to picture elements which enables the construction of a large-scale digital data driver. The large-scale digital data driver interfaces a digital signal with a multimedia display system using the latches and the decoders.

A twenty-sixth aspect of the invention provides that the display system includes a video signal amplification circuit for amplifying video signals output from a video signal generator. A timing controller is included for generating timing signals in synchronization with video signals output from the video signal generator. The data driver portion and the scan driver portion are driven by the timing signals which enable suppression of the power consumption of the entire system, thus making this display system suitable for use in portable electronic equipment.

A twenty-seventh aspect of the invention provides that the timing controller, the data driver portion, and the scan driver portion are driven at voltage levels equal to or below the TTL level which makes the external circuits extremely simple.

A twenty-eighth aspect of the invention provides that the timing controller is made from the thin-film semiconductor device which enables a system that is even more compact and inexpensive.

A twenty-ninth aspect of the invention provides that the video signal amplification circuit includes a signal frequency conversion circuit for converting a video signal into a plurality of low-frequency signals or a gamma correction circuit which improves the horizontal resolution and also increase grayscale levels.

A thirtieth aspect of the invention provides that the video signal amplification circuit comprises thin-film semiconductor devices. When the video signal amplification circuit is formed using the thin-film semiconductor devices provided by the invention, the display system is compact and inexpensive.

A thirty-first aspect of the invention provides a thin-film semiconductor device comprising a non-single-crystal semiconductor film formed on an insulating material portion which covers at least one portion of a surface of a substrate, where [Page 12] the semiconductor film is deposited by a chemical vapor deposition method under conditions that retard the generation rate of nuclei that act as seeds for film formation and accelerate the growth rate of islands formed from the nuclei. The semiconductor film includes a first impurity-doped semiconductor film located in the source and the drain portions of a thin-film transistor. A high-resistance second impurity-doped semiconductor film is located in at least one area between the drain and the channel portions or between the source and the channel portions of the thin-film transistor.

The semiconductor film is formed while the nucleus generation rate is retarded and the island growth rate is accelerated allowing an LDD-type TFT circuit to be implemented using this semiconductor film. Further, an increase in carrier mobility, a reduction in contact resistance in the channel length of the transistor and an increase in the breakdown voltage is achieved allowing a high-speed thin-film semiconductor device to be implemented that is not inferior to a single-crystal MOSFET. Since the island regions forming the semiconductor film are extremely large, the resultant polycrystalline configuration after annealing has an extremely low level of crystal defects. Therefore, the electric resistance of the LDD portion is reduced and the ON current is further improved. The maximum impurity concentration of the first and second impurity-doped semiconductor films and/or the LDD length is optimized by the invention enabling a further reduction in the length of the channel.

The maximum impurity concentration of the second impurity-doped semiconductor film is optimized by setting the maximum impurity concentration between approximately $2 \times 10^{17}$ cm$^{-3}$ and approximately $1 \times 10^{19}$ cm$^{-3}$ which broadens the range of the maximum impurity concentration. Since the semiconductor film is formed while the nucleus generation rate is retarded and the island growth rate is accelerated, the number of crystal defects is reduced thus lowering the electric resistance of the LDD portion. Therefore, the sheet resistance of the LDD portion is low even when the maximum impurity concentration of the LDD portion is low. Thus, the lower limit of the maximum impurity concentration of the LDD portion can be set as low as approximately $2 \times 10^{17}$ cm$^{-3}$.

The LDD length is optimized to between approximately 0.3 μm and approximately 4 μm, thus broadening the range of the LDD length. Since the semiconductor film is formed while the nucleus generation rate is retarded and the island growth rate is accelerated, the semiconductor film has few grain boundaries. Thus, impurities are restrained from increased diffusion along the grain boundaries. Therefore, the minimum LDD length can be shortened to approximately 0.3 μm which enables a further reduction in the parasitic resistance of the LDD portion.

A thirty-second aspect of the invention provides that the second impurity-doped semiconductor film is arranged over the entire region of the source and the drain portions of a p-type thin-film transistor having a p-type impurity-doped semiconductor film. The sheet resistance of the second impurity-doped semiconductor film is reduced although the impurity is implanted at low concentration. Thus, the step of implanting an impurity to high concentration in the p-type thin-film transistor can be omitted and the entire region of the source and the drain portions can be made from the low-concentration second impurity-doped semiconductor film. This eliminates one processing step, such as a photo-processing step, permitting a higher density integrated circuits.

BRIEF DESCRIPTION OF THE DRAWINGS

The file of this patent contains at least one drawing executed in color. Copies of this patent with color drawings are provided to the Patent and Trademark Office with payment of the necessary fee.

FIGS. 7A to 7E are diagrams used to illustrate the principle of the invention;

FIGS. 8A to 8H are further diagrams used to illustrate the principle of the invention;

FIG. 15 shows the data that determines the characteristic diagram of FIG. 14;

FIG. 17 lists breakdown voltages between source and gate of the comparative example;

Page 15

Figure 46:
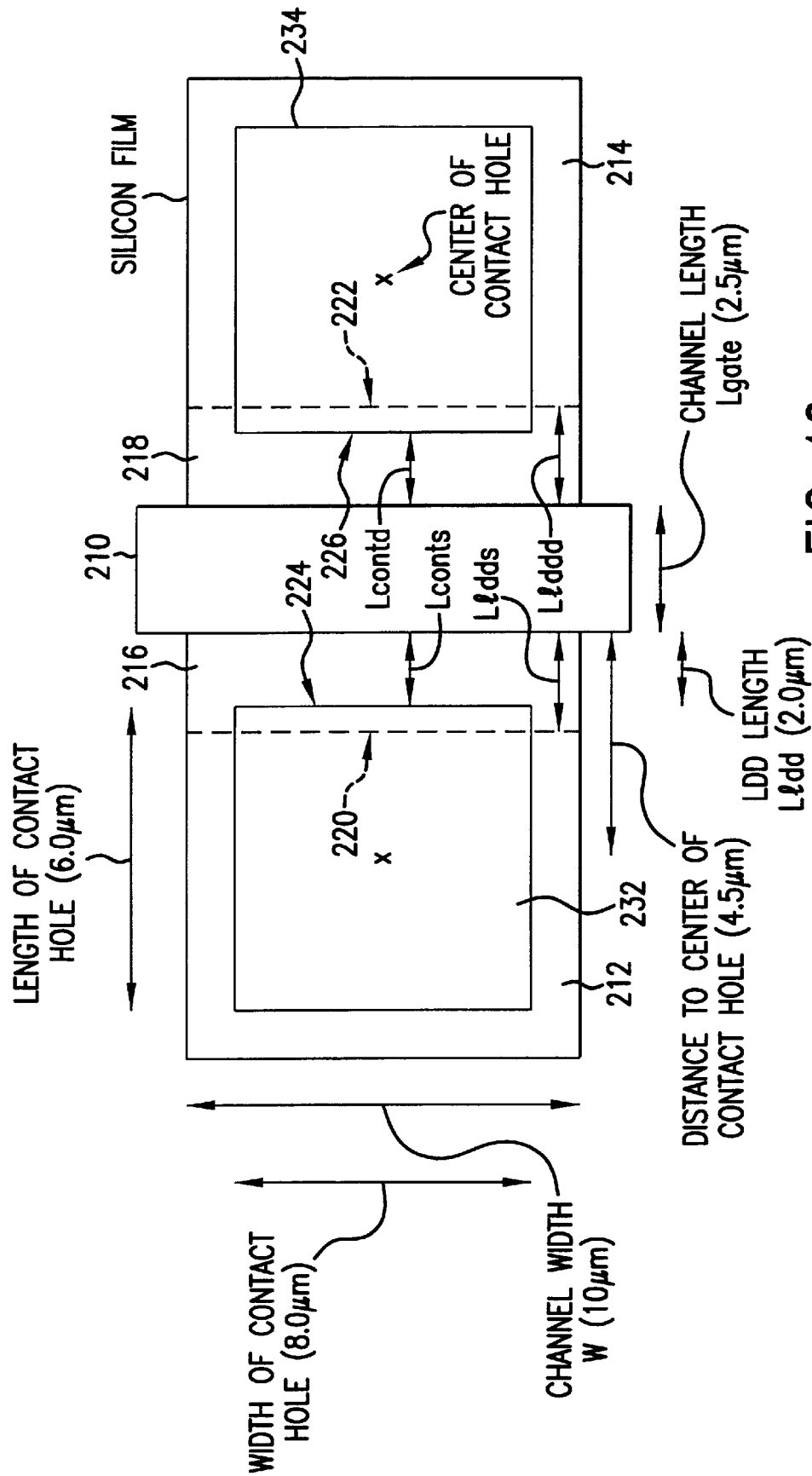
Figure 47:
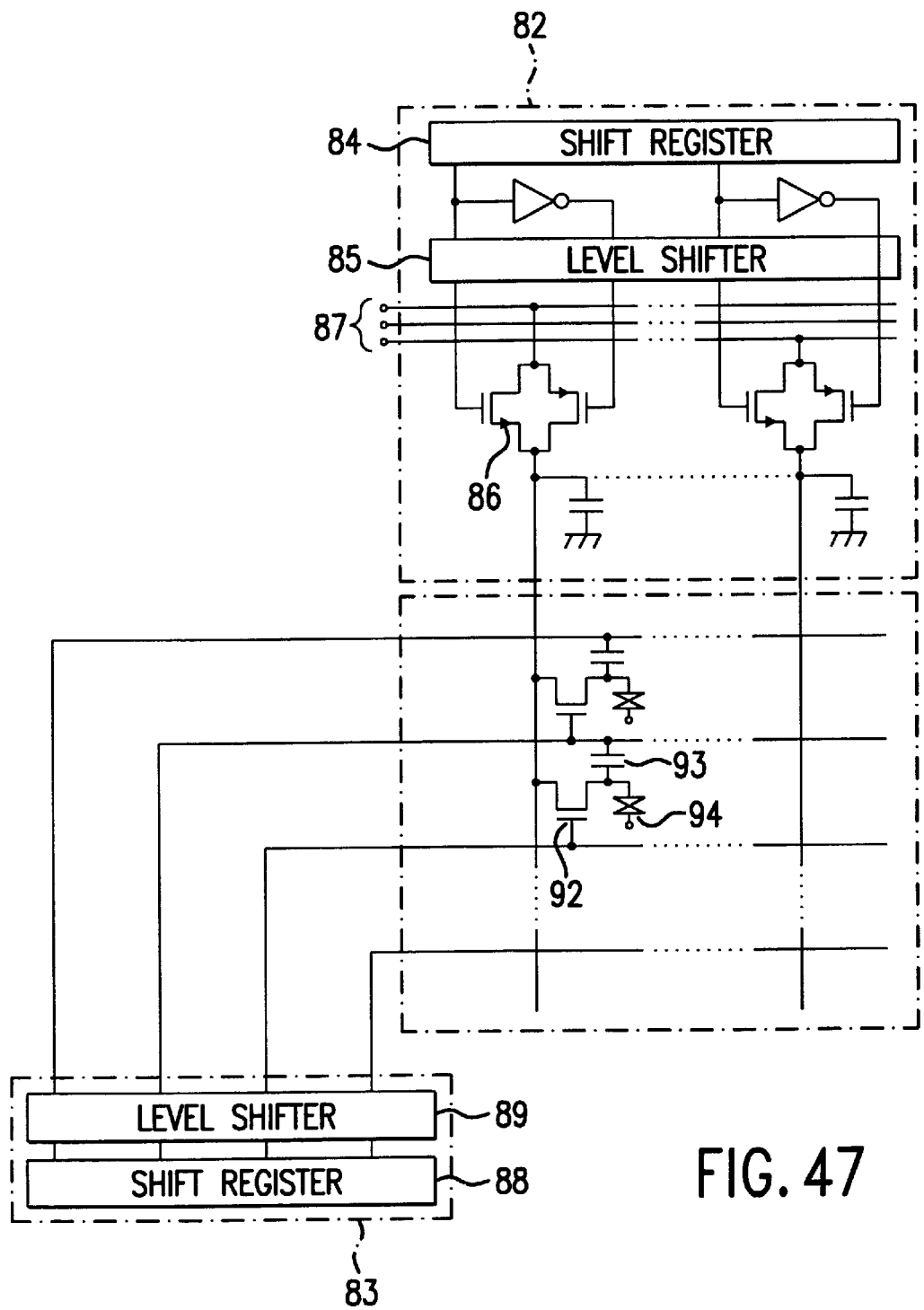
Figure 48A:
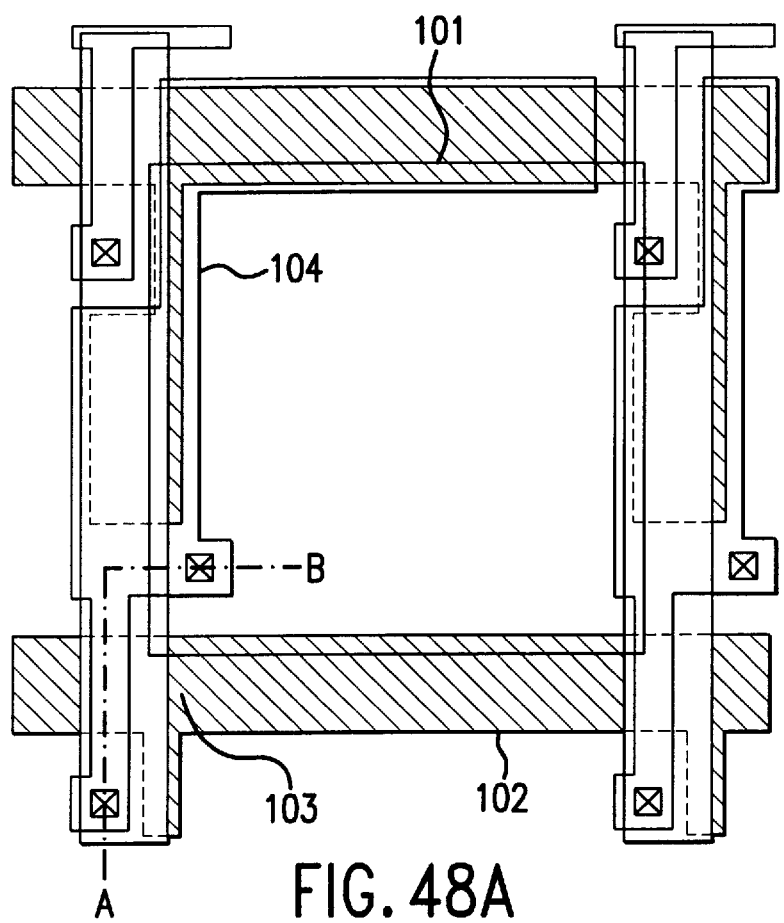
Figure 48B:
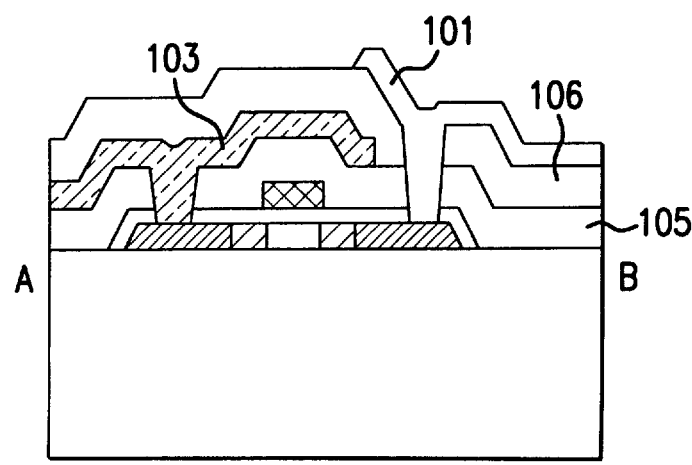
Figure 49A:
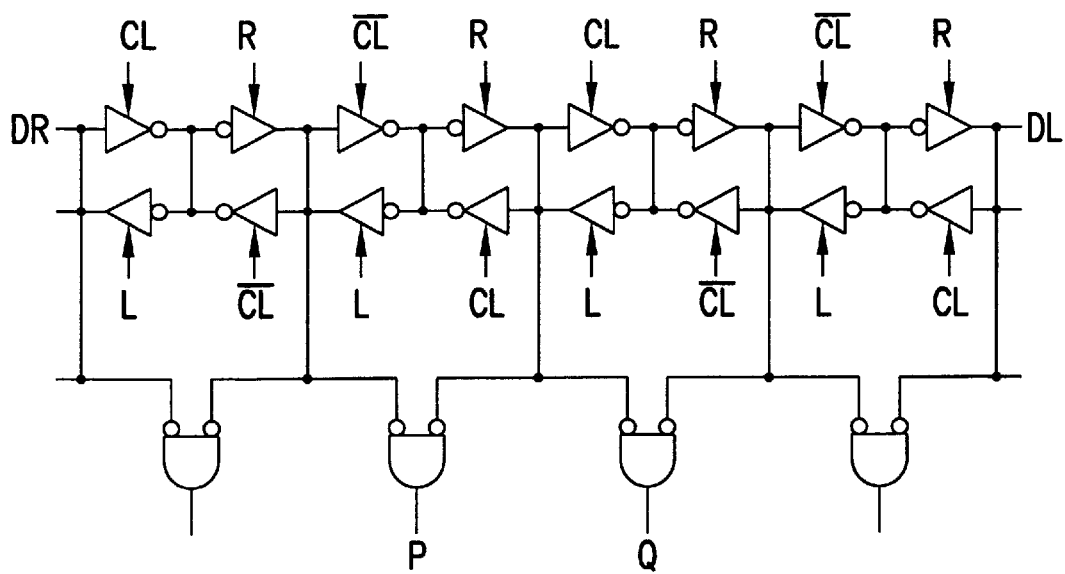
Figure 49B:
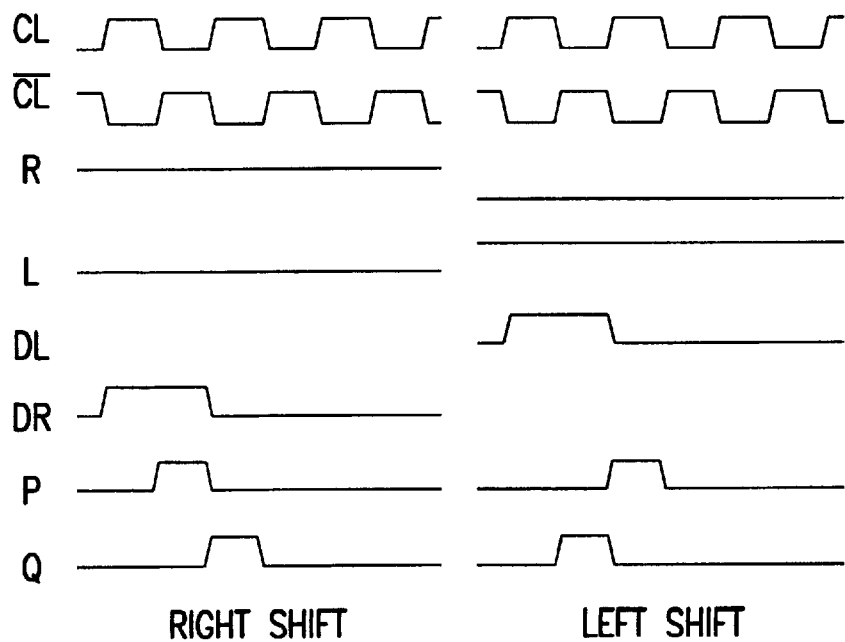
Figure 50A:
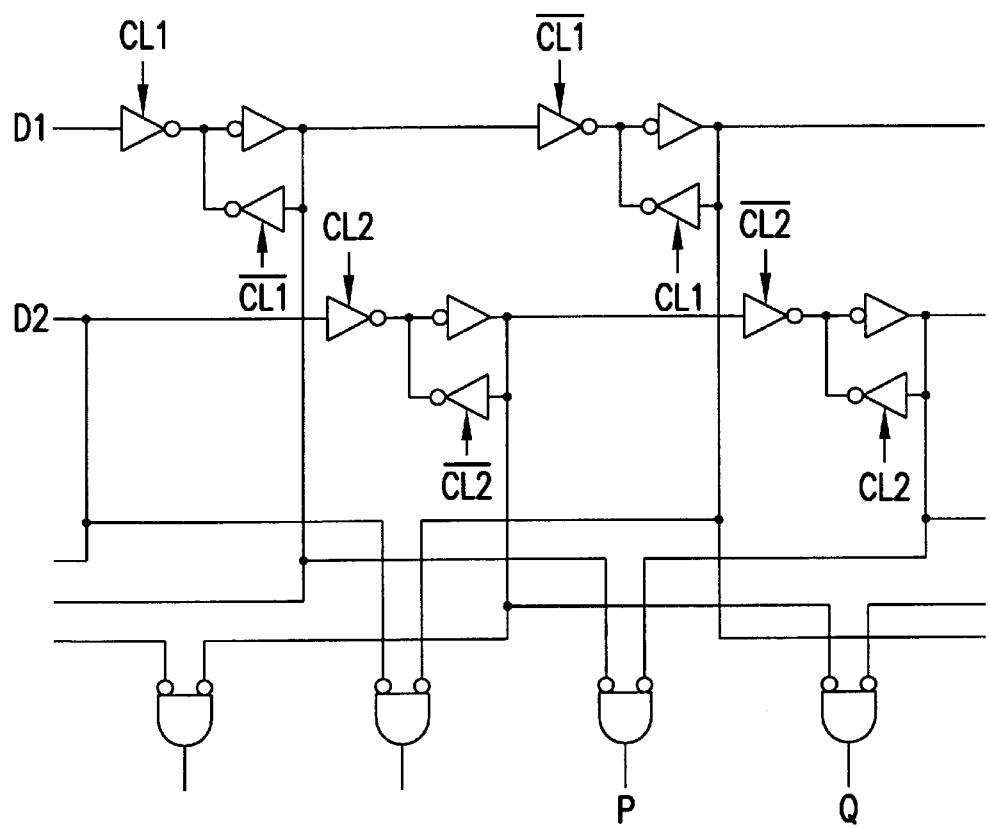
Figure 50B:
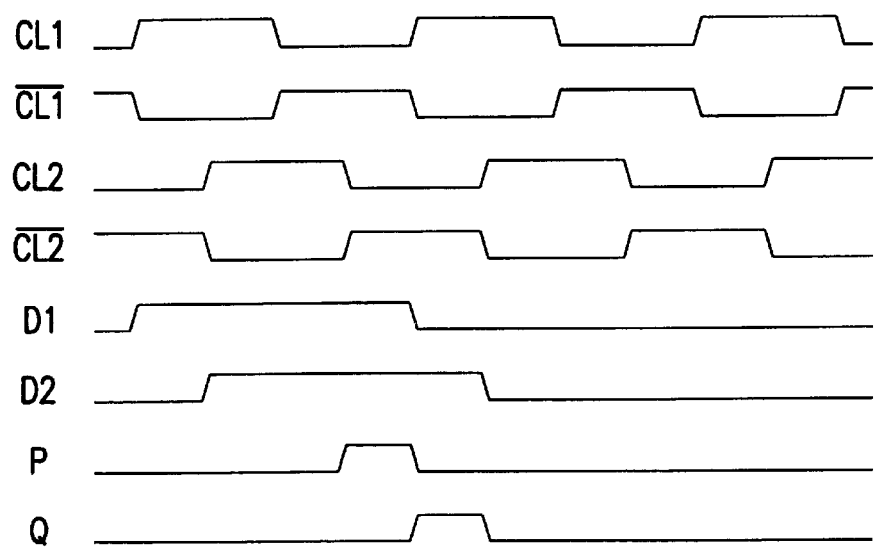
Figure 51A:
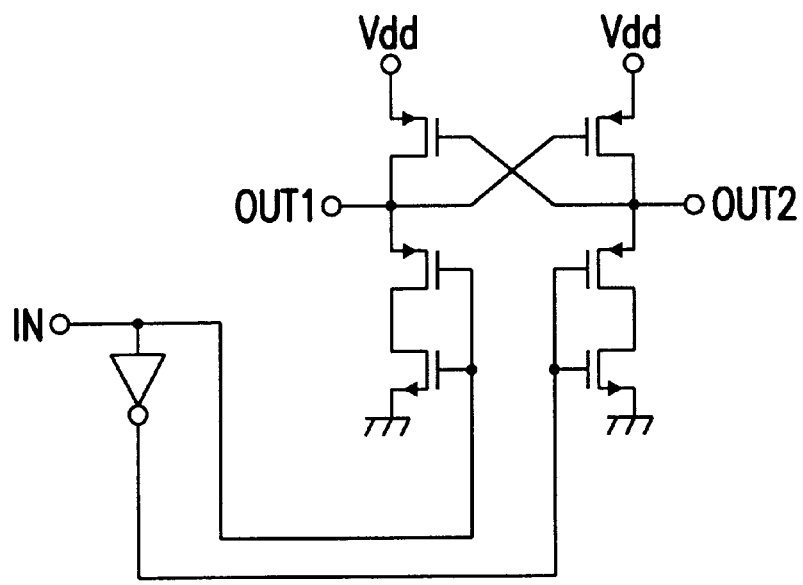
Figure 51B:
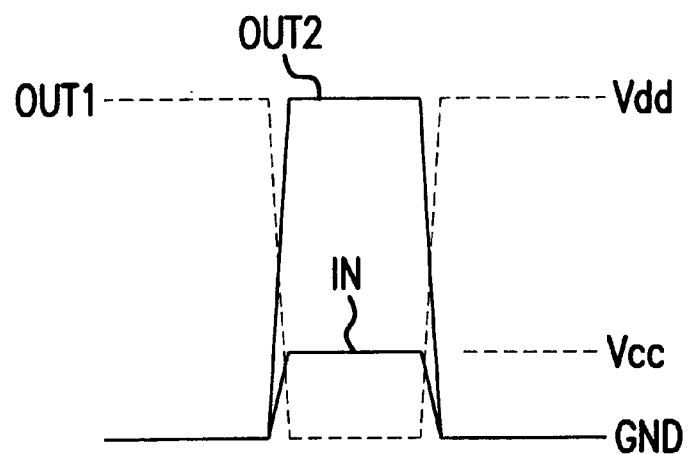
Figure 52:
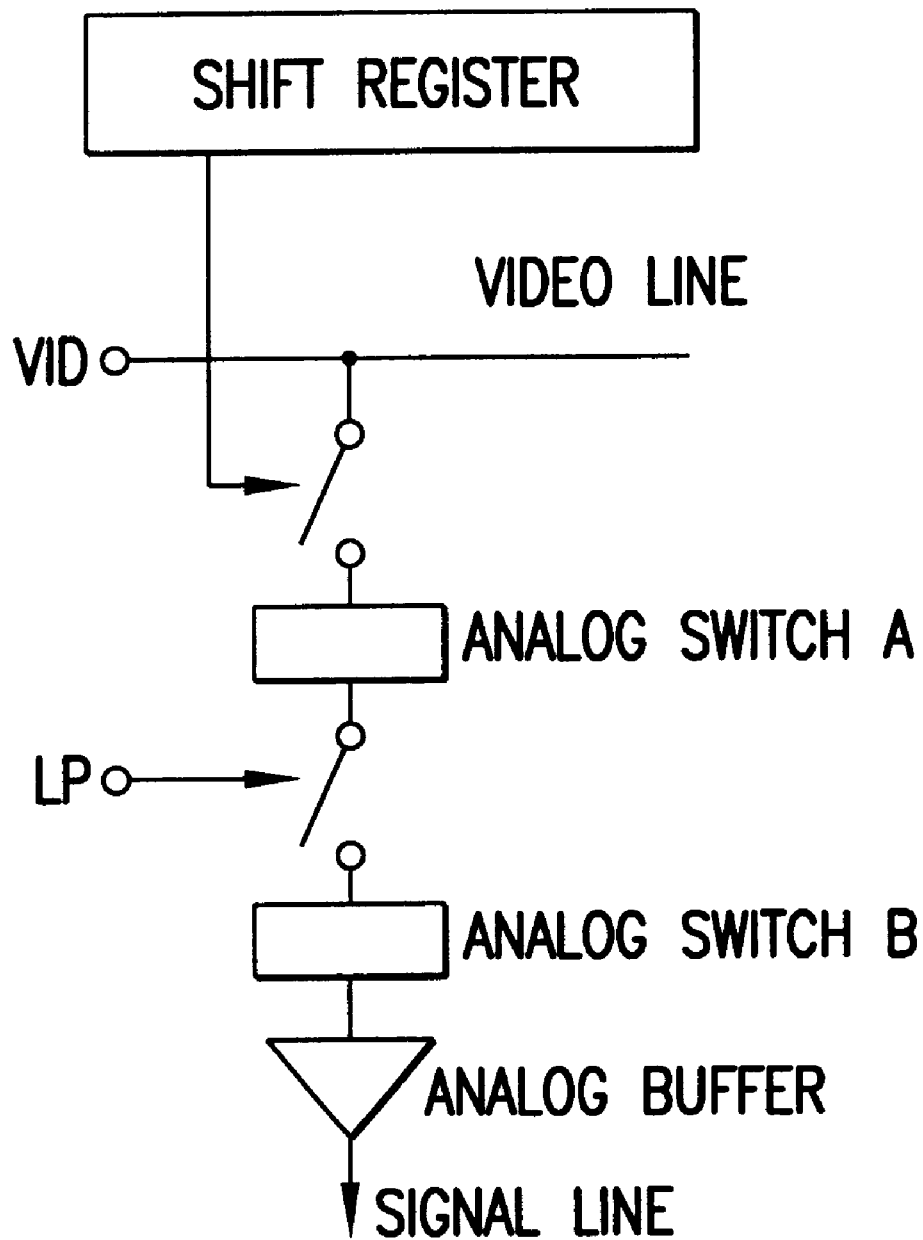
Figure 53:
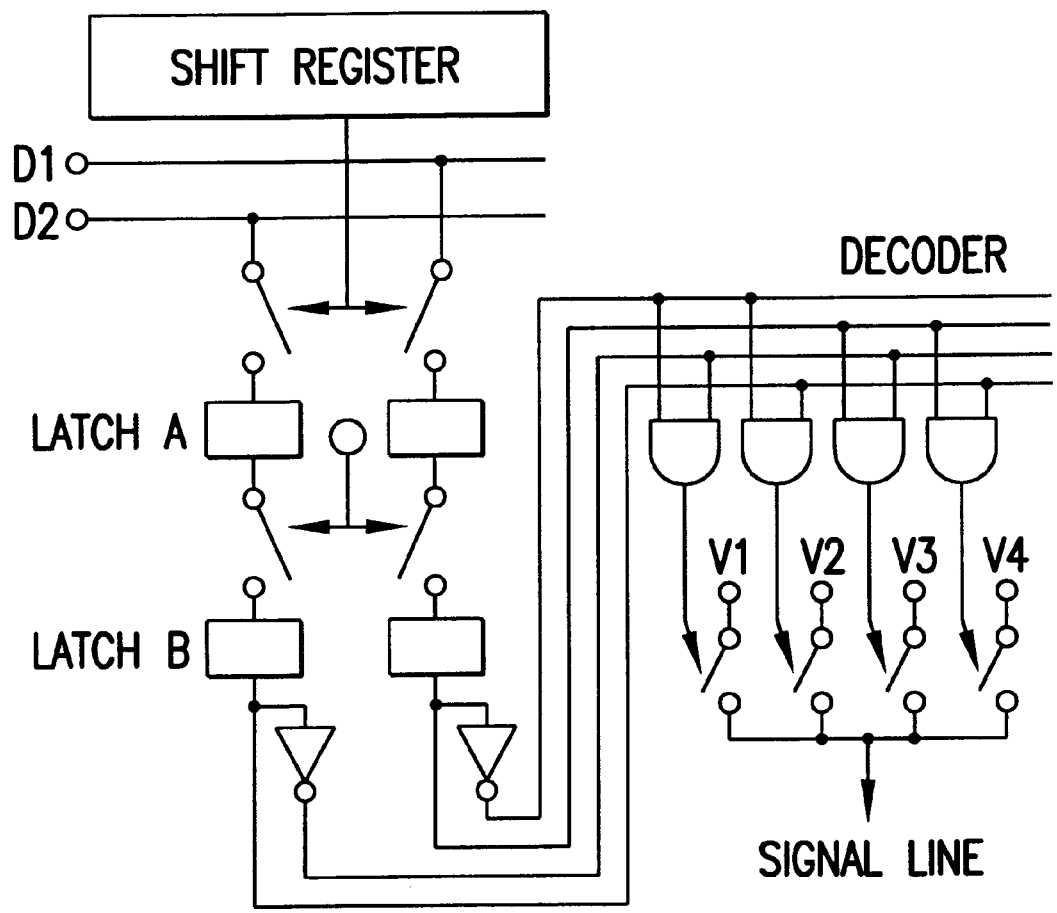
Figure 54:
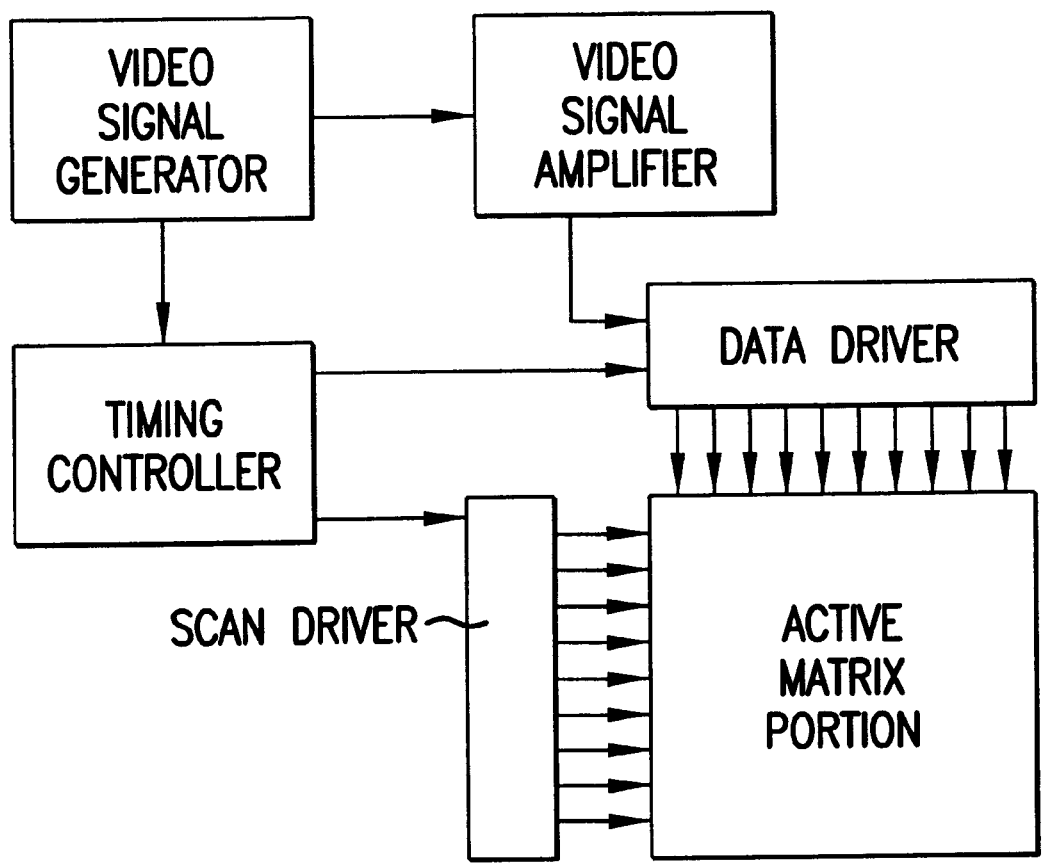
Figure 56A:
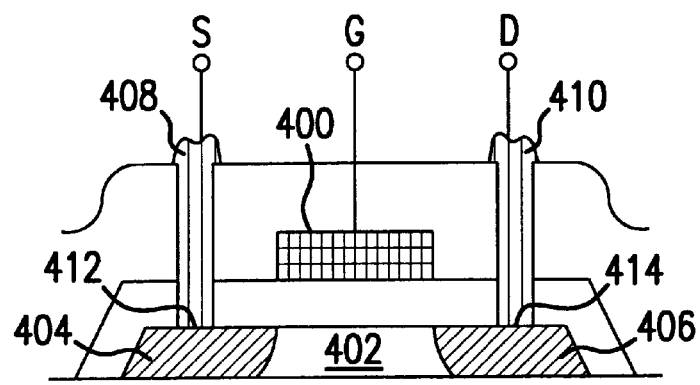
Figure 56B:
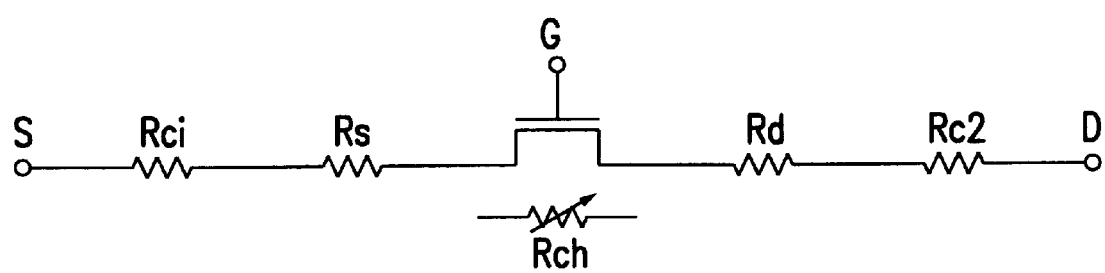

FIG. 45 lists the contact resistance, source and drain resistance, and LDD resistance of TFTs of the ninth embodiment and comparative examples;

FIG. 46 shows a model used for calculating parasitic resistance;

FIG. 47 is a circuit diagram of a type of active matrix LCD with integral peripheral drive circuits;

FIGS. 48A and 48B are a pixel pattern diagram and cross-sectional view of an active matrix LCD;

FIGS. 49A and 49B are a circuit diagram and timing chart of a bidirectional shift register circuit;

FIGS. 50A and 50B are a circuit diagram and timing chart of a single-direction shift register circuit;

FIGS. 51A and 51B are a circuit diagram and timing chart of a level-shifter circuit;

FIG. 52 is a circuit diagram of an analog line-sequential data driver;

FIG. 53 is a circuit diagram of a digital data driver;

FIG. 54 is a block diagram of a display system using an active matrix LCD;

FIG. 55 lists examples of the carrier mobility and ON current of an amorphous TFT, prior art polycrystalline TFTs, TFTs of a twelfth embodiment, and a single-crystal MOSFET; and FIG. 56A shows an example of the configuration of a thin-film semiconductor device, and FIG. 56B is an equivalent circuit diagram of this thin-film semiconductor device.

DETAILED DESCRIPTION OF PREFERRED EMBODIMENTS

Preferred embodiments of the invention are described with reference to FIGS. 1–56. The first five embodiments provide improved methods for fabricating a high-speed thin-film semiconductor device.

First Embodiment

Figure 26:
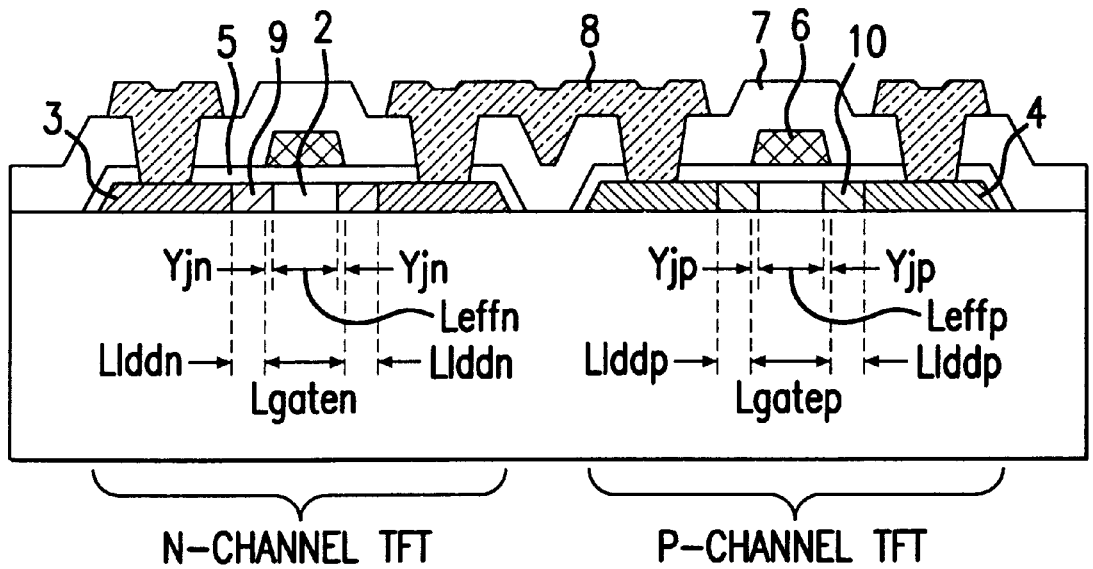
FIG. 26 is a cross-section through an LDD-type TFT.

FIGS. 1A to 1D illustrate the process of fabricating an n-channel TFT as an example, but the invention is applicable to the fabrication of a p-channel TFT or a CMOS type of TFT which includes an n-channel TFT and a p-channel TFT as shown in FIG. 26. The invention is also applicable to the TFT which has two gate electrodes.

In the first embodiment, quartz glass is used as a substrate 201. However, any type or size of substrate can be used, provided the substrate can withstand the maximum temperature achieved within the process of fabricating the thin-film semiconductor device. A semiconductor film such as silicon for forming the active layer is first deposited on the substrate 201. If the substrate is a conductive material, a ceramic material that includes impurities, an underlying protective film such as a silicon dioxide film or silicon nitride film is deposited before the semiconductor film is deposited as shown in FIG. 25.

Page 16

Figure 1A:
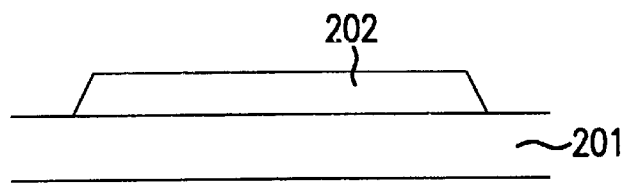
FIGS. 1A to 1D show the process of fabricating a thin-film semiconductor device of a first embodiment of the invention.

When a thin-film semiconductor device is fabricated according to the first embodiment, an intrinsic silicon film is deposited by LPCVD on the substrate 201. The thickness of the film after this deposition is 1000 Å. The LPCVD apparatus is hot-wall type, having a volume of 184.5 L. The total reactive area in the LPCVD chamber when substrates are set is approximately 44,000 $cm^2$. The deposition temperature is 510° C., mono-silane ($SiH_4$) of purity of at least 99.99% is used as the reactant gas, and the gas is supplied to the reaction chamber at a flow rate of 100 sccm. The deposition pressure is 0.8 Torr. A silicon film is deposited under these conditions at a deposition rate of 21.5 Å/minute. The deposited silicon film is patterned to obtain a silicon film 202 as shown in FIG. 1A.

Figure 1B:
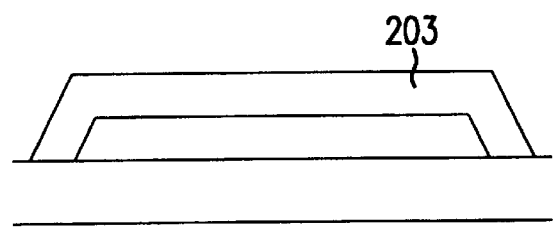

The patterned silicon film 202 is then thermally oxidized to form a silicon dioxide film 203 on the surface of the silicon film 202. Thermal oxidation is performed for 23 minutes and 36 seconds at one atmospheric pressure in a 100% oxygen environment at 1160° C. This process thins the silicon film to 400 Å and obtains a silicon dioxide film with film thickness of 1200 Å as shown in FIG. 1B. In order to adjust the threshold voltage of this thin-film semiconductor device, $B^+$ ions are implanted into the semiconductor film at a dose of $2 \times 10^{12}$ $cm^{-2}$ with an acceleration voltage of 40 kV.

Figure 1C:
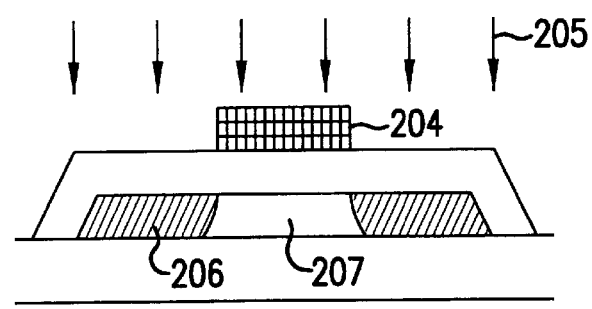

Then a gate electrode 204 is formed from a silicon film containing donors or acceptors. In this embodiment, the gate electrode 204 is formed of a 3500 Å-thick layer of polycrystalline silicon containing phosphorus. The sheet resistance of this gate electrode 204 is 25Ω/□. The gate electrode 204 is used as a mask for the implantation of impurity ions 205 which become donors or acceptors forming source and drain portions 206 and a channel region 207 as shown in FIG. 1C. In this embodiment, phosphorus is selected as the impurity ion, and implanted at a dose of $2\times10^{15}$ cm$^{-2}$ with an acceleration voltage of 90 kV.

Figure 1D:
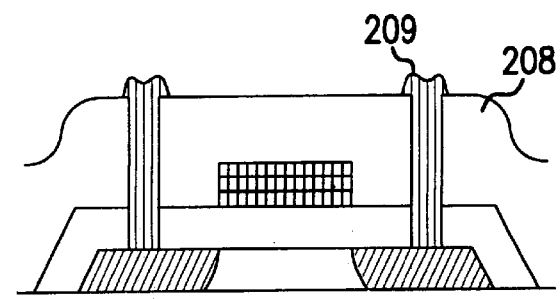

An interlayer insulation film 208 is then deposited by means such as an atmospheric pressure CVD method. This interlayer insulation film is formed of a silicon dioxide film with film thickness of 5000 Å. After the interlayer insulation film is deposited, furnace annealing is performed for 20 minutes in a nitrogen atmosphere at 1000° C. to anneal the interlayer insulation film and to activate the impurity ions that have been added to the source and drain portions. Contact holes are then opened and wires 209 of aluminum, for example, are formed in the contact holes to complete the thin-film semiconductor device as shown in FIG. 1D.

Figure 2:
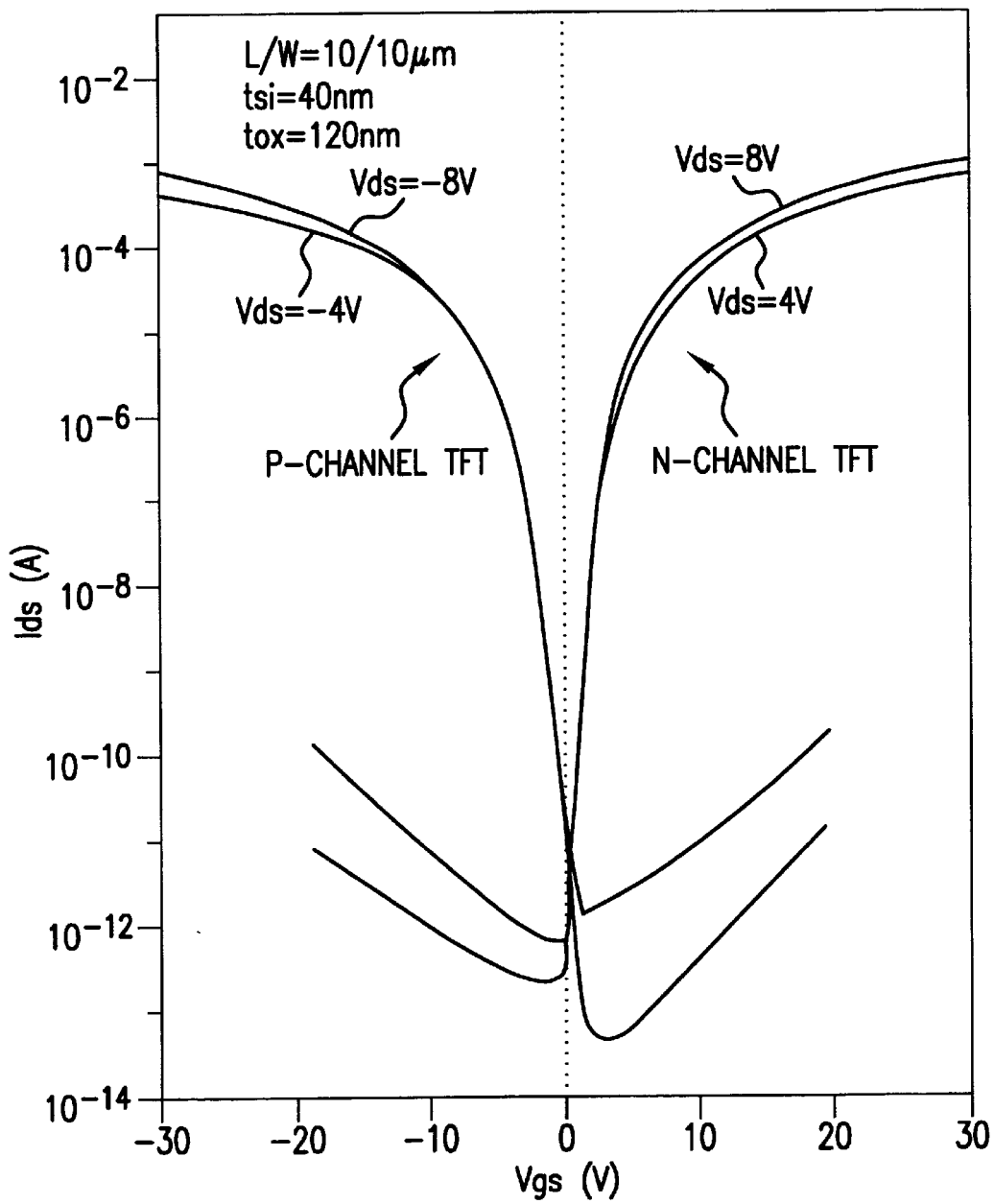
FIG. 2 is a graph of the transistor characteristics of n-channel TFT and p-channel TFTs of the first embodiment.

The transistor characteristics of the n-channel TFT of the resulting thin-film semiconductor device are measured at room temperature and shown in FIG. 2. The length and width of the channel are both 10 μm. When the source-drain voltage (Vds) is 4 V and the gate voltage (Vgs) is 10 V, the transistor is ON and the source-drain current (Ids) is 75.6 μA, as shown in FIG. 2. When Vds is 4 V, Vgs is 0 V and the transistor is OFF, Ids is 0.203 pA.

From the above, it is clear that an extremely good thin-film semiconductor device is obtained. An ON/OFF ratio is more than eight orders of magnitude for a change in gate voltage of 10 V. The carrier mobility calculated from the saturation region of this transistor is an excellent value of 106 cm$^2$/V.s. Thus, this embodiment of the invention fabricates thin-film semiconductor devices having outstanding characteristics. This embodiment does not require any lengthy furnace annealing nor hydrogenation, but requires only silicon film deposition by LPCVD.

Page 17

The p-channel TFT characteristics are also shown in FIG. 2. The only difference between fabricating the p-channel TFT from the n-channel TFT is that an acceptor-type impurity such as boron is implanted for forming the source and the drain portions.

If hydrogenation is performed on this thin-film semiconductor device by subjecting it to a hydrogen plasma for two hours, then both the ON current and the OFF current improve to values of 102 μA and 0.0318 pA, respectively, under the same measurement condition as those described above. The resultant carrier mobility is 129 cm$^2$/V.s.

This first embodiment fabricates a high-performance thin-film semiconductor device in a simple manner without requiring troublesome processing steps such as the implantation of silicon atoms or (re-)crystallization of the semiconductor film by lengthy furnace annealing.

Page 18

Second Embodiment

A variety of thin-film semiconductor devices are fabricated by the fabrication process of the first embodiment varying the deposition conditions of the silicon film forming the active layer. However, no hydrogenation is performed.

In the second embodiment, silicon films are deposited by the LPCVD apparatus of the first embodiment. The reactant gas is at least 99.99% pure mono-silane. The deposition temperature for the silicon film is varied between 490° C. and 650° C., the mono-silane flow rate for the deposition is varied between 10 sccm and 100 sccm, and the deposition pressure is set as appropriate in the range of between 1 m Torr and 0.8 Torr. In this manner, various silicon films are deposited under differing deposition conditions. The film thickness of all the deposited silicon films is 1000±50 Å.

After the silicon film deposition, the thin-film semiconductor devices are completed by exactly the same fabrication process as the first embodiment. The film thickness of all the silicon films after the thermal oxidation is 400±50 Å, and the film thickness of the silicon dioxide film that acts as the gate insulation film is 1200±50 Å.

If silicon film deposition conditions are changed, the resultant deposition rate will also change. Also, the different deposition conditions of silicon film lead to different electrical properties of the resultant thin-film semiconductor devices.

Figure 3:
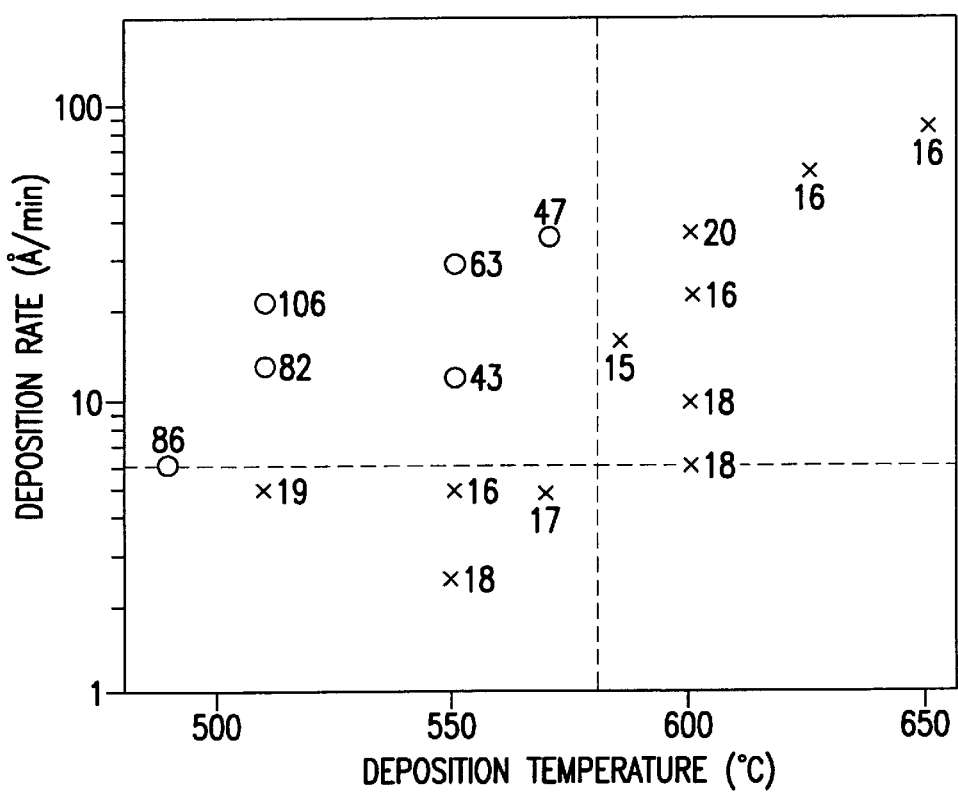
FIG. 3 is a characteristic diagram showing the relationships among deposition temperature, deposition rate, and carrier mobility.

FIG. 3 shows the relationships between the carrier mobility of each of the thin-film semiconductor devices obtained by the above described method, the deposition temperature and deposition rate of the silicon film. The horizontal axis shows the silicon film deposition temperature while the vertical axis shows the deposition rate. The carrier mobilities of the corresponding thin-film semiconductor devices are indicated by the numbers adjacent to the "O"s and "X"s. The units of carrier mobility are cm$^2$/V.s. The dotted lines in the figure show boundary lines indicating a deposition temperature of 580° C. and a deposition rate of 6 Å/minute. Transistors having good electrical properties are indicated by "O"s in the figure, while transistors having nearly the same electrical properties as those of thin-film semiconductor devices produced as comparative examples by the first conventional fabrication method are indicated by "X".

The temperature for directly depositing the polycrystalline silicon films of the comparative examples is approximately 600° C. or more. All of the thin-film semiconductor devices fabricated as comparative examples have carrier mobilities between approximately 15 cm$^2$/V.s to 20 cm$^2$/V.s. When the silicon film deposition temperature is approximately 580° C. or less, the characteristics of thin-film semiconductor devices are strongly dependent on the deposition rate of the silicon films. When the deposition rate is 6 Å/minute or more, the correspondent thin-film semiconductor devices have extremely good electrical characteristics, even without applying the hydrogenation process earlier described.

In contrast, when the deposition rate is less than 6 Å/minute, the carrier mobility ranges from between approximately 16 cm$^2$/V.s to 19 cm$^2$/V.s, which is about the same carrier mobilities as for the devices produced as comparative examples. An extremely high-performance thin-film semiconductor device can be obtained when the thin-film semiconductor device is fabricated under conditions such that the deposition temperature is 580° C. or less and the deposition rate is 6 Å/minute or more.

The silicon films of the active layers of the thin-film semiconductor devices formed in accordance with the invention are scanned by a scanning electron micro-scope (SEM). After the thermal oxidation, each silicon dioxide film is removed by a 10% aqueous solution of hydrogen fluoride, then the exposed polycrystalline silicon surface is observed by the SEM. The SEM observation shows that the grain area distribution is exponential and both the average grain area and the standard deviation of the grain area are between 10,000 nm$^2$ and 20,000 nm$^2$ for all silicon films.

Figure 4:
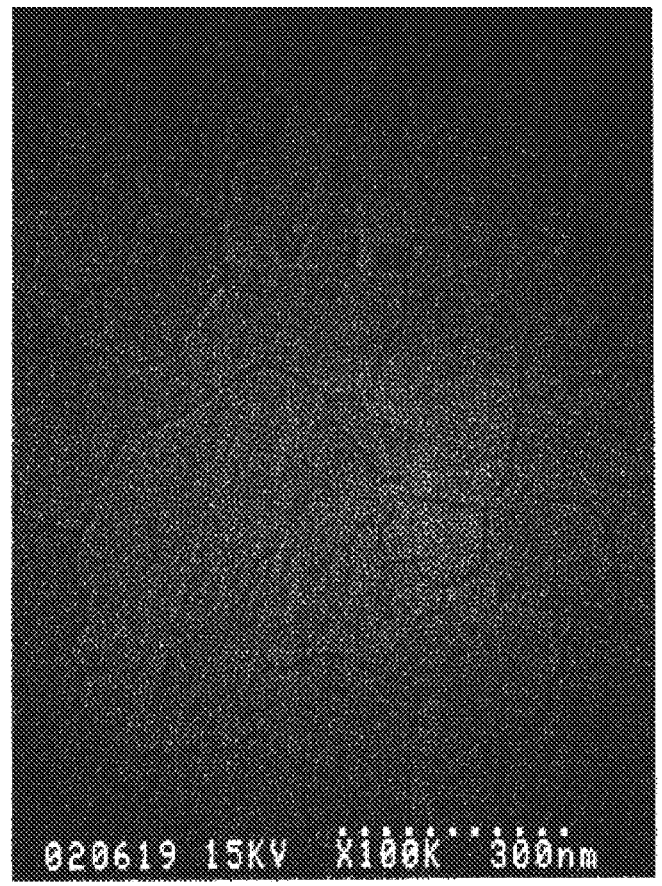
FIG. 4 is a scanning electron microscope (SEM) photograph of the crystal structure of a silicon film (after thermal oxidation, deposition temperature=510° C.) which is used in a thin film semiconductor device.
Figure 6A:
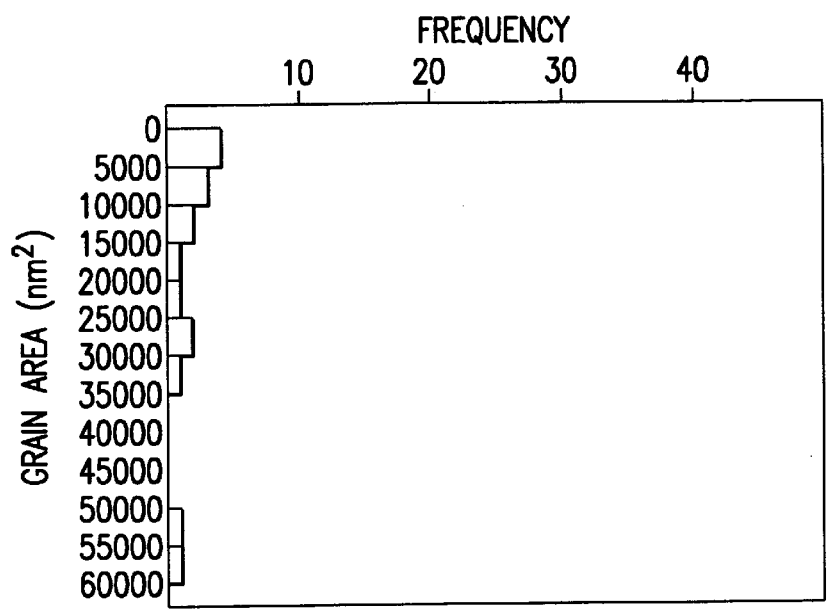
FIGS. 6A and 6B show the distributions of grain areas.

FIG. 4 shows a scanning electron microscope (SEM) photograph of the crystal structure of a silicon film deposited at 510° C. with the deposition rate of 12.9 Å/minute having a carrier mobility of 82 cm$^2$/V.s. when it is used as the active layer of thin film transistors. The grain area distribution verified by FIG. 4 is shown in FIG. 6A. The average grain area (grain size) is 15,600 nm$^2$ with a standard deviation of 15,300 nm². Each silicon film formed by the method in accordance with this embodiment contains large grains and some grains having an area of more than 55,000 nm². See the range of 55,000 nm² to 60,000 nm² in FIG. 6A.

Figure 5:
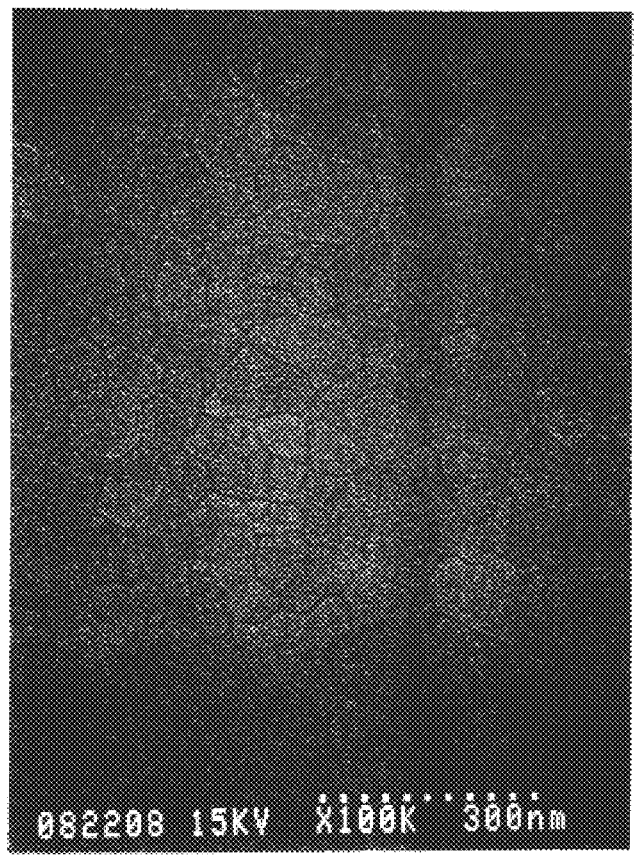
FIG. 5 is a scanning electron microscope (SEM) photograph of the crystal structure of a silicon film (after thermal oxidation, deposition temperature=600° C.) which is used in a thin film semiconductor device.
Figure 6B:
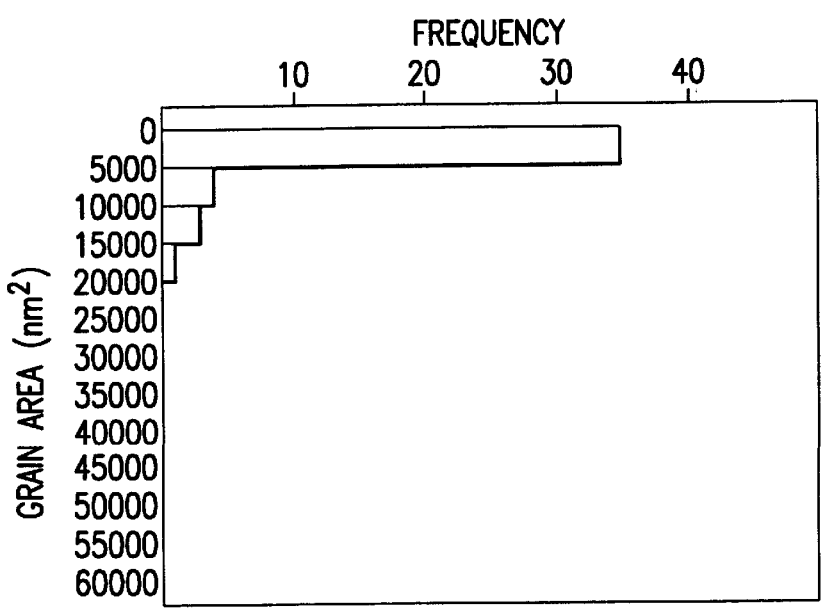

FIG. 5 is a scanning electron microscope (SEM) photograph showing the crystal structure of a comparative example silicon film of a thin-film semiconductor device obtained by the first conventional fabrication method. The grain area distribution of this comparative example is shown in FIG. 6B. The silicon film shown in FIGS. 5 and 6B is deposited at a deposition temperature of 600° C. and a deposition rate of 37.7 Å/minute.

FIG. 5 shows the state of the silicon film after thermal oxidation. The carrier mobility of this silicon film is 20 cm²/V.s. The average grain area of the film is 3,430 nm², with a standard deviation of 4,210 nm². Both the average and standard deviation of the grain area of a silicon film are always less than 5,000 nm² if one of the silicon film is deposited at the temperature of 600° C. or more and the silicon film is deposited at the deposition rate of less than 6 Å/minute. The films deposited at the temperature of 580° C. or less with the deposition rate of less than 6 Å/minute also have grain area less than 5,000 nm².

Page 21

Accordingly, if a silicon film is deposited at a deposition temperature of 580° C. or less and a deposition rate of 6 Å/minute or more and the silicon film is thermally oxidized, the average grain area of the polycrystalline film of the active layer of a transistor is at least 10,000 nm². This is far greater than the grain area produced by conventional fabrication techniques. The characteristics of the thin-film semiconductor device are also greatly improved.

A. Principle of the Present Invention

The invention forms a semiconductor film having superior characteristics by depositing a semiconductor film under conditions such that the nucleus generation rate is retarded and the island growth rate is accelerated. The principle of the invention is described below with reference to FIGS. 7A to 7E and FIGS. 8A to 8H.

In general, when a thin film is deposited by the low-pressure chemical vapor deposition (LPCVD) method, a number of nuclei 30 and 31, which are points that act as seeds or centers for film growth, appear first on the insulating substance regardless of whether the deposited film is amorphous or polycrystalline. See FIG. 7A. Reactant molecules forming the reactant gas are transferred from the gaseous phase to the substrate. These molecules are subjected to heat from the substrate and undergo a chemical reaction, which causes a number of these molecules to gather and form nuclei. For example, the chemical reaction for mono-silane is:

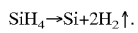

$$SiH_4 \rightarrow Si + 2H_2 \uparrow.$$

The nuclei 30 and 31 grow to become islands 34 and 35 while more nuclei 32 and 33 form in vacant regions on the substrate. See FIG. 7B. The nuclei 32 and 33 grow into islands 36 and 37 while the islands 34 and 35 grow further thus reducing vacant regions on the substrate. See FIG. 7C. As the vacant regions between islands disappear, new nuclei also stop appearing. The islands 34 to 37 continue to grow until they combine to form a thin film 38. See FIG. 7D. This thin film 38 grows further until a thin film 40 of preferred film thickness is formed. FIG. 7E shows the thin film 40 having regions 51, 52, 53 and 54 which are "islands" in the final stage of deposition process. These islands correspond to the original islands formed during the initial stage of deposition process regardless of whether the silicon film is amorphous or polycrystalline. Island growth and nucleus generation compete with each other until the insulating substance surface is completely covered by the deposited film. Therefore, if the nucleus generation rate is retarded and the island growth rate is accelerated, then the islands would become extremely large. As a result, the regions 51 to 54 of the thin film also becomes large.

FIGS. 8A to 8D show retarding the nucleus generation rate and accelerating the island growth rate according to the invention. In contrast, FIGS. 8E to 8H show the nucleus generation rate and the island growth rate of conventional fabrication techniques. For example, three nuclei are generated as shown in FIG. 8A, whereas five nuclei are generated as shown in FIG. 8E. The growth rate of the resultant islands is faster and shown in FIG. 8B than shown in FIG. 8F. When the island growth rate is fast, vacant regions on the substrate is reduced at a higher rate as shown in FIG. 8C. Thus, the number of nuclei which will be generated is further restricted.

In contrast, since the island growth rate as shown in FIG. 8G is slower, many vacant regions exist on the substrate for a longer time, so that the number of nuclei which will be generated is not as restricted as is the case shown in FIG. 8C. Thus, instead of the small islands of the comparative example shown in FIG. 8H, the islands grown in accordance with the invention are extremely large. See FIG. 8D.

When a semiconductor film having large islands is subjected to annealing such as thermal oxidation, the film changes its physical state from an amorphous state to a polycrystalline state resulting in a polycrystalline semiconductor film having large grains, as shown in FIG. 4. The islands of the semiconductor film are generally called "grains" when the semiconductor film is in the polycrystalline state.

The principle of the invention as described above is not only applicable to films deposited as amorphous films, but also applicable to films deposited as polycrystalline films. The inventors discovered that amorphous film has regions or islands. Prior to this discovery, it is widely believed that an amorphous film is in a random state so that an amorphous film does not have any orders such as directions of growth as observed in a single-crystal or polycrystalline film. Therefore, it is not known in the art that there are dividing regions (boundaries) between random shapes in an amorphous film.

Figure 9:
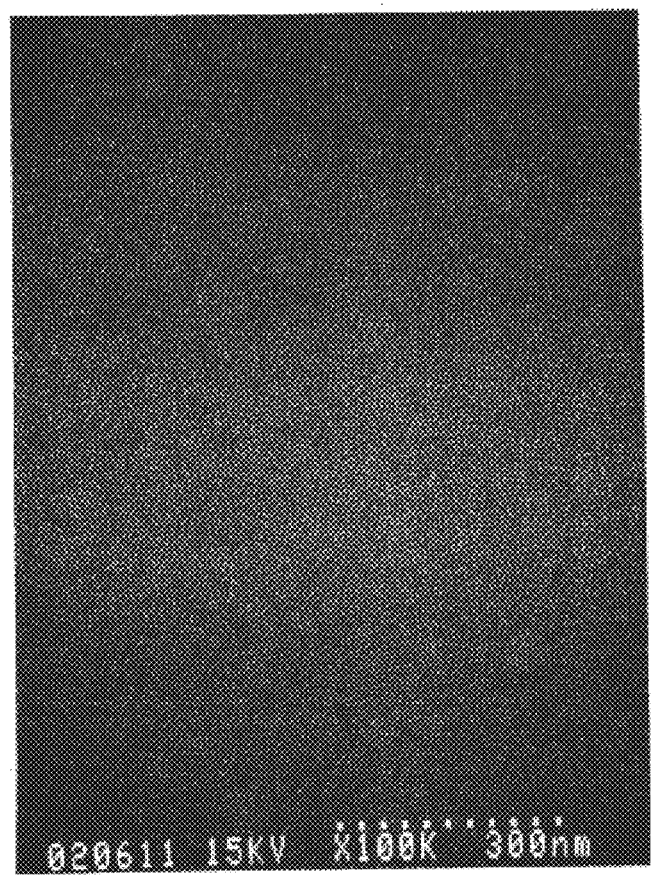
FIG. 9 is a scanning electron microscope (SEM) photograph of the amorphous state of a silicon film (before thermal oxidation, deposition temperature=510° C.) which is to be used in a thin film semiconductor device.

FIG. 9 shows a scanning electron microscope (SEM) photograph of an amorphous silicon film having a typical amorphous state deposited at the temperature of 510° C. with the deposition rate of 12.9 Å/minute. FIG. 9 is a photograph of a film deposited as an amorphous film before thermal oxidation.

The film immediately after deposition is an as-deposited film. If this film is thermally oxidized, the crystalline structure changes from an amorphous state to a polycrystalline state shown in FIG. 4. FIG. 9 shows no regions that are islands before thermal oxidation. Therefore, it is believed that regions or islands do not exist in an amorphous film.

Figure 10:
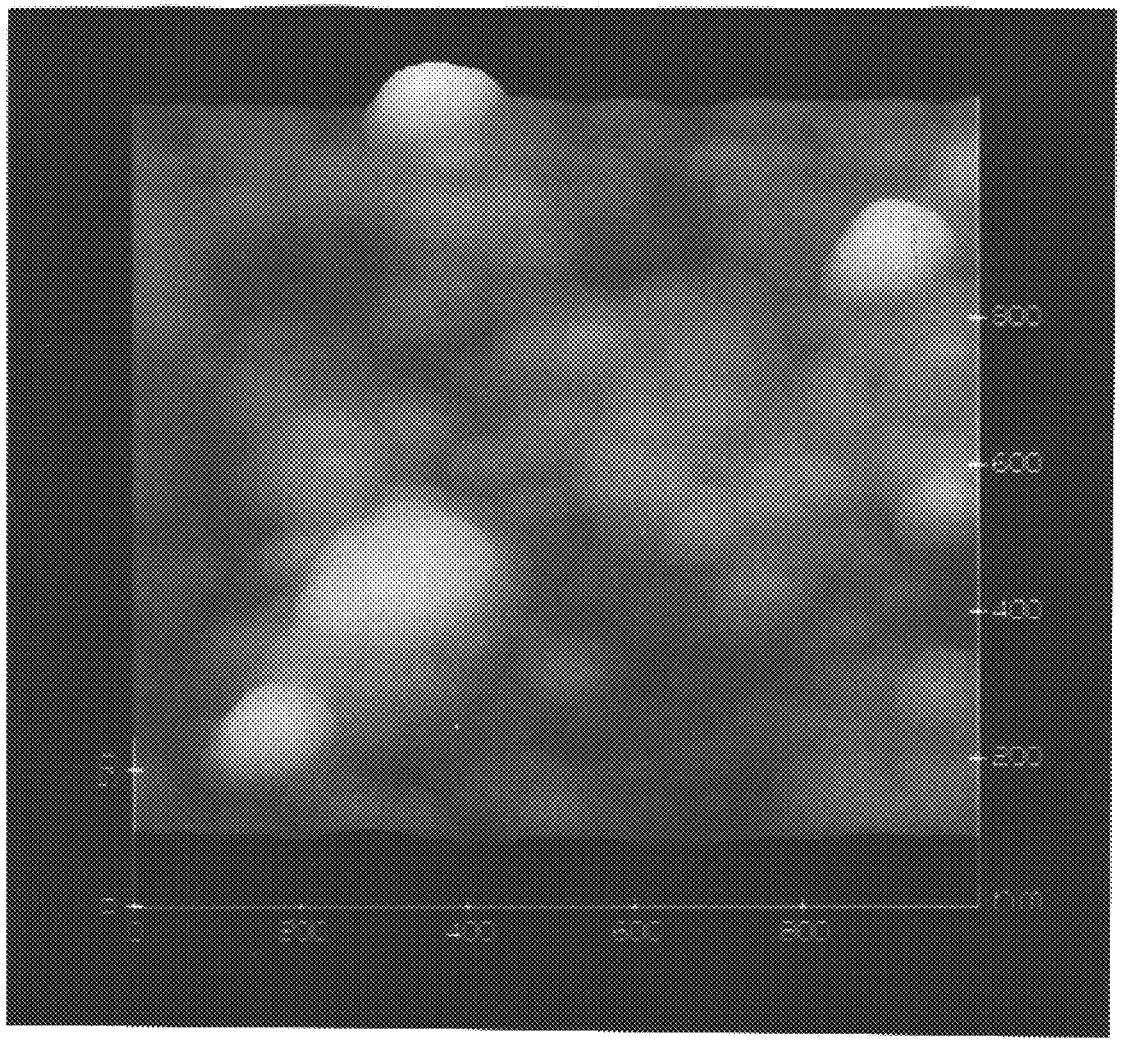
FIG. 10 is an atomic force microscope (AFM) photograph of the amorphous state of the amorphous state of a silicon film (before thermal oxidation, deposition temperature=510° C.) which is to be used in a thin film semiconductor device.

However, the inventors verified the presence of islands in an amorphous film with an atomic force microscope (AFM). FIG. 10 shows an atomic force microscope photograph of an as-deposited amorphous silicon film which is a silicon film in the amorphous state immediately after the deposition.

Figure 11:
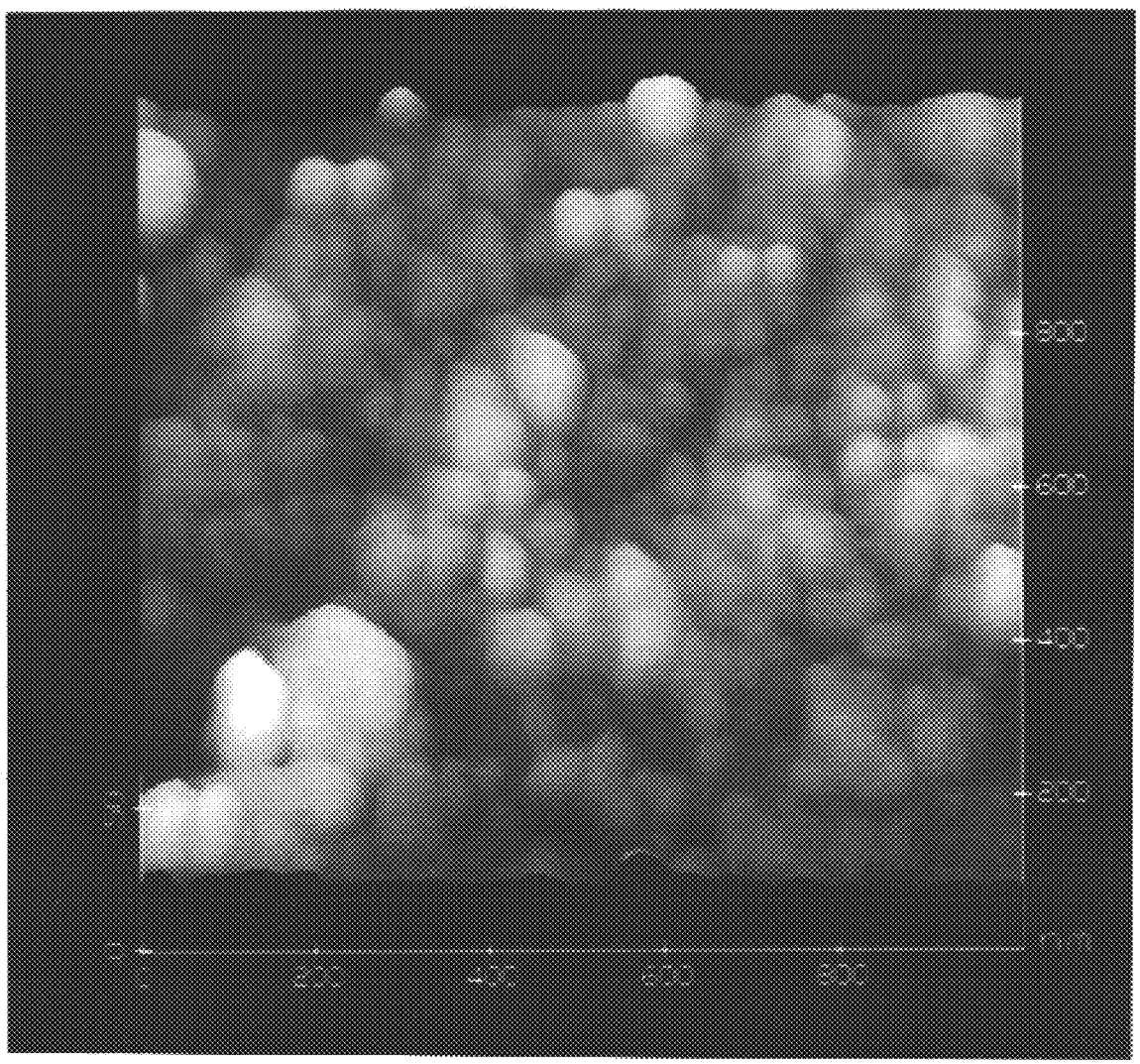
FIG. 11 is an atomic force microscope (AFM) photograph of the amorphous state of a silicon film (before thermal oxidation, deposition temperature=570° C.) which is to be used in a thin film semiconductor device.
Figure 12:
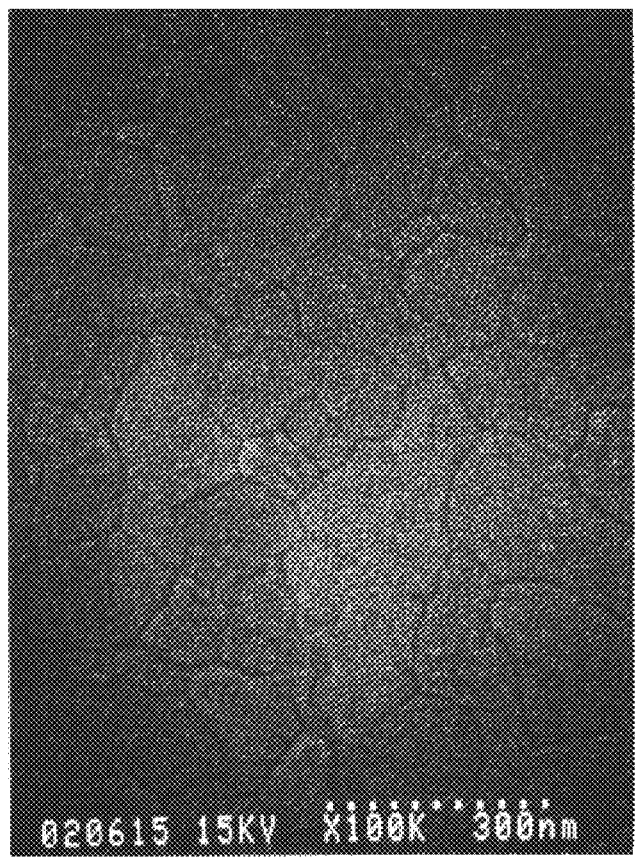
FIG. 12 is a scanning electron microscope (SEM) photograph of the crystal structure of a silicon film (after thermal oxidation, deposition temperature=570° C.) which is used in a thin film semiconductor device.

The amorphous film is deposited at a deposition temperature of 510° C. and a deposition rate of 12.9 Å/minute. While the SEM is not capable of verifying the presence of islands shown in FIG. 9, the AFM has provided the verification as shown in FIG. 10. FIG. 11 shows an AFM photograph of a film deposited as an amorphous silicon film. The amorphous film is deposited at 570° C. FIG. 12 is a SEM photograph showing the silicon film in a polycrystalline state after thermal oxidation of this film.

Comparing FIGS. 10 and 11, the size of the islands decreases as the deposition temperature rises. Also comparing FIG. 4 and FIG. 12 which show the films of FIGS. 10 and 11, respectively, after thermal oxidation, the grain area (grain size) of the polycrystalline film after thermal oxidation diminishes because the islands of the as-deposited film becomes smaller with rising temperature. Thus, the size of the islands of the as-deposited film is strongly correlated with the size of the polycrystalline grains after thermal oxidation of the as-deposited film. When the as-deposited film has large islands, thermal oxidations of the deposited films produces a polycrystalline film of large grains.

All the silicon films of the thin-film semiconductor device shown as "O" in FIG. 3 are an amorphous film immediately after deposition by LPCVD. Further, for the films shown in FIG. 10, the size of the islands of the amorphous films is distributed between about 100 nm to 400 nm. The average island area of the as-deposited amorphous film is roughly the same or slightly smaller than the average grain area of the polycrystalline film after thermal oxidation but more than 10,000 $nm^2$ when the deposition temperature and deposition rate are optimized.

Figure 13:
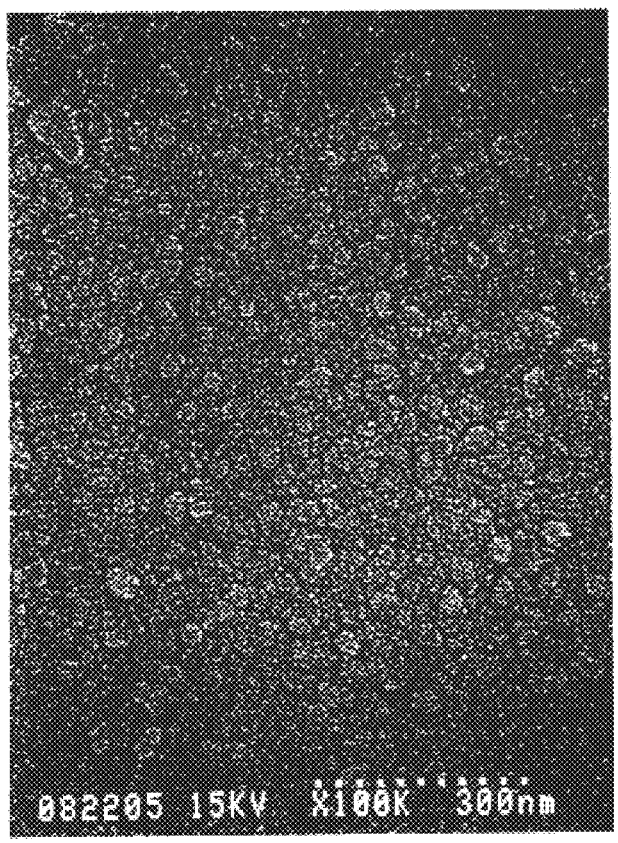
FIG. 13 is a scanning electron microscope (SEM) photograph of the crystal structure of a silicon film (before thermal oxidation, deposition temperature=600° C.) which is to be used in a thin film semiconductor device.

In contrast, the silicon films fabricated by conventional techniques are normally deposited at a temperature of higher than 580° C. These films are in a polycrystalline state immediately after they are deposited by LPCVD, and the size of the regions of these polycrystalline films is distributed between approximately 20 nm to 80 nm. The average area of the regions is no more than 10,000 $nm^2$. FIG. 13 is a SEM photograph of a silicon film deposited as a polycrystalline film at a deposition temperature of 600° C. before thermal oxidation. This film is an as-deposited polycrystalline silicon film. When a silicon film is deposited at 580° C. or less and at a deposition rate of less than 6 Å/minute, the as-deposited film is amorphous and the size of the regions of the amorphous film is between approximately 20 nm and 80 nm. If the sizes of the regions of the as-deposited semiconductor film are between more than 100 nm in size, then the average grain size of the resulting polycrystalline semiconductor film after thermal oxidation is increased to at least 10,000 $nm^2$ allowing high-performance thin-film semiconductor devices to be fabricated.

Although an intrinsic silicon film is used as an example above, the second embodiment sets forth a method for obtaining a large-grained polycrystalline semiconductor film first by controlling the semiconductor film deposition process to deposit a thin film having large regions and second by subjecting the film to thermal oxidation creating a high-performance thin-film semiconductor device. This method is effective for an impurity-doped silicon film and other semiconductor films such as a silicon germanium film, regardless of the presence of donors or acceptors. Similarly, the method is not limited to LPCVD deposition methods but the semiconductor film can be deposited by plasma-enhanced CVD or sputtering as well. As long as the average area of the islands of the semiconductor film immediately after the film formation is at least 10,000 nm, a large-grained polycrystalline film is obtained by thermal oxidation allowing high-performance thin-film semiconductor device to be fabricated.

B. Deposition Temperature and Deposition Rate

As described above, a semiconductor film is deposited under conditions such that the nucleus generation rate is retarded and the island growth rate is accelerated. The second embodiment controls the nucleus generation rate by controlling the temperature of the substrate surface or deposition temperature and controls the island growth rate by controlling the deposition rate. The nucleus generation rate is retarded by lowering the deposition temperature and the island growth rate is accelerated by increasing the deposition rate. The methods used to control the nucleus generation rate and the island growth rate are not limited to the above techniques. For example, the nucleus generation rate may be retarded by changing the material such as a special silicon dioxide film.

Page 24

When the deposition temperature is fixed, the deposition rate may be increased either by increasing the flow rate of the reactant gas, such as mono-silane or di-silane, or by increasing deposition pressure. Generally, the deposition rate is also related to the deposition temperature, such that the deposition rate increases as the deposition temperature rises. However, if the deposition temperature rises, the nucleus generation rate is accelerated. For the second embodiment, the deposition temperature is fixed low retarding the nucleus generation rate. Because the deposition rate is retarded by the low temperature, the flow rate of the reactant gas is increased or the deposition pressure is raised to increase the deposition rate.

In contrast, the conventional fabrication techniques set the deposition temperature to a customary range of 600° C. to 650° C. From FIG. 3, a good-quality semiconductor film with high carrier mobility cannot be obtained at this high deposition temperature even if the flow rate of reactant gas and deposition pressure are increased to accelerate the deposition rate. The high temperature accelerates the nucleus generation rate faster than the flow rate or pressure increases the island growth rate. Thus, the islands of the deposited film is too small.

The deposition rate is also related to factors such as the volume of the LPCVD apparatus and the total reactive area when substrates are inserted into the LPCVD chamber. For a specific reactant gas flow rate, the deposition rate is retarded as the reactive area is increased. The factors that determine the deposition rate are described in J. Appl. Phys. 74 (4), Aug. 15, 1993, pp. 2870–2885. When the deposition temperature is fixed, the deposition rate is a function of the concentration of the reactant gas in vapor phase. The deposition rate accelerates as this concentration increases. The concentration of the reactant gas is a function of the partial pressure and temperature of the reactant gas. The concentration increases as the partial pressure of the reactant gas increases and the concentration decreases as the temperature of the reactant gas increases.

The temperature of the reactant gas is determined by the pumping speed of the pump exhausting from the chamber and the flow rate of the reactant gas. The deposition pressure is also related to the functions of the pump and to factors such as the flow rate of the reactant gas. Thus, the deposition rate can be controlled by the flow rate of the reactant gas and the deposition pressure, if parameters such as the deposition temperature, volume of the LPCVD apparatus, and total reactive area are fixed.

The nucleus generation rate is a weak function of the flow rate of the reactant gas and the deposition pressure. However, nucleus generation rate is a strong function of the deposition temperature. Increasing the flow rate of the reactant gas and raising the deposition pressure have a stronger effect on accelerating the deposition rate than on accelerating the nucleus generation rate.

Page 25

The deposition rate generally corresponds the deposited film thickness divided by the deposition time. The deposition time is the sum of the time required for the nuclei to be generated and the time required for the islands to grow. The island growth rate is the deposited film thickness differentiated by the deposition time. Although the deposition rate appears related to the island growth rate, they are not equal. However, the time required for the nuclei to be generated is usually sufficiently less than the time taken to deposit a film of several hundreds of Å so that the deposition rate and the island growth rate are almost the same. In all of the experimental data shown in FIG. 3, the deposition time (T) and deposited film thickness (tsi) satisfy the following equation:

$$tsi = DR \times T,$$

which is a line passing through the origin.

Thus, the deposition rate DR coincides with the island growth rate dtsi/dT within experimental errors.

C. Optimizing the Deposition Temperature

Figure 14:
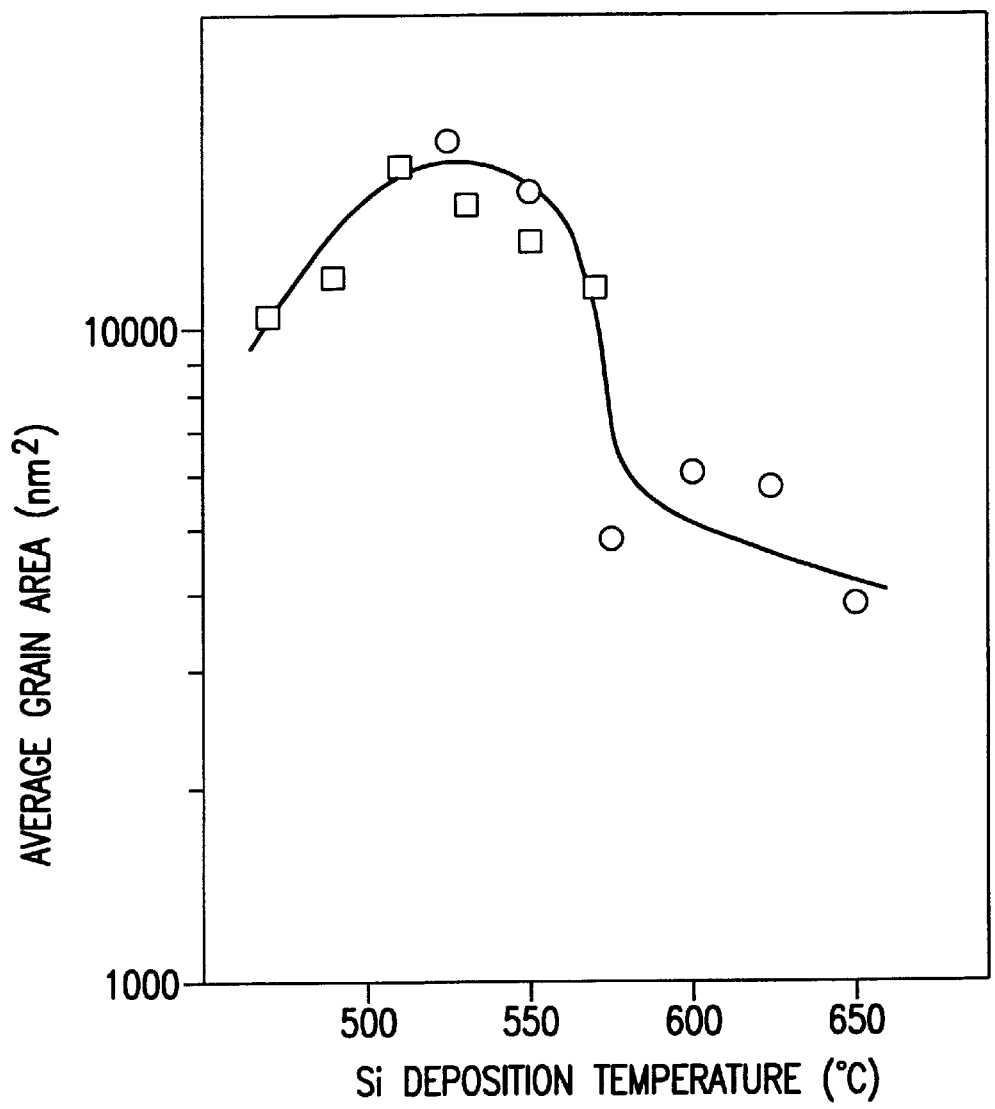
FIG. 14 is a characteristic diagram showing the relationship between deposition temperature and average grain area.
Figure 16:
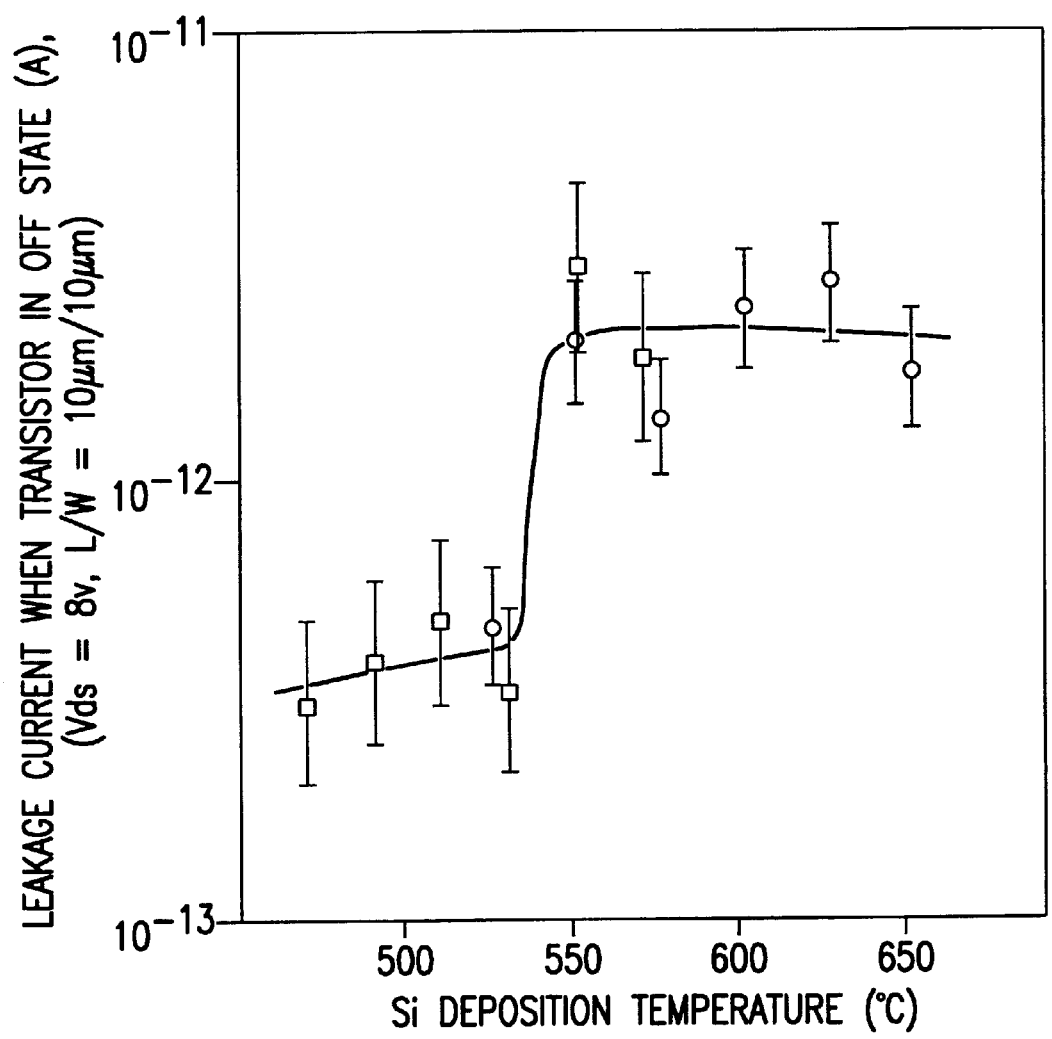
FIG. 16 is a characteristic diagram showing the relationship between deposition temperature and leakage current when the transistor is OFF.

Within the deposition temperature range of 580° C. or less, there are special temperatures that act as critical points. FIG. 14 is a characteristic diagram showing the relationship between deposition temperature and average grain area after thermal oxidation. The points indicated by squares are the average values calculated from the data listed in FIGS. 15 and 6A. A deposition temperature of 580° C. is a first boundary below which the average grain area becomes extremely large. However, the maximum value of the average grain area is obtained by setting this temperature below a second boundary, which is preferably 550° C. or less. Similarly, FIG. 16 is a characteristic diagram showing the relationship between deposition temperature and leakage current when the transistor is OFF. The leakage current when the transistor is OFF is dramatically reduced at a deposition temperature of 530° C. or less.

In general, the leakage current when the transistor is OFF will be large, if the active layer of the transistor consists of the crystals containing many defects. Thus, the characteristic diagram shown in FIG. 16 indicates that, when a semiconductor film is deposited at a temperature of 530° C. or less and then subjected to thermal oxidation, the grain area become greater and the defects within the crystals decrease.

A lower limit to the deposition temperature is determined by the type of reactant gas. If the reactant gas is mono-silane, the lower temperature limit is 460° C. and if the reactant gas is di-silane, the lower temperature limit is 370° C.

FIG. 14 shows the relationship between average grain area and deposition temperature for mono-silane. If the deposition temperature is less than 500° C., the grain area begins to decrease. This grain area decrease does not occur with di-silane or other reactant gases because it is difficult to keep the deposition rate high for mono-silane when the deposition temperatures is less than 500° C. However, this is not the case for di-silane.

Page 26

D. Roughness of Semiconductor Film and Gate Insulation film Surfaces

In general, when an oxide film is formed by a thermal oxidation method, the finished thermal oxide film inherits the surface configuration of the original pre-oxidation semiconductor film. Since a gate electrode is formed over such an oxide film in a MOS field-effect transistor (FET), the surface configuration of the deposited semiconductor film, immediately after deposition by a method such as LPCVD, is reflected in the surface configuration of the boundary between the gate insulation film and the gate electrode. If the as-deposited semiconductor film is smooth, the boundary surface between the gate insulation film and the gate electrode will also be smooth. If the as-deposited semiconductor film surface is rough, the boundary surface between the gate insulation film and the gate electrode will also be rough.

The roughness of the boundary surface between the gate insulation film and the gate electrode affects the breakdown voltage between the source and the gate or between the drain and the gate after the thin-film semiconductor device is fabricated. If the boundary surface is rough, an electric field easily focuses on the peak of the gate electrode, forming extremely high electric fields on the peak, which can easily cause avalanche breakdown between the source and the gate or the drain and the gate.

Since the as-deposited semiconductor film surfaces of the thin-film semiconductor devices of this embodiment are extremely smooth, the gate insulation film surface after thermal oxidation is also smooth. The center line average height (Ra) is 1.995 nm with the interval estimation value of 0.323 nm at the 95% confidence level.

In contrast, the as-deposited semiconductor film surfaces of the thin-film semiconductor devices fabricated using conventional fabrication techniques are rough regardless of the deposition temperature. The gate insulation film surfaces after thermal oxidation fabricated using the conventional fabrication techniques has a center line average height (Ra) of 3.126 nm with the interval estimation value of 0.784 nm at the 95% confidence level.

The as-deposited semiconductor films of this embodiment have smooth surfaces because the island regions of the as-deposited films in the amorphous state are large. The definition of "center line average height" is the value that the total area of sections obtained by reflecting the roughness curve by the center line, divided by the measured length.

The breakdown voltage between the source and the gate are measured for the six thin-film semiconductor device groups fabricated in accordance with the invention. Each of the six device groups has three devices, thus, eighteen devices are measured. The source of each sample is electrically grounded and a negative voltage is applied to the gate. All eighteen samples have breakdown voltages of more than 100 V which is equivalent to a breakdown electric field of more than 8.333 Mv/cm.

In contrast, 33 thin-film semiconductor devices fabricated by conventional techniques are also similarly measured. Twenty-eight of the thirty-three thin-film semiconductor devices have breakdown voltages of 100 V or more, while five devices have lower breakdown voltages. One device formed at a deposition temperature of 585° C. and with carrier mobility of 15 $cm^2$/V.s experienced avalanche breakdown at 65 V. See FIG. 17.

When a thin-film semiconductor device is used in a liquid crystal panel, the maximum applied voltage between the source and the gate is approximately 20 V. However, one panel contains several million devices. Since avalanche breakdown between the source and the gate is a stochastic process, the thin-film semiconductor device fabricated by the methods of the invention is less susceptible to pixel defects due to short-circuiting between the source and the gate than devices fabricated by conventional methods.

Page 27

Third Embodiment

The third embodiment deposits semiconductor films using at least 99.99% pure di-silane ($Si_2H_6$) as a reactant gas and using the LPCVD apparatus of the first embodiment. The deposition temperature is 450° C. and di-silane is introduced at 100 sccm into the reaction furnace. At least 99.9995% pure helium is used as a dilution gas introduced at 100 sccm into the reaction chamber. During the silicon film deposition, the pressure is 0.3 Torr and the deposition rate is 19.97 Å/minute. The deposited silicon films are in an amorphous state having a film thickness of 1000 Å. The islands of each amorphous film have a size distribution of approximately 150 nm to 450 nm. After patterning, the amorphous films are thermally oxidized at 1160° C. in a 100% oxygen environment at one atmospheric pressure for 23 minutes and 36 seconds.

The surface roughness of the gate insulation film after thermal oxidation is 1.84 nm in center line average height (Ra). The average area and standard deviation of the area of the grains of the polycrystalline silicon films are 14,110 $nm^2$ and 15,595 $nm^2$, respectively.

The transistor characteristics of the thin-film semiconductor devices fabricated and measured under condition similar to that described under the first embodiment are excellent. The transistors have high ON-currents of 53.5 $\mu$A and low OFF-currents of 0.154 pA. The carrier mobility is 78.5 $cm^2$/V.s even when no hydrogenation is performed. The breakdown voltage between the source and the gate is at least 100 V for all the devices. If these thin-film semiconductor devices are further subjected to a hydrogen plasma for two hours, then the ON-current is improved to 77.7 $\mu$A, the OFF-current is improved to 0.137 pA and the carrier mobility is improved to 107 $cm^2$/V.s.

The third embodiment deposits a semiconductor film at 580° C. or less with a deposition rate of 6 Å/minute or more. Then, the semiconductor film is subjected to thermal oxidation. The average grain area of the resultant polycrystalline silicon film is at least 10,000 $nm^2$, the boundary surface between the gate insulation film and the gate electrode is smooth, and a high-performance thin-film semiconductor device is fabricated, without using mono-silane as the reactant gas.

Although, di-silane is used as the reactant gas any reactant gas that suppresses nucleus generation rate by permitting the deposition temperature to be 580° C. or less and accelerates the island growth rate by allowing a deposition rate of 6 Å/minute or more is effective. Reactant gases such as tri-silane ($Si_3H_6$), a fluoro-silane ($Si_nH_xF_y$: where n, x, and y are integers), or a chloro-silane ($Si_nH_xCl_y$: where n, x, and y are integers) are examples.

Page 28

Fourth Embodiment

The fourth embodiment deposits 1000 Å film thickness of intrinsic silicon films by LPCVD on quartz substrates. The deposition conditions are the same as those of the first embodiment having the deposition temperature at 510° C., the reactant gas of at least 99.99% pure mono-silane and the reactant gas flow rate of 100 sccm. The deposition pressure is 0.8 Torr and a silicon film is formed on each substrate under these conditions at a deposition rate of 21.5 Å/minute. The silicon films are patterned. Thus a silicon dioxide film forming a gate insulation layer is formed by thermal oxidation on the silicon film surface.

During this final process, the thermal oxidation temperature is varied as follows: 1160° C., 1100° C., 1050° C., 1000° C., 950° C., and 900° C. The thermal oxidation furnace is initially held at 800° C. with an 100% oxygen environment at one atmospheric pressure. After substrates are inserted in the thermal oxidation furnace in this state, the temperature is increased to the desired oxidation temperature at a heating rate of 10° C./minute. After the oxidation temperature has been reached, that state is maintained for the time appropriate to that particular temperature, as the thermal oxidation proceeds. At 1160° C., the oxidation time is 23 minutes and 36 seconds; at 1100° C., the oxidation time is 51 minutes and 59 seconds; at 1050° C., the oxidation time is one hour, 38 minutes and 33 seconds; at 1000° C., the oxidation time is 3 hours, 17 minutes and 15 seconds; at 950° C., the oxidation time is 6 hours, 49 minutes and 40 seconds; and at 900° C., the oxidation time is 14 hours, 48 minutes and 23 seconds. After this thermal oxidation is completed, the oxygen atmosphere is replaced by a nitrogen atmosphere in the reaction furnace. The substrates remain in the nitrogen environment at the thermal oxidation temperature for 15 minutes; then the substrates are removed.

The thickness of the thermal oxidation film obtained by this process is 1200 Å for all of the thermal oxidation temperatures and the thickness of the polycrystalline silicon film acting as the active layer of the thin-film semiconductor device is 400 Å. The thin-film semiconductor devices are completed by exactly the same fabrication process as that of the first embodiment, except that final hydrogenation is not performed.

Figure 18:
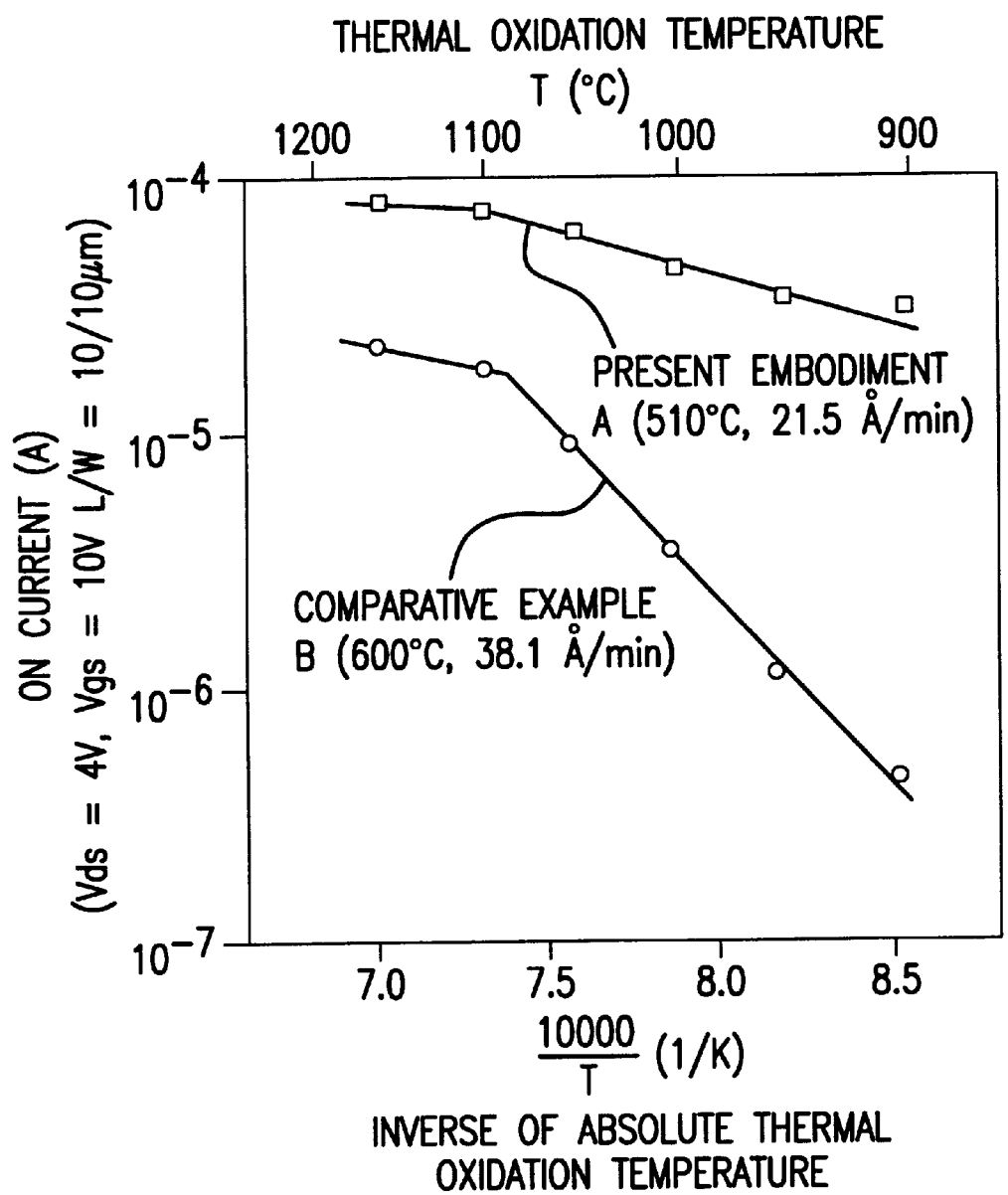
FIG. 18 is a characteristic diagram showing the relationship between thermal oxidation temperature and ON current.

The transistor characteristics of the thin-film semiconductor devices produced by the fourth embodiment are shown by A in FIG. 18. FIG. 18 is a graph of the ON current along the Y-axis, thermal oxidation temperature along the upper X-axis and the inverse of the absolute thermal oxidation temperature along the lower X-axis. In FIG. 18, the transistor characteristics deteriorate as the thermal oxidation temperature is reduced. This deterioration is comparatively small for the thin-film semiconductor devices formed by the invention.

B in FIG. 18 shows the dependency on thermal oxidation temperature of the transistor characteristics of thin-film semiconductor devices formed as comparative-examples. Each of the comparative-example thin-film semiconductor devices is formed by the above described fabrication method after the silicon film for the active layer is deposited with a deposition temperature of 600° C., a mono-silane flow rate of 100 sccm, a deposition pressure of 40 m Torr, and a deposition rate of 38.1 Å/minute. FIG. 18 shows that the characteristic of the thin-film semiconductor devices of the comparative-examples deteriorates dramatically as the thermal oxidation temperature is reduced.

In contrast, the thin-film semiconductor devices of the invention have superior characteristics. Devices thermally oxidized at a temperature of 900° C. have better characteristics than the thin-film semiconductor device obtained as comparative-examples thermally oxidized at a temperature of 1160° C. The surface roughness of the comparative-example MOS boundary surface, which is the surface between the semiconductor layer and gate insulation layer, deteriorates when the thermal oxidation temperature is approximately 1100° C. or less, and the degree of this surface roughness becomes even worse as the thermal oxidation temperature is reduced. In contrast, with the thin-film semiconductor devices of this embodiment, the MOS boundary surface is extremely stable so that the roughness of the MOS boundary surface does not greatly deteriorate even if the thermal oxidation temperature is reduced.

Page 29

Figure 19:
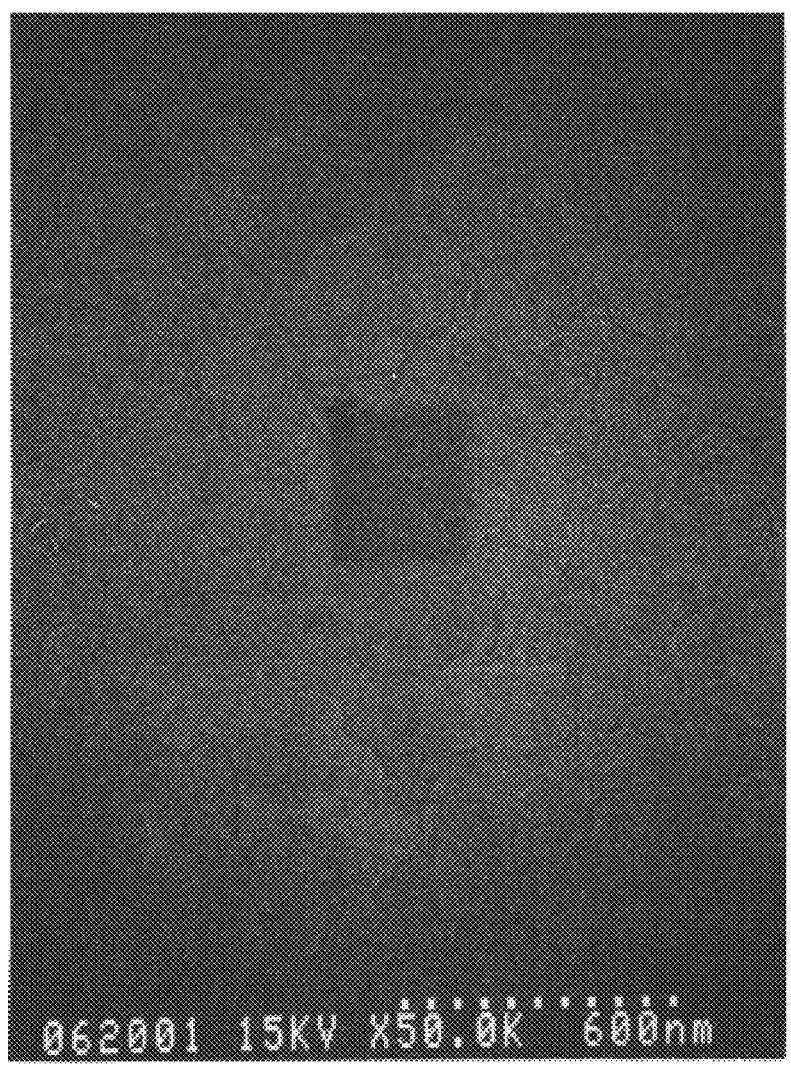
FIG. 19 is a scanning electron microscope (SEM) photograph of the state of a MOS boundary surface of the thin-film semiconductor device of the invention, when the thermal oxidation temperature is 1160° C.
Figure 20:
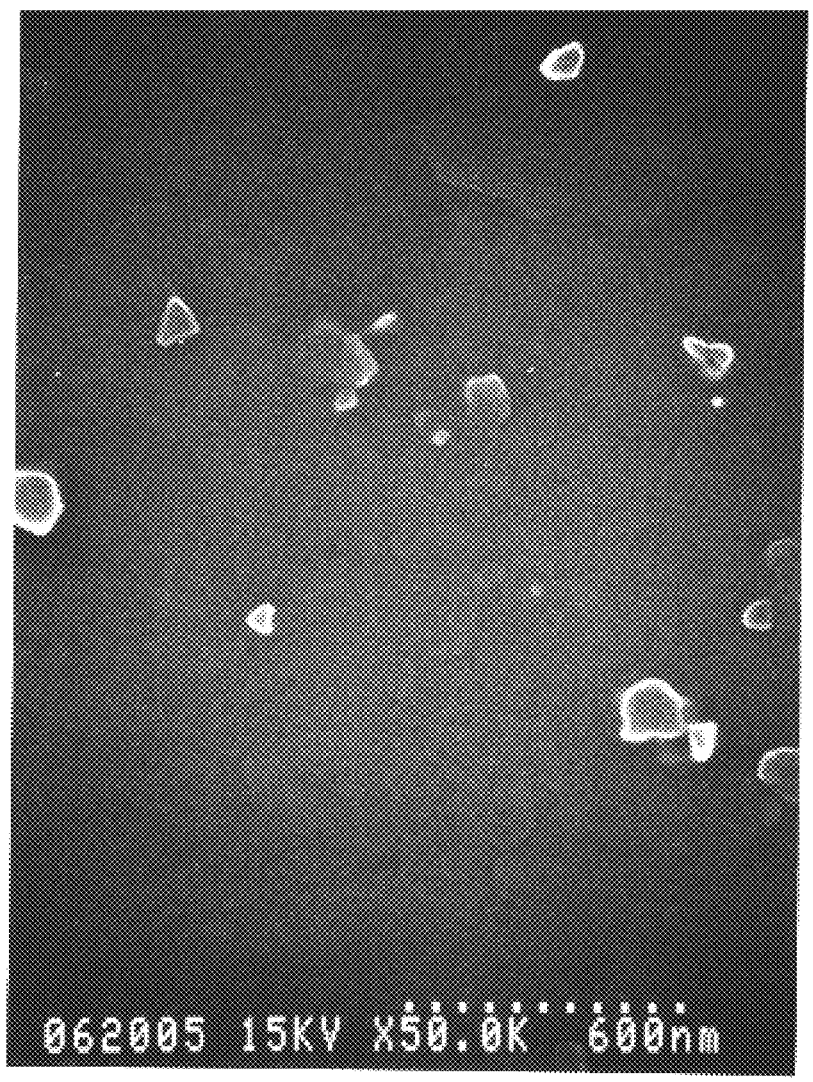
FIG. 20 is a scanning electron microscope (SEM) photograph of the state of a MOS boundary surface of the thin-film semiconductor device of the invention, when the thermal oxidation temperature is 1050° C.
Figure 21:
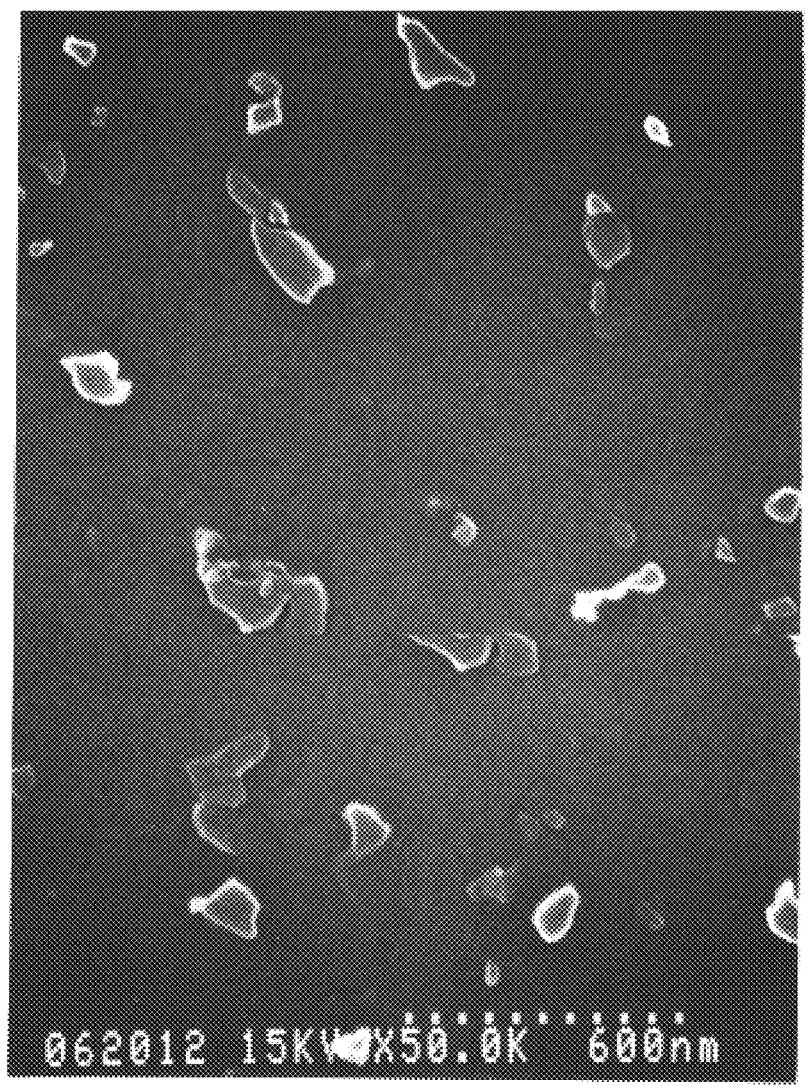
FIG. 21 is a scanning electron microscope (SEM) photograph of the state of a MOS boundary surface of the thin-film semiconductor device of the invention when the thermal oxidation temperature is 900° C.
Figure 22:
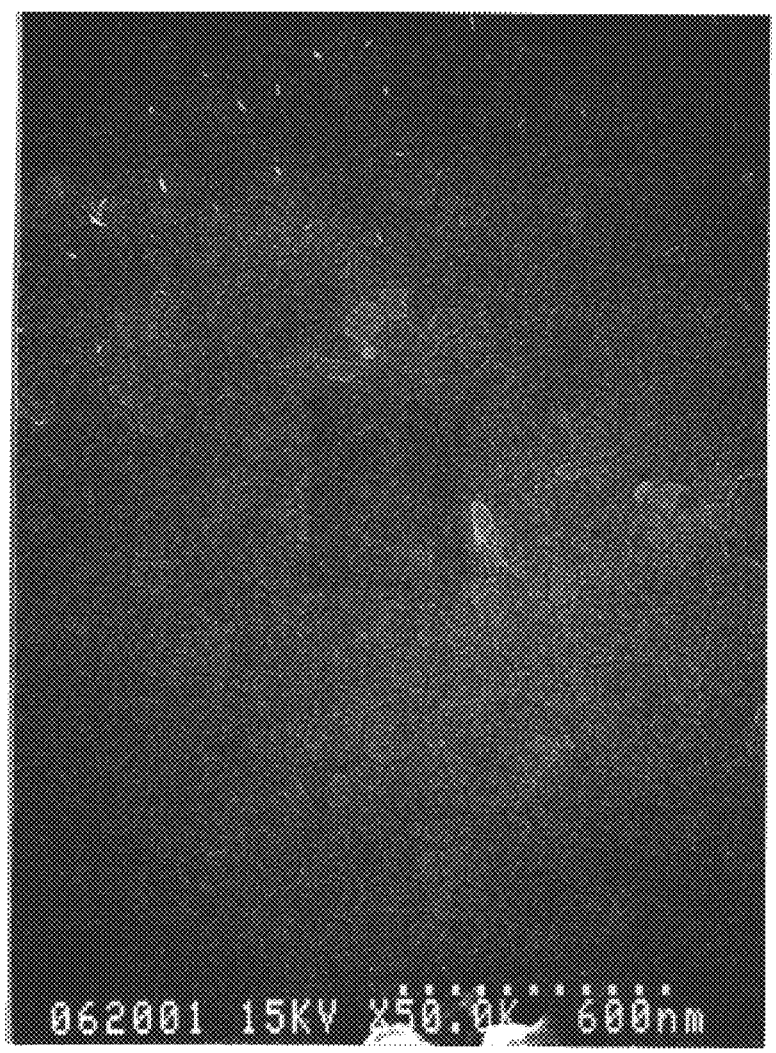
FIG. 22 is a scanning electron microscope (SEM) photograph of the state of a MOS boundary surface of a thin-film semiconductor device acting as a comparative example, when the thermal oxidation temperature is 1160° C.
Figure 23:
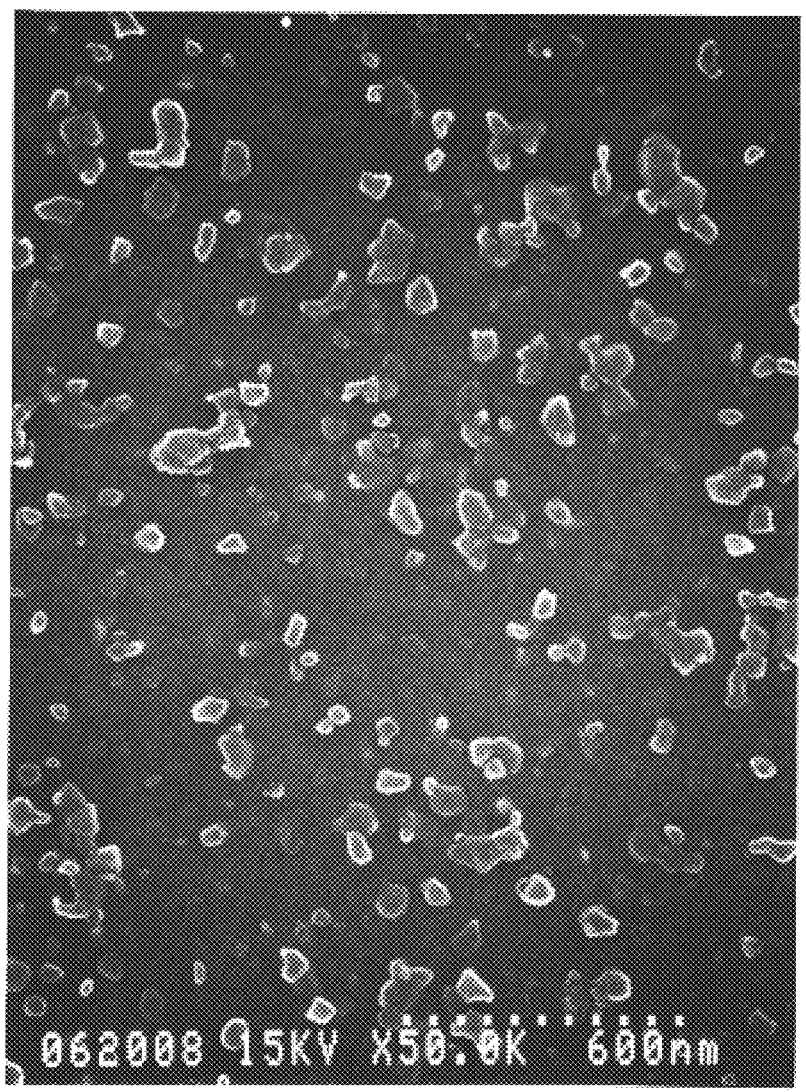
FIG. 23 is a scanning electron microscope (SEM) photograph of the state of a MOS boundary surface of a thin-film semiconductor device acting as a comparative example, when the thermal oxidation temperature is 1050° C.
Figure 24:
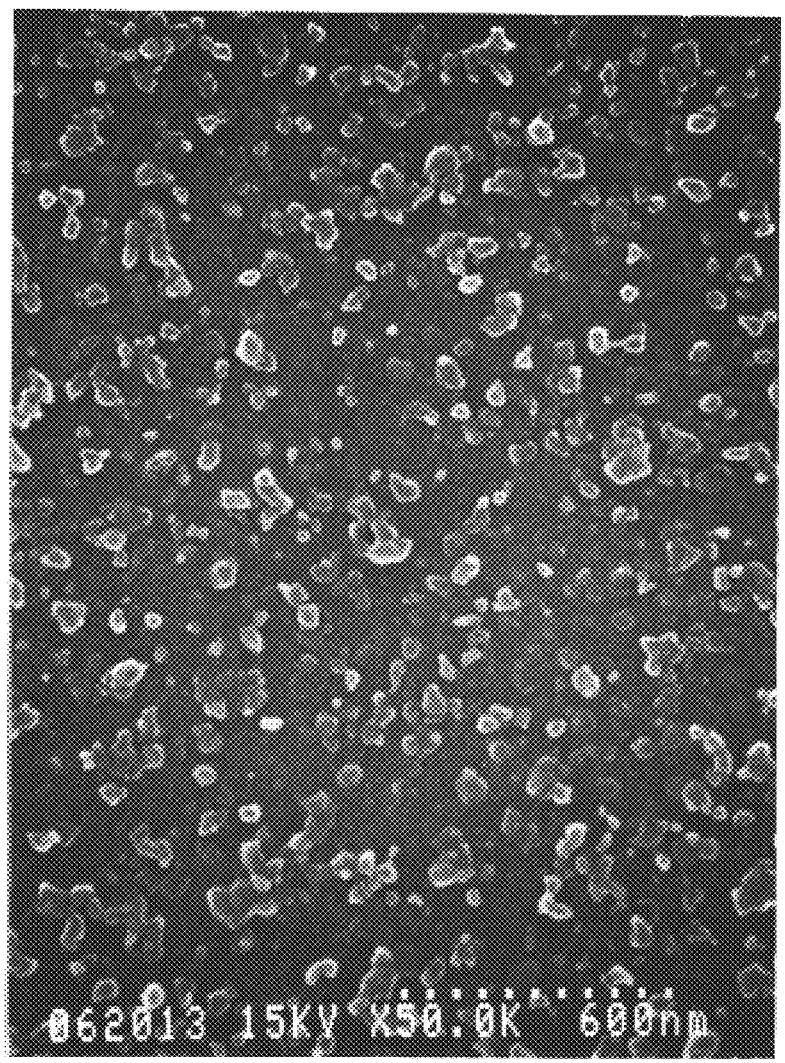
FIG. 24 is a scanning electron microscope (SEM) photograph of the state of a MOS boundary surface of a thin-film semiconductor device acting as a comparative example, when the thermal oxidation temperature is 900° C.

FIGS. 19, 20, and 21 are scanning electron microscope (SEM) photographs showing the state of a MOS boundary surface of the thin-film semiconductor device of this embodiment when the thermal oxidation temperature is 1160° C., 1050° C., and 900° C., respectively. Similarly, FIGS. 22, 23, and 24 are SEM photographs showing the state of a MOS boundary surface of the thin-film semiconductor device of the comparative-example, when the thermal oxidation temperature is 1160° C., 1050° C., and 900° C., respectively.

These photographs show that the MOS boundary surface fabricated by the method of this embodiment is less rough than the MOS boundary surface of the comparative-example. This is true even when the thermal oxidation temperature is reduced. FIGS. 19 and 22 show the roughness when the thermal oxidation temperature is 1160° C. Both MOS boundary surfaces are smooth and the surface states are nearly the same. FIGS. 20 and 23 show the roughness when the thermal oxidation temperature is 1050° C. At 1050° C., there is a significant difference between the roughness of the MOS boundary surfaces of the semiconductor devices fabricated by the methods of this embodiment and that of the comparative-example. This difference becomes even more dramatic for a thermal oxidation temperature of 900° C., as shown by FIGS. 21 and 24.

Reducing the thermal oxidation temperature reduces deformation such as expansion, contraction, or warping of the substrate. A reduction in deformation better enables the fabrication of high-density, highly integrated devices. A lower temperature is also preferable from the viewpoints of apparatus lifetime and maintenance. Thus, there are many advantages to be obtained by lowering the temperature permitted by the methods of the invention. In contrast, reducing the oxidation temperature degraded the transistor characteristics of the devices in the comparative-examples fabricated using conventional techniques, as shown in FIG. 18B.

Fifth Embodiment

Recently, liquid crystal displays (LCDs) screens are becoming larger and their resolutions are increasing. The method used to drive the LCDs has changed from a simple matrix method to an active matrix method. LCDs also are becoming more capable of displaying large quantities of information. The active matrix method permits fabrication of an LCD having several hundreds of thousands of pixels including a switching transistor formed for each pixel.

A transparent insulating substrate such as fused quartz plate or glass is used as the substrate for various types of LCD device, because it enables a transparent display. A semiconductor film such as amorphous silicon or polycrystalline silicon is generally used as the active layer of each thin-film transistor (TFT). Polycrystalline silicon is preferred over amorphous silicon for integrating a driver circuit with the TFTs because the polycrystalline silicon permits higher device speeds than amorphous silicon. If the active layer is a polycrystalline silicon film, the TFT is fabricated on a fused quartz plate substrate by a high-temperature process where the maximum processing temperature usually exceeds 1000° C.

In contrast, the active layer is an amorphous silicon film, ordinary glass substrate is used together with a lower temperature process. Further, ordinary glass substrates allows increase in the size of the LCD screen without a large increase in price since ordinary glass is an inexpensive insulating substrate compared to fused quartz.

However, an amorphous silicon film has inherent problems such as poor electrical characteristics compared to the polycrystalline silicon film and slower device operating speeds. Thus, there is a need for a semiconductor film such as a polycrystalline silicon film that is formed on an ordinary glass substrate to obtain high device speed at low cost. Using large ordinary glass substrates limits the maximum processing temperature to less than approximately 600° C. to avoid deformation of the substrate. Thus, techniques are required for forming a high quality active layer of thin-film transistors, which function as switching elements for high speed driver circuits of an LCD. These techniques are called low-temperature poly-Si (polysilicon) TFT process.

Page 30

A low-temperature poly-Si TFT process is described by "The Society for Information Display" (SID) '93 Digest (1993): p. 387. According to this article, a 50-nm amorphous silicon (a-Si) film is first deposited by LPCVD at a deposition temperature of 550° C., using mono-silane ($SiH_4$) as the reactant gas. Then, the a-Si film is subjected to laser irradiation to convert the a-Si film into a poly-Si film. After the poly-Si film is patterned, an $SiO_2$ film is deposited as a gate insulation film by electron cyclotron resonance chemical vapor deposition (ECR-PECVD) at a substrate temperature of 100° C. A gate electrode is then formed of tantalum (Ta) on the gate insulation film. The gate electrode is used as a mask for the ion implantation of a donor or acceptor impurity into the silicon film to form the source and drain of the transistor in a self-aligned manner. A non-mass-separated type of implantation apparatus is used for this ion implantation, with phosphine ($PH_3$) or diborane ($B_2H_6$) diluted with hydrogen as the reactant gas. The implantation ions are activated at 300° C. An interlayer insulation film is then deposited. Electrodes and wiring of indium tin oxide (ITO) or aluminum (Al) are formed to complete the thin-film semiconductor device.

The fifth embodiment of the invention solves these problems and enables a practicable and simple method of fabricating low cost and high speed thin-film semiconductor devices at low processing temperatures using ordinary large glass substrates.

Page 31

A process of fabricating a thin-film semiconductor device that can form an MIS type of field-effect transistor is shown in FIGS. 25A to 25D. A 235 mm□ (235 mm×235 mm) plate of non-alkaline glass (OA-2, produced by Nippon Electric Glass Co., Ltd.) is used as a substrate 101. It is appreciated that any type and size of the substrate can be used as long as the substrate can withstand the maximum processing temperature.

A silicon dioxide film ($SiO_2$ film) 102 acting as an underlying protective film is first formed by ordinary atmospheric-pressure chemical vapor deposition (APCVD), PECVD, or sputtering on the substrate 101. The $SiO_2$ film can be deposited by APCVD with a substrate temperature of 250° C. to approximately 450° C. using mono-silane ($SiH_4$) and oxygen as the reactant gas. PECVD or sputtering can deposit the $SiO_2$ film at a substrate temperature between room temperature to 400° C. In the fifth embodiment, a 2000 Å $SiO_2$ film is deposited by APCVD at a temperature of 300° C. using $SiH_4$ and $O_2$ as the reactant gas.

Next, an intrinsic silicon film that acts as an active layer of the thin-film semiconductor device is deposited to a thickness of approximately 500 Å. This intrinsic silicon film is deposited by an infralow-pressure CVD (ILPCVD) apparatus with a flow of 200 sccm of mono-silane ($SiH_4$) as the reactant gas and a deposition temperature of 495° C. for 31 minutes. The ILPCVD apparatus has a volume of 184.5 L. Seventeen substrates are inserted face-downward in the reaction chamber held at 300° C. After the substrates are inserted, a turbo-molecular pump is turned ON. After the pump reaches to stable rotation state, a leakage test is performed for 2 minutes.

During this time, the leakage rate, which is mainly due to the desorption of gases, is $3.3 \times 10^{-5}$ Torr/minute. The temperature is then raised from the insertion temperature of 300° C. to the deposition temperature of 495° C. in a one hour period. During the initial 10 minutes of the temperature rise, absolutely no gas is introduced into the reaction chamber raising the temperature in a vacuum state. Ten minutes after the start of the temperature rise, the background pressure of the reaction chamber is $5.4 \times 10^{-7}$ Torr. During the remaining 50 minutes of the temperature rise, a 300-sccm flow of at least 99.9999% pure nitrogen gas is introduced resulting in the reaction chamber equilibrium pressure of $3.0 \times 10^{-3}$ Torr. After reaching the deposition temperature, a 200-sccm flow of $SiH_4$ as reactant gas is introduced for 31 minutes and 00 seconds depositing a silicon film. The pressure in the reaction chamber is held at 1.3 Torr by a pressure controller.

The deposited silicon film has a thickness of 514 Å, thus, the deposition rate is 16.6 Å/minute. Since the deposition temperature is 495° C. and the deposition rate is 16.6 Å/minute, both the deposition temperature and the deposition rate are within the respective ranges of 580° C. or less and 6 Å/minute or more as shown in FIG. 3. Therefore, the fifth embodiment forms a semiconductor film with the excellent characteristics set forth above.

The deposited silicon film is a high-purity a-Si film. This a-Si film is then subjected to irradiation with optical or electromagnetic-wave energy for a short time to crystallize the a-Si to convert the a-Si into polycrystalline silicon (poly-Si).

In the fifth embodiment, a xenon chloride (XeCl) excimer laser generating a square beam (wavelength of 308 nm) is used. The full width at half maximum value of the laser pulses is 45 ns. Since the irradiation time is so short, the substrate is not heated during the crystallization of the a-Si to poly-Si preventing deformation of the substrate. The laser irradiation is performed with the substrate at room temperature (25° C.) in an air atmosphere.

The laser beam scans the substrate. The area irradiated by a single laser irradiation is an 8 mm□ square-shaped area, and each successive irradiation is shifted by 4 mm. After first scanning a complete line in the horizontal direction (Y direction), the irradiation is then shifted by 4 mm in the vertical direction (X direction). The laser beam scans a second line in the horizontal direction at the 4 mm intervals. This scanning is repeated until the entire surface of the substrate has been subjected to this first laser irradiation. The first laser irradiation energy density is 160 mJ/cm$^{-2}$.

Page 32

After the first laser irradiation is completed, the entire surface is subjected to a second laser irradiation at an energy density of 275 mJ/cm$^2$. The scanning method is the same as the first laser irradiation. The entire substrate is crystallized uniformly from a-Si into poly-Si by this two-stage laser irradiation.

Figure 25A:
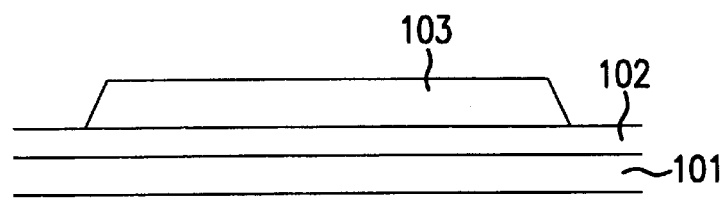
FIGS. 25A to 25D show the process of fabricating a thin-film semiconductor device of the invention.
Figure 25B:
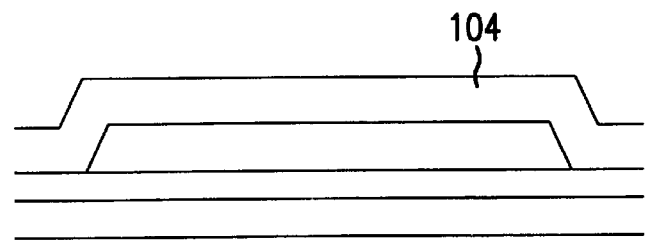
Figure 25C:
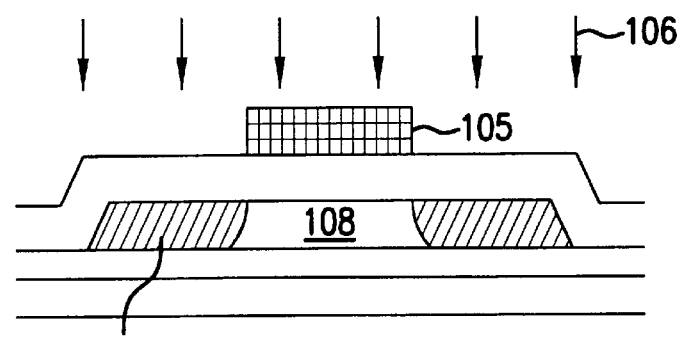
Figure 25D:
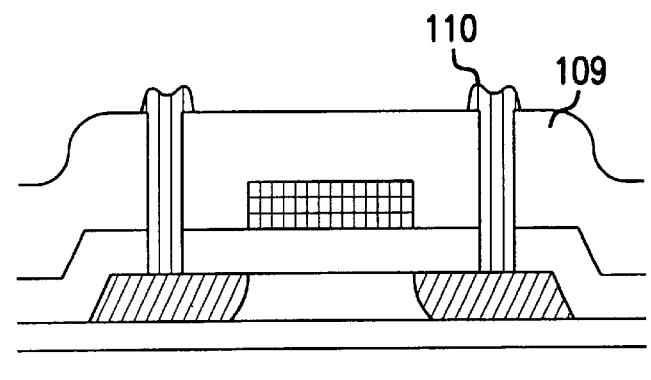

Although the XeCl excimer laser is used for irradiating the optical or electromagnetic-wave energy, any suitable energy source can be used provided the irradiated time is within a few tens of seconds. For example, the irradiation can be from an ArF excimer laser, an XeF excimer laser, a KrF excimer laser, a YAG laser, a carbon dioxide gas laser, an Ar laser, a dye laser, or from a lamp such as an arc lamp or tungsten lamp. If the irradiation is performed by an arc lamp, converting the film from a-Si to poly-Si can be achieved by a lamp output of at least approximately 1 kW/cm$^{-2}$ with an irradiation time of approximately 45 seconds. Since the energy irradiation time is so short, the substrate is not deformed or cracked due to heat. The poly-Si film is then patterned to form a channel-portion semiconductor film 103 as the active layer of the transistor (FIG. 25A).

Energy irradiation can be replaced by furnace annealing at a temperature of approximately 600° C. or less for converting a-Si into poly-Si. This method is called the solid-phase crystallization which requires between about 8 hours to 24 hours to complete if the temperature is approximately 600° C. Solid-phase crystallization can also be used to fabricate a thin-film semiconductor device in a combined solid-phase/low-temperature process.

After the poly-Si film is formed, a gate insulation film 104 is formed by ECR-PECVD or PECVD. A $SiO_2$ film is deposited to a thickness of 1200 Å by PECVD forming the gate insulating film. See FIG. 25B. Mono-silane ($SiH_4$) and "laughing gas" ($N_2O$) are used as the reactant gas for the PECVD with the substrate temperature at 300° C. A plasma is formed using rf waves at 13.56 MHz at an output of 900 W, and the pressure is at 1.50 Torr. The flow rate of the $SiH_4$ is 250 sccm and that of the $N_2O$ is 7000 sccm. The deposition rate of the $SiO_2$ film is 48.3 Å/s. Immediately before and after the $SiO_2$ is formed, the silicon film and the $SiO_2$ film are exposed to an oxygen plasma to improve the MOS boundary surface and the $SiO_2$ film.

Mono-silane and laughing gas are used as the reactant gases for the fifth embodiment, but the invention is not limited to these reactant gases. An organic silane such as TEOS (Si—(O—CH$_2$—CH$_3$)$_4$) or an oxidizing gas such as oxygen can be used. Similarly, an PECVD apparatus is utilized, but the insulation film can be formed by an ECR-PECVD apparatus.

Regardless of the CVD apparatus and the reactant gas used, the temperature at which the insulation film is formed is preferably 350° C. or less. This condition prevents thermal deterioration of the MOS boundary surface and gate insulation film. The temperature of all processing steps after the formation of the gate insulation film must be held to 350° C. or less. This ensures that a high-performance thin-film semiconductor device can be fabricated easily and stably.

Page 33

A thin film for a gate electrode 105 is next deposited by sputtering, vapor deposition, or CVD. In the fifth embodiment, tantalum (Ta) is selected as the gate electrode material, and it is deposited by sputtering to thickness of 5000 Å. The substrate temperature during the sputtering is 180° C. and the sputtering gas argon (Ar) containing 6.7% of nitrogen (N2). The content of nitrogen in the argon is optimally between 5.0% and 8.5%. The crystal structure of the tantalum film is mainly the α-structure and has a resistivity of 40 μΩcm. Therefore, the sheet resistance of the gate electrode in is 0.8Ω/□.

Post-deposition patterning is performed on the thin film to form the gate electrode 105. Then, an element such as phosphorus is ion implated 106 into the intrinsic silicon film, using a bucket type of mass non- mass-separated ion implantation apparatus (ion doping), to form source and drain portions 107 and a channel region 108. See FIG. 25C. Since the fifth embodiment produces an n-channel TFT, 5% phosphine (PH$_3$) diluted with hydrogen is used as the reactant gas. The implantation is at a dose concentration of $5 \times 10^{15}$ cm$^{-2}$ with a high-frequency output power of 38 W and an acceleration voltage of 80 kV. The phosphorus concentration in the silicon film is approximately $5 \times 10^{20}$ cm$^{-3}$. The optimum value of the high-frequency output power is approximately between 20 W and 150 W.

A p-channel TFT is formed by using 5% diborane ($B_2H_6$) diluted with hydrogen as the reactant gas and implanting at a dose concentration of approximately $5 \times 10^{15}$ cm$^{-2}$ with a high-frequency output power of 20 W to 150 W and an acceleration voltage of 60 kV. A CMOS TFT is formed by using a suitable masking material such as a polyimide resin by alternately covering one of the p-channel or n-channel TFTs at a time, while the appropriate ion implantation is performed.

An interlayer insulation film 109 is then deposited to a thickness of 5000 Å. In the fifth embodiment, $SiO_2$ is formed by the PECVD as the interlayer insulation film. The reactant gas used in the PECVD is TEOS (Si—(O—$CH_2$—$CH_3$)$_4$) and oxygen ($O_2$). The film is formed at a substrate temperature of 300° C. The plasma is formed by a 13.56 MHz rf waves having an output power of 800 W and a vacuum of 8.0 Torr. The flow rate of the TEOS is 200 sccm and that of the $O_2$ is 8000 sccm. The formation rate of the $SiO_2$ film is 120 Å/s.

After this ion implantation and interlayer insulation film formation, the substrate is annealed for one hour at 300° C. in an oxygen environment to activate the implanted ions and anneal the interlayer insulation film. The annealing temperature is preferably 300° C. to 350° C. Contact holes are then opened and source/drain extraction electrodes 110 are formed by sputtering to complete the thin-film semiconductor device. See FIG. 25 D. Indium tin oxide (ITO) or aluminum (Al) is used as the source/drain extraction electrodes. The substrate temperature is between about 100° and 250° C. while these conductors are formed by sputtering.

Page 34

The transistor characteristics of the thin-film semiconductor device formed by the above process are as follows: when the transistor is ON, the source-drain voltage Vds is 4 V and the gate voltage Vgs is 10 V, the source-drain ON current ION is between $(20.6+1.67) \times 10^{-6}$ A and $(20.6-1.48) \times 10^{-6}$ A with 95% confidence level.

Similarly, when the transistor is OFF, the source/drain voltage Vds is 4 V and the gate voltage Vgs is 0 V, the OFF current IOFF is between $(2.27+0.40) \times 10^{-12}$ A and $(2.27-0.32) \times 10^{-12}$ A. These measurements are performed at a temperature of 25° C., on a transistor a length L=10 μm and a width W=10 μm of the channel portion. The effective electron carrier mobility obtained from a saturation region of channel current is μ=47.54±3.53 cm/V.s. See J. Levinson et al., J. Appl. Phys. 53, 1982: p. 1193.

Thus the invention fabricates an excellent uniform thin-film semiconductor device having high carrier mobility. The source/drain current, Ids, has a $10^7$ response for a 10-V change in the gate voltage. This source/drain current response is consistently produced by the low-temperature process where the maximum processing temperature is set to 600° C. or less.

Moreover, the invention can use inexpensive glass substrates because the processing temperature decreases with successive processing steps so that the maximum temperature occurs at the beginning of the process. This temperature progression minimizes alignment defects caused by the thermal processes. Since the initial a-Si film of the embodiment is made up of large regions, the size of the crystal grains after the crystallization is also large, thus providing high-performance electrical characteristics. An excellent a-Si film is obtained by optimizing the deposition conditions under which the initial a-Si film is formed resulting in an uniform high-quality poly-Si film.

Conventional fabrication techniques produce a-Si films using the LPCVD at a deposition temperature of approximately 550° C. or more without consideration of the deposition rate. The substrate temperature set to approximately 400° C. for PECVD without any consideration of the quality of the initial a-Si film. Therefore, non-uniformity and lack of stable production result. Additionally, the invention hold the processing temperature to 350° C. or less after forming the poly-Si film. This highly stabilizes the quality of the MOS boundary surface and the insulation film. Thus the invention is particularly effective for the top gate type of TFT, as shown in FIGS. 25A to 25D.

For a bottom gate type of TFT, a silicon film is deposited after the gate insulation film is formed. Then crystallization is performed by using laser irradiation. Thus, parts of the MOS boundary surface and gate insulation film will inevitably be subjected to a high-temperature thermal environment at close to 1000° C. Although this high-temperature environment continues only for short periods, this thermal environment will roughen the MOS boundary surface. The chemical composition and bonding state of the insulation film in the vicinity of the MOS boundary surface is also altered. As a result, the transistor characteristic will degrade and the quality will vary greatly.

Page 35

When a poly-Si TFT is fabricated through a low-temperature process, it is most important to form a good-quality poly-Si film. Therefore, when an amorphous film is crystallized by optical or electromagnetic energy or by a low-temperature thermal environment in the region of about 600° C., it is necessary to optimize the quality of the amorphous film. As discussed above in connection with the second embodiment, polycrystalline films of large-area grains and small number of crystalline defects are formed by the crystallization of amorphous semiconductor films which are formed at a deposition temperature of 580° C. or less and a deposition rate of 6 Å/minute or more. Therefore, an amorphous semiconductor film formed under these conditions is the optimum semiconductor film for a low-temperature process.

The fifth embodiment produces a high-quality semiconductor film consisting of a polycrystalline silicon film at a low temperature of less than approximately 600° C. The thin-film semiconductor device characteristics are dramatically improved and a stable mass production environment is obtained.

The invention provides at least the following advantages:

First, since the processing temperature is less than 600° C., inexpensive glass can be used reducing product prices. Low processing temperatures prevent warping of the glass allowing large liquid crystal display devices to be fabricated.

Secondly, uniform laser irradiation is performed over the entire substrate. The uniformity between lots are also improved. The uniform laser radiation enables stable production.

Thirdly, it is extremely simple to produce a self-aligned TFT in which the source and drain align themselves with respect to the gate electrode, by ion doping and subsequent low-temperature activation at approximately 300° C. to 350° C. This enables stable activation, and ensures that a lightly doped drain (LDD) type of TFT can be fabricated quite easily and stably. Since an LDD is thereby implemented by a low-temperature poly-Si TFT, the TFT components can be miniaturized and the OFF leakage current reduced.

Fourthly, while conventional low-temperature poly-Si TFTs are available only when the gate-$SiO_2$ is deposited by ECR-PECVD, the fifth embodiment uses an ordinary PECVD apparatus for preparing the gate-insulation film in the low-temperature poly-Si TFT fabrication. Therefore, a practicable fabrication apparatus can be obtained to prepare a gate oxide film. This is applicable to large substrates and are suitable for mass production.

Page 36

Fifthly, an excellent thin-film semiconductor device is fabricated having a higher ON-current and lower OFF-current than conventional TFTs. In addition, variations in these currents are reduced.

When the invention as described above is used to fabricate an active matrix liquid crystal display, an inexpensive glass substrate can be used. A large, high-quality LCD can be produced easily and stably. When the invention is applied to other electronic devices, deterioration of components due to heat is reduced. Thus, the invention produces high-performance, and inexpensive active matrix liquid crystal display devices or other electronic devices such as integrated circuits.

Sixth Embodiment

The sixth to twelfth embodiments described below illustrate how optimization of factors such as processing conditions can provide LDD-type thin-film semiconductor devices (LDD-type TFT circuits) having high speeds and good characteristics.

A TFT circuit of the sixth embodiment is a CMOS circuit using both p-channel and n-channel LDD-type TFTs. Since an LDD-type TFT has a high-resistance portion between a channel portion and source and drain portions, the electric field is not concentrated at the drain edge of the channel. The LDD-type TFT reduces the OFF current and increases the breakdown voltage between the source and the drain and between the gate and the source. The high-resistance portions reduce the actual voltage applied to the channel portion and thus the ON current is reduced. Therefore, the LDD-type TFTs have not been used in CMOS circuits that must function at high speeds, even though the LDD-type TFTs are used in applications such as the switching elements of an active matrix portion or SRAM resistance elements. However, both experimentation and simulations show that a CMOS circuit of LDD-type TFTs is capable of high-speed operation. The high-speed LDD-type TFT is not limited to a CMOS configuration but can also be applied widely to NMOS and PMOS configurations.

FIG. 26 shows a method of fabricating an LDD-type CMOS TFT. A gate insulation film 5 is formed on a thin semiconductor film 2 that is patterned in an island shape on an insulating substrate 1. A gate electrode 6 is formed on the gate insulation film 5. Next, donor impurity is implanted at low concentration into the thin semiconductor film 2 at source and drain portions of an n-channel TFT forming a thin n semiconductor film 9. The impurity implantation dose is approximately between $1 \times 10^{13}$ cm$^{-2}$ to $1 \times 10^{14}$ cm$^{-2}$, and preferably approximately between $2 \times 10^{13}$ cm$^{-2}$ to $5 \times 10^{13}$ cm$^{-2}$. If the dose is within this range, the maximum impurity concentration of the thin n$^-$ semiconductor film 9 is the impurity implantation dose value multiplied by $10^5$. Thus, the maximum impurity concentration of the thin n$^-$ semiconductor film 9 is approximately between $1 \times 10^{18}$ cm$^{-3}$ to $1 \times 10^{19}$ cm$^{-3}$, and preferably between approximately $2 \times 10^{18}$ cm$^{-3}$ and approximately $5 \times 10^{18}$ cm$^{-3}$.

The impurity is then further implanted at high concentration into the source and the drain portions to form a thin n$^+$ semiconductor film 3. The impurity implantation dose in this case is between approximately $5 \times 10^{14}$ cm$^{-2}$ and approximately $1 \times 10^{16}$ cm$^{-2}$, preferably between approximately $1 \times 10^{15}$ cm$^{-2}$ and approximately $3 \times 10^{15}$ cm$^{-2}$. If the dose is within this range, the maximum impurity concentration of the thin n$^+$ semiconductor film 3 is again the impurity implantation dose value multiplied by $10^5$ and thus the maximum impurity concentration of the thin n$^+$ semiconductor film 3 is between approximately $5 \times 10^{19}$ cm$^{-3}$ and approximately $1 \times 10^{21}$ cm$^{-3}$, preferably between approximately $1 \times 10^{20}$ cm$^{-3}$ and approximately $3 \times 10^{20}$ cm$^{-3}$. This process divides the island-shaped thin semiconductor film into three sections with differing resistances: an intrinsic semiconductor region of channel, high-resistance impurity-doped semiconductor regions on either side of an intrinsic semiconductor region of a channel portion, and a low-resistance impurity-doped semiconductor region of the source and drain portions.

Page 37

In a similar manner, an impurity that is to form acceptors is implanted at low concentration into the thin semiconductor film at source and drain portions of a p-channel TFT, to form a thin p$^-$ semiconductor film 10, then at high concentration into the source and the drain portions to form a thin p$^+$ semiconductor film 4. With this method, the gate electrode is used as a mask for the implantation of impurities, so that boundaries between the thin n$^-$ semiconductor film 9 and the channel portion and between the thin p$^-$ semiconductor film 10 and the channel portion are self-aligned to the gate edge (self-aligned structure).

There are at least two methods for forming the boundaries between the thin n$^-$ semiconductor film 9 and the thin n$^+$ semiconductor film 3 and between the thin p$^-$ semiconductor film 10 and the thin p$^+$ semiconductor film 4. One method is a non-self-aligned method which uses a photoresist as a mask for high concentration implantation for example. Another method is a self-aligned method which uses side walls formed by the insulation film on the gate electrode to form the boundaries self-aligned to the side walls.

Highly doped source and drain portions need not be formed by the impurity implantation into the intrinsic semiconductor film as described above. The highly doped source and drain partitions can be formed as island shapes of a thin n$^+$ semiconductor film or a thin p$^+$ semiconductor film that already contains an impurity. Since the current that flows, when a reverse bias is applied, must be minimized in a TFT, it is preferable that the intrinsic thin semiconductor film be as thin as possible. However, if this film is too thin, the aluminum wiring punctures through the thin semiconductor film at the contact holes. Therefore, the highly doped source and drain portions formed as individual island-shaped thin semiconductor films prevents this puncturing and permits even thinner intrinsic semiconductor film channels.

Next, a interlayer insulation film 7 is formed over each of these TFTs. A thin metal film 8 is patterned to form wiring which completes the CMOS TFT circuit. The thin semiconductor film 2 can be a thin polycrystalline silicon film, a thin amorphous silicon film, a thin semiconductor film of Te, or a thin semiconductor film of a compound such as CdSe.

Figure 27:
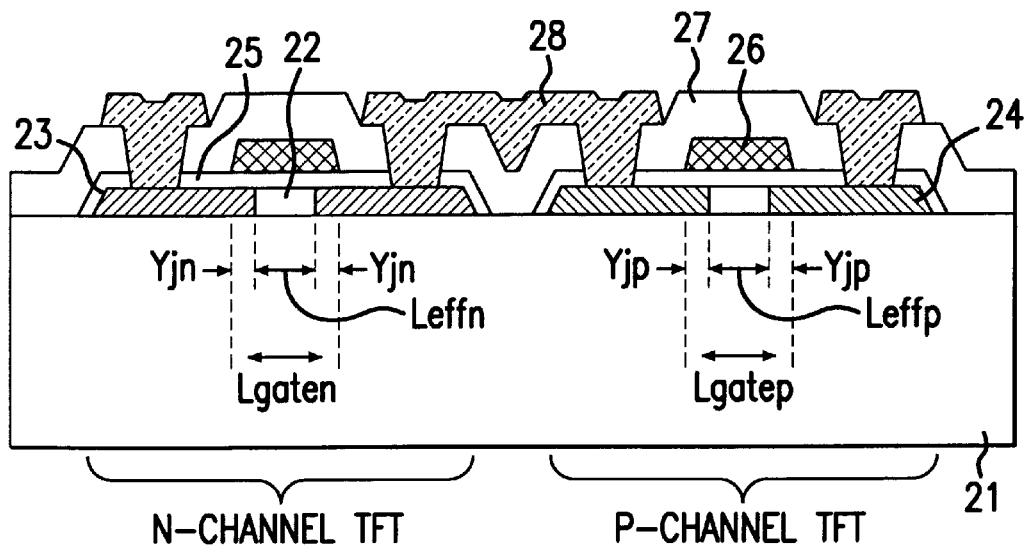
FIG. 27 is a cross-section through a TFT of an ordinary structure.

FIG. 27 shows an ordinary TFT. The lengths of an overlapping portion Yjn of the n-channel TFT and an overlapping portion Yjp of the p-channel TFT, shown in FIG. 26, are smaller than the equivalent lengths in the TFTs of the ordinary structure shown in FIG. 27. The concentration of the impurity implanted into the thin n$^-$ semiconductor film 9 and the thin p$^-$ semiconductor film 10 is extremely small, so that the diffusion length along the direction of the channel is shortened. The parasitic capacitances of these overlapping portions are loads for the CMOS circuit.

Therefore, the LDD-type CMOS TFT circuit having smaller parasitic capacitances operates at a higher speed than a TFT of an ordinary structure given the same ON-current.

The effective n-channel channel length Leffn and the effective p-channel channel length Leffp are the gate electrode length Lgaten and Lgatep, respectively, subtracted by twice the corresponding overlapping portion Yjn or Yjp. Therefore, if the overlapping portions are small, the effective channel length is increased and the ON current decreased. Since the overlapping portions of the LDD-type CMOS TFT are small, the effective channel length of the LDD-type TFT is longer than the effective channel length of a TFT of an ordinary structure for similar gate lengths. Thus, the ON current of the LDD-type TFT is reduced. However, the breakdown voltage between the source and the drain of the LDD-type TFT is markedly improved allowing LDD TFTs to have an extremely small gate electrode length. As a result, the LDD structure compensates for the reduced ON current by shortening both the gate electrode length and the effective channel length.

In general, the channel resistance Rch(on) when the TFT is ON is non-linearly related to the effective channel length Leff. The relation between Rch(on) and left is:

$$Rch(on) = k \times Leff^n$$

where k is a proportional constant and usually n>1. Thus, the ON current of the LDD-type TFT increases rapidly as the effective channel length shortens. Since the channel portion of a TFT is polycrystalline, the number of grain boundaries within the channel decreases as the channel becomes shorter. Thus, the adverse effect of the grain boundaries on electrical conductivity is reduced as the channel length shortens. Thus, although the current can be partially controlled by the parasitic resistance of the LDD portion, the LDD-type TFT ON current is greatly increased by shortening the channel compared to a similar increase in ON current for a TFT of an ordinary structure.

Figure 28:
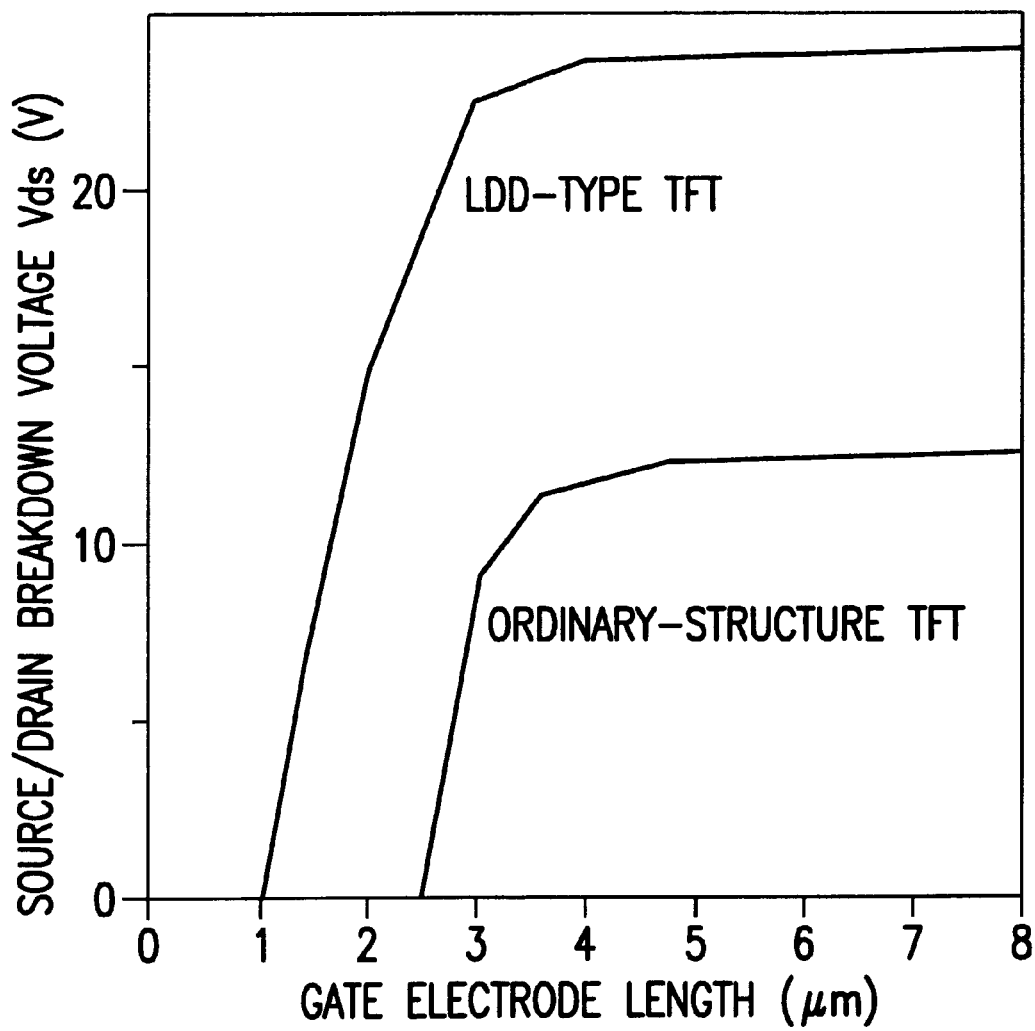
FIG. 28 is a characteristic diagram showing the relationship between gate electrode length and breakdown voltage between source and drain in an LDD-type TFT and a TFT of an ordinary structure.

FIG. 28 shows the relationship between gate electrode length and source-drain breakdown voltage in the LDD-type TFT of this embodiment and a TFT of an ordinary structure. The breakdown voltage between the source and the drain in the TFT of an ordinary structure deteriorates when the gate electrode length is 5 μm or less. Thus, the gate electrode lengths of both the p-channel TFT and the n-channel TFT of the ordinary structure must be made at least 5 μm, in order to reliably prevent the breakdown in voltage between the source and the drain. In contrast, the source-drain breakdown can be prevented till the breakdown voltage of at least 20 V with the LDD-type TFT of this embodiment, even if the gate electrode length is 5 μm or less. Even if the gate electrode length is 3 μm, a breakdown voltage between the source and the drain of at least 20 V can be obtained. A breakdown voltage between the source and the drain of at least 15 V can be obtained when the gate electrode length is 2 μm. The OFF current is also reduced by at least one order of magnitude compared with a TFT of an ordinary structure.

Figure 29:
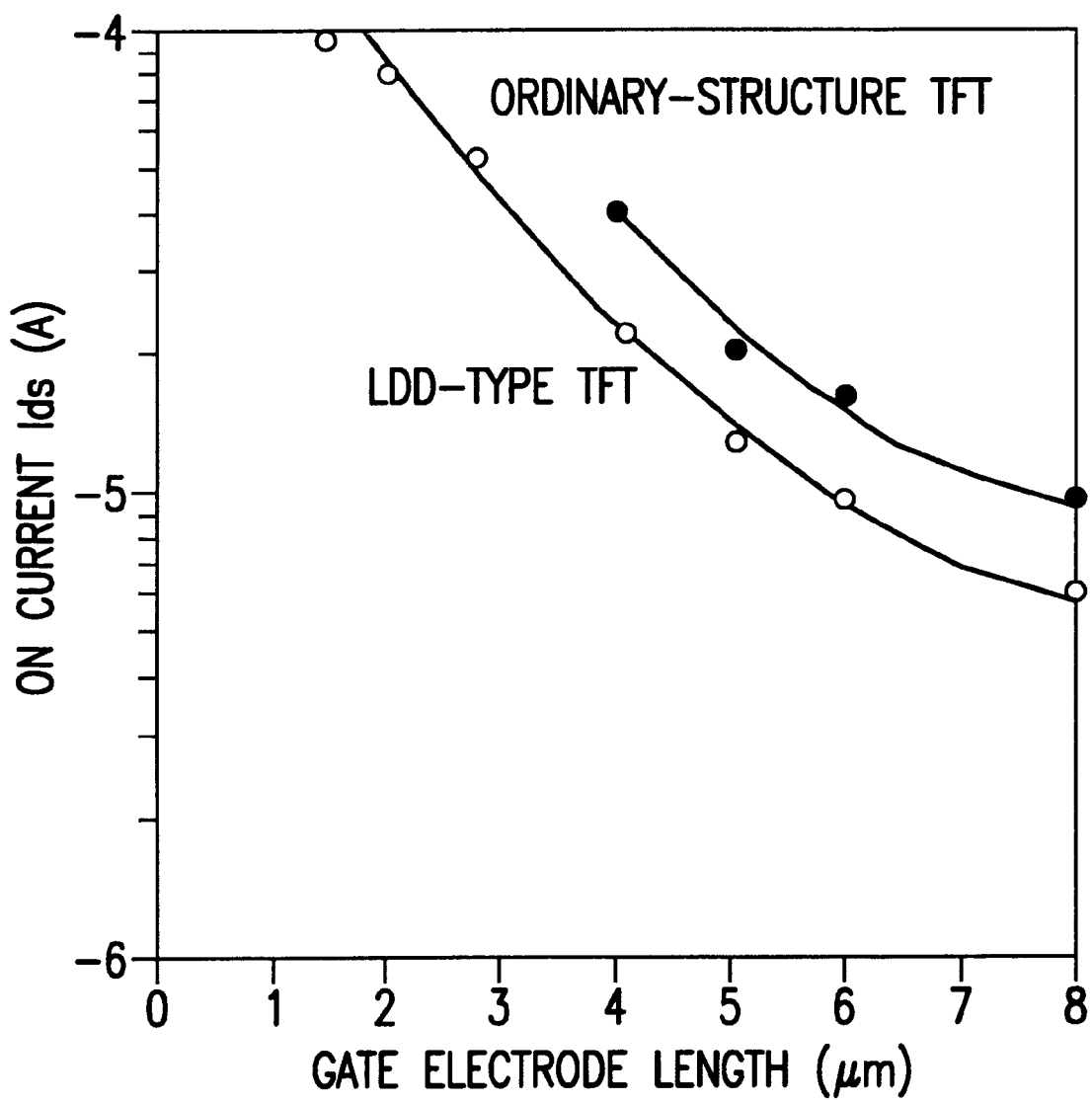
FIG. 29 is a characteristic diagram showing the relationship between gate electrode length and ON current in an LDD-type TFT and a TFT of an ordinary structure.

FIG. 29 shows the relationship between gate electrode length and ON current in the LDD-type TFT of this embodiment and a TFT of an ordinary structure. The ON current of the TFT of the ordinary structure when the gate electrode length is 5 μm is about the same as the ON current of the LDD-type TFT when the gate electrode length is 4 μm. Thus, although the ON current is reduced by the LDD structure, an ON current of at least the same level as that of the ordinary structure can be obtained by shortening the gate electrode length.

The LDD-type TFT has no low breakdown voltage problems, even when the electrode length is 4 μm. The ON current of a TFT of the ordinary structure when the electrode length is 4 μm is about the same as the ON current of the LDD-type TFT when the electrode length is 3 μm. Even when the gate electrode length is 3 μm, the LDD-type TFT has no low breakdown voltage problems, as shown in FIG. 28. Since the source-drain breakdown voltage is very low when the gate electrode length is less than 4 μm in the TFT of the ordinary structure, the ON current cannot be measured.

In contrast, the source-drain breakdown voltage of the LDD-type TFT with the gate length even of 2 μm of this embodiment is still high, so that the extremely high ON current can be achieved, as shown in FIG. 29. Thus, the LDD-type TFT of this embodiment can achieve a large ON current that cannot be obtained by the TFT of the ordinary structure. Using the LDD structure for both the p-channel and the n-channel TFT, the gate electrode length can be reduced to 5 μm or less, preferably 3 μm or less, and thus enabling the CMOS circuit having high operational speeds.

Page 39

The LDD-type TFT higher breakdown voltage between the gate and the source permits the gate insulation film to be also thinner. For example, the gate insulation film can be 1000 Å or less. Although the thinner gate insulation film increases the channel capacitance, the operating speed of the TFT circuit is increased because the threshold voltage is decreased which increases the ON current.

Figure 30A:
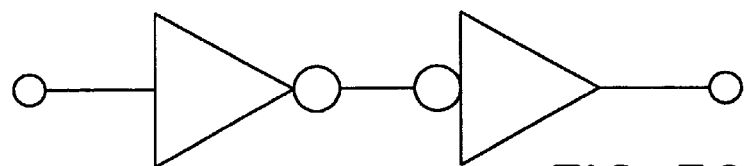
FIGS. 30A to 30C are diagrams used to describe the operation of a CMOS inverter circuit.
Figure 30B:
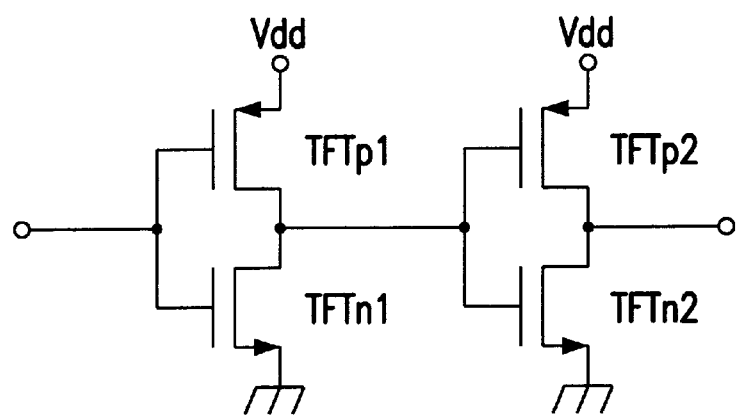
Figure 30C:
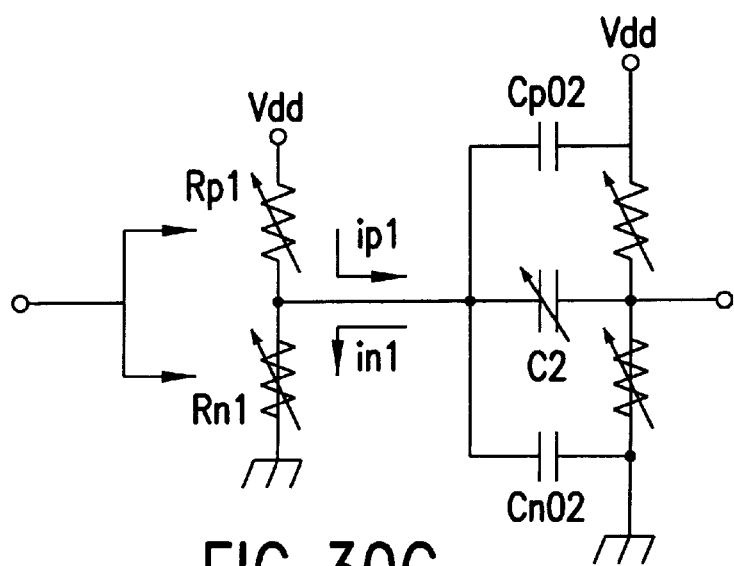

In general, CMOS digital circuits are connected, as shown in FIG. 30A, with the output of one gate connected to the input of the next-stage gate. If this simple two-stage inverter is considered, a first-stage transistor TFTp1 or TFTn1 charges or discharges the two channel capacitances of next-stage transistors TFTp2 and TFTn2, and the time constant set by this charge/discharge determines the switching speed. Since the channel length of the LDD-type CMOS TFT can be shortened, as shown in FIG. 30C, an ON resistance Rp1 of the p-channel TFT and an ON resistance Rn1 of the n-channel TFT are reduced and the magnitudes of a charge current ip1 and a discharge current in1 are increased. An overlapping capacitance Cp02 of the next-stage p-channel TFT and an overlapping capacitance Cn02 of the next-stage n-channel TFT are reduced as described above. A capacitance C2 of the channel portion is also reduced by the shortening of the channel. Thus the load capacitance, which is the total capacitance effect of all the above capacitances, under all of the bias conditions (ON state, OFF state, and an intermediate bias) is reduced. Accordingly, a short-channel LDD-type CMOS TFT circuit has a shorter charge/discharge time constant and a higher operating speed than a circuit with TFTs of the ordinary structure. Even if the ON resistance Rp1 of the p-channel TFT and the ON resistance Rn1 of the n-channel TFT is larger than those of the TFTs of the ordinary structure, due to a higher resistance in the LDD portion, the operating speed can be increased by reducing the value of the time constant Rp1×(Cp02+Cn02+C2) and of Rn1×(Cp02+Cn02+C2) to smaller than those of the TFTs of the ordinary structure.

Page 40

Figure 31A:
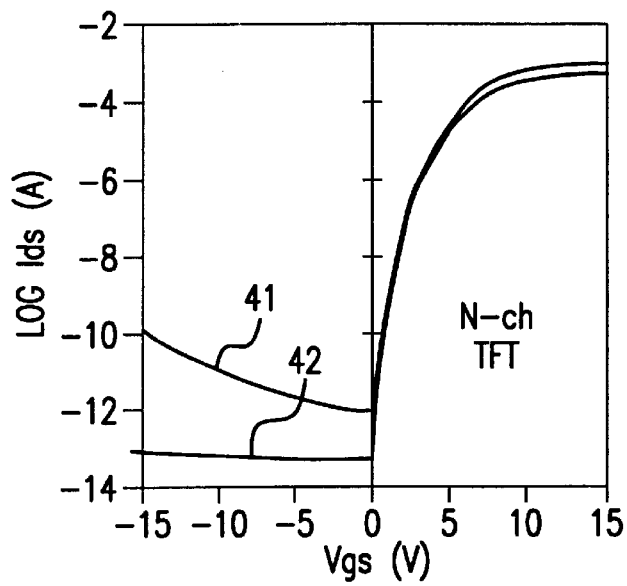
FIGS. 31A and 31B are graphs of the transfer characteristics of thin-film transistors.
Figure 31B:
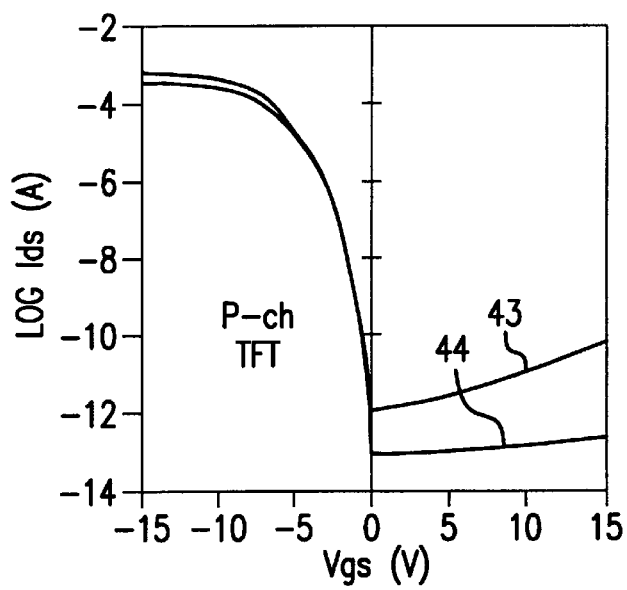

The actual transfer characteristics of TFTs formed with the configuration of FIG. 26 are shown in FIGS. 31A and 31B. It can be seen from the transfer characteristics 42 and 44 of LDD-type TFTs that the ON current is approximately 50% to 60% of that of transfer characteristics 41 and 43 of ordinary TFTs. Since TFTs of the same gate electrode length are compared, the lower ON current of the LDD-type TFTs is attributed to the longer effective channel length of LDD-type TFTs. Since the OFF current is greatly reduced, the ON/OFF ratio is increased by at least one order of magnitude. The breakdown voltage between the source and the drain and the breakdown voltage between the source and the gate are also greatly increased in the LDD-type TFT. Therefore, if the gate electrode length of an LDD-type TFT is halved, the ON current would remain at or above the same level but the OFF current would decrease by at least one order of magnitude enabling an increase in the breakdown voltage.

Figure 32:
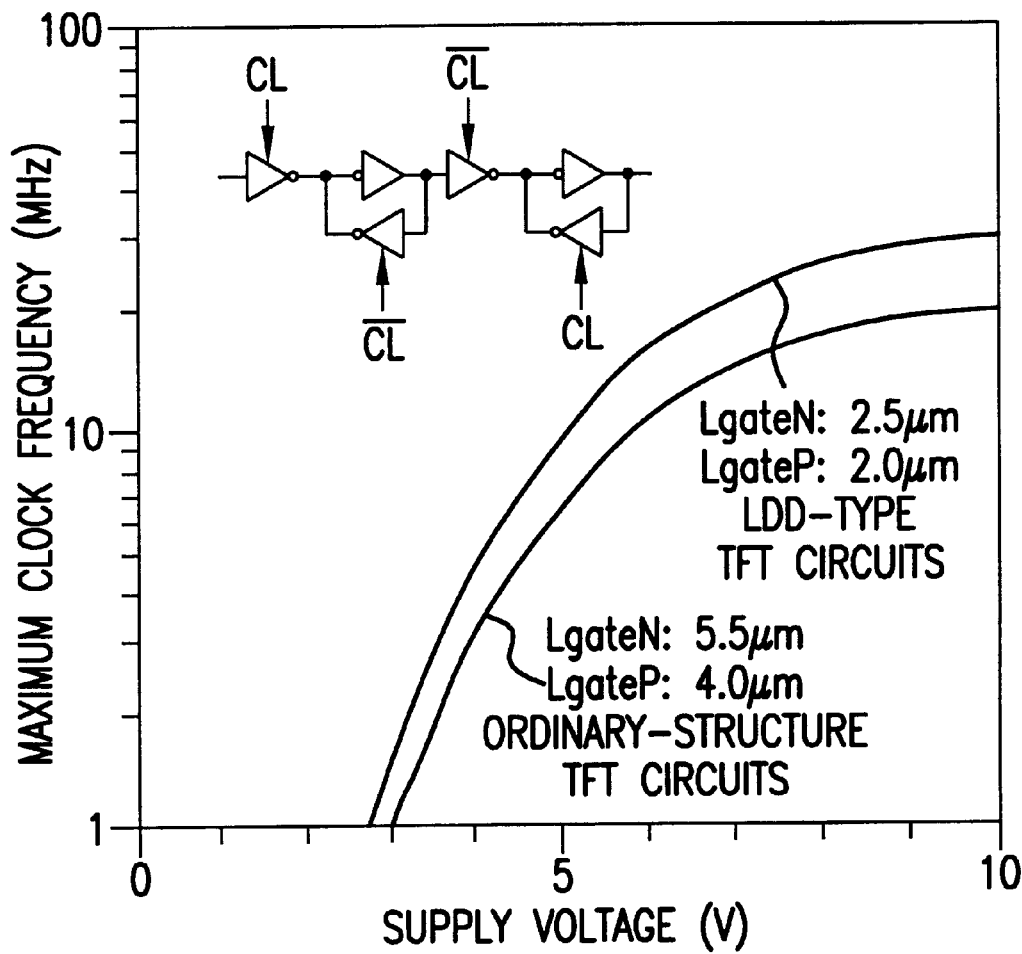
FIG. 32 is a graph of the maximum operating frequency of a shift register circuit.

Simulation results of FIG. 32 show the maximum operating frequency of a shift register circuit, based on the characteristics of the tested LDD-type TFT. In FIG. 32, a short-channel LDD-type TFT circuit can operate at higher speed than a TFT circuit of the ordinary structure. Moreover, since the LDD-type TFT has a far smaller OFF current, the power consumption of a circuit driven at the same voltage is reduced, even if the gate electrode length is reduced to about half. In addition, since the breakdown voltage between the source and the drain and the breakdown voltage between the source and the gate are far larger with the LDD-type TFT, a high-voltage circuit can be implemented.

For example, an electro-optical material requiring a high voltage drive that could not be driven by a conventional TFT circuit can be driven easily by such a circuit with LDD-type TFTs. Examples of such electro-optical materials are a high-molecular weight polymer dispersed liquid crystal (PDLC) or a guest/host type of liquid crystal. The threshold voltage of such a liquid crystal can be increased and, if this liquid crystal is used in a display element of a liquid crystal display device, the angle of visibility thereof can be greatly increased.

In order to balance the ON currents of an n-channel TFT and a p-channel TFT with different carrier mobilities, the gate electrode length of the n-channel TFT is made longer than the gate electrode length of the p-channel TFT. In order to operate the CMOS circuit at the highest speed, it is preferable that the ON currents of the two TFTs are approximately the same. In particular, since it is necessary to make the parallel resistances of the two TFTs constant at the operating points in a CMOS analog switch, the resistance of the p-channel TFT must be made sufficiently small. From the point of view of spatial efficiency in the layout, it is more effective to vary the channel length with a constant channel width, than vary the channel width with a constant channel length. However, if design rule restrictions prevents shortening the channels, the channel length could be fixed as the minimum dimension of the gate electrode length, and the n-channel width could be made smaller than the p-channel width. For an analog switch or a circuit comprising only an inverter, the channel lengths or widths of the p-channel and n-channel TFTs can be determined comparatively easily. However, with a circuit in which the connections of TFTs of the same polarity are mixed in parallel and in series, such as a NAND gate or NOR gate, it will be necessary to optimize the size of each TFT to suit the objective of that circuit.

Page 41

Figure 33A:
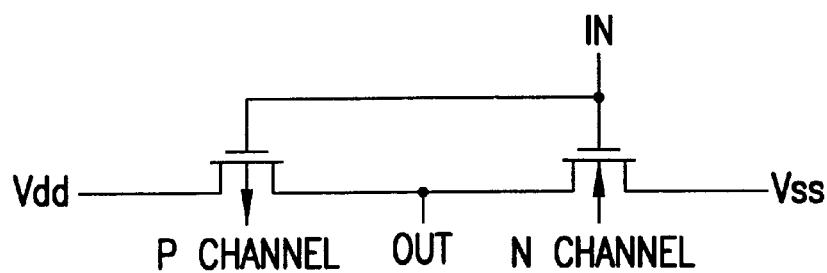
FIGS. 33A, 33B, and 33C are a circuit diagram, a pattern diagram, and a wafer cross-sectional view, respectively, when a CMOS inverter circuit is made from single-crystal MOSFETs.
Figure 33B:
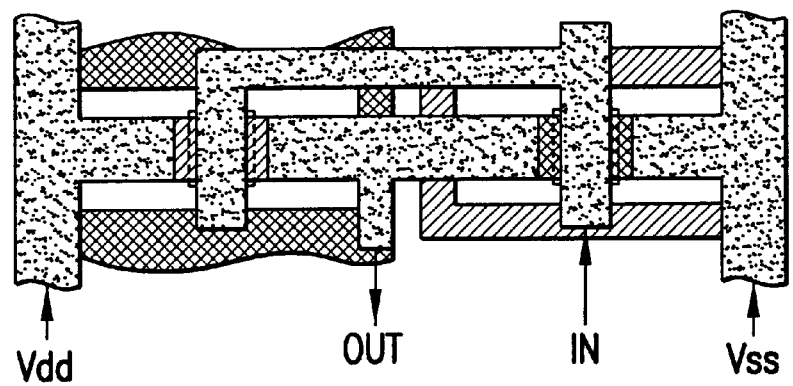
Figure 33C:
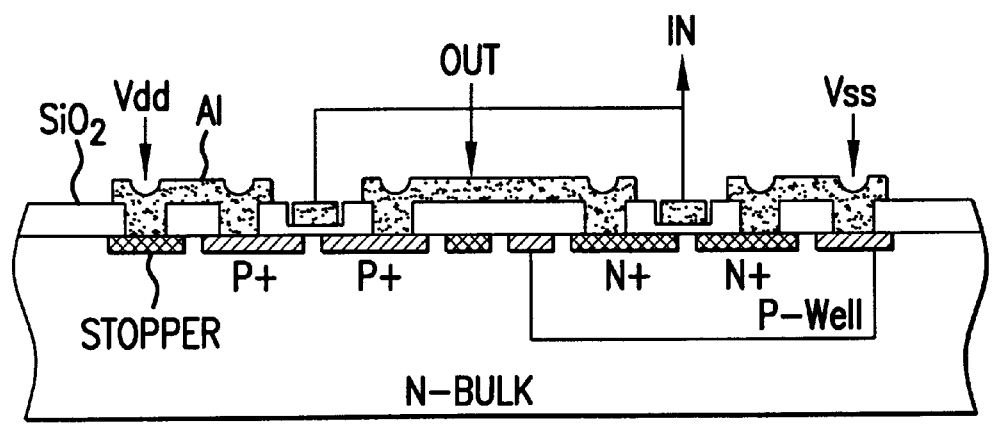
Figure 34:
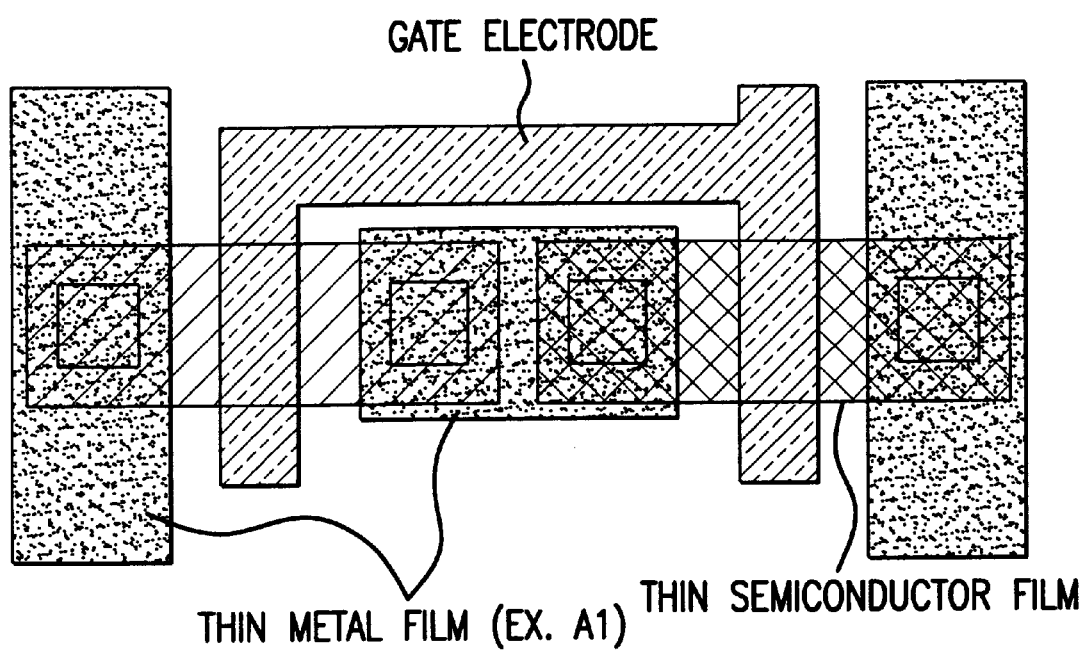
FIG. 34 is a pattern diagram when a CMOS inverter circuit is made from TFTs.

A circuit diagram, a pattern diagram, and a wafer cross-sectional view when a CMOS inverter circuit is configured of a single-crystal MOSFET are shown in FIGS. 33A, 33B, and 33C, respectively. A pattern diagram of TFTs configured as a CMOS inverter circuit is shown in FIG. 34. With a single-crystal MOSFET, a p-well is necessary for forming the n-channel transistor, and thus the p-channel transistor and the n-channel transistor cannot be place too close together. A single-crystal MOSFET must also be provided with a $p^+$ stopper (guard bar) in a $p^-$ well or an $n^+$ stopper in an $n^-$ bulk in order to stabilize the potential of the well or $n^-$ bulk and prevent the occurrence of latch-up. This stopper must be provided at the boundary between the p-channel transistor and the n-channel transistor, and thus the p-channel transistor and the n-channel transistor must be located even further apart. Thus, as shown in FIG. 33, the length in the lateral direction is large and thus the area occupied by this circuitry is also large.

In contrast, the island-shaped thin semiconductor films of a TFT are completely insulating. Therefore, as shown in FIG. 34 which corresponds to the cross-sectional view of FIG. 27, the length in the lateral direction of FIG. 34 can be made small because there is no need for stoppers. In comparison with a single-crystal MOSFET, the configuration of a TFT is simple and has the further advantage that the p-channel and n-channel transistors can be freely laid out.

Therefore, the fabrication methods of the first to fifth embodiments plus the use of the LDD structure increase the speed of the TFT. If the operating speed is close to that of a single-crystal MOSFET, the layout advantage of TFTs further increase circuit density. TFTs also have the additional flexibility of pattern arrangements, as shown in FIG. 34. The TFT layout efficiency is further increased by holding the channel width constant while varying the channel length.

Seventh Embodiment

This embodiment relates to optimization of the conditions for fabricating an LDD-type TFT.

This embodiment first optimizes the maximum impurity concentration (dose) of the LDD portion, then optimizes the maximum impurity concentration (dose) of the source and drain portions, and finally optimizes the LDD length. Thus this embodiment is designed to increase the speed and increase the breakdown voltage of an LDD-type TFT.

Page 42

Figure 35:
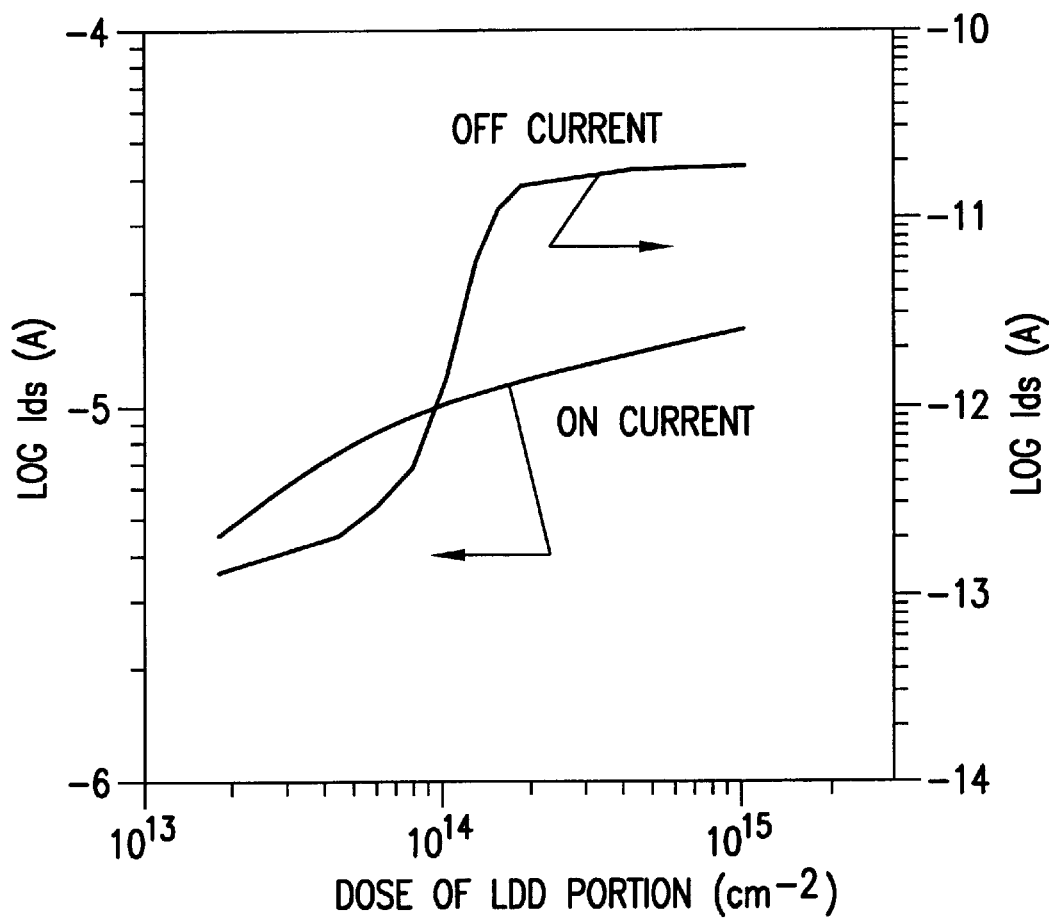
FIG. 35 is a characteristic diagram showing the relationship between dose of the LDD portion and ON and OFF currents.
Figure 36:
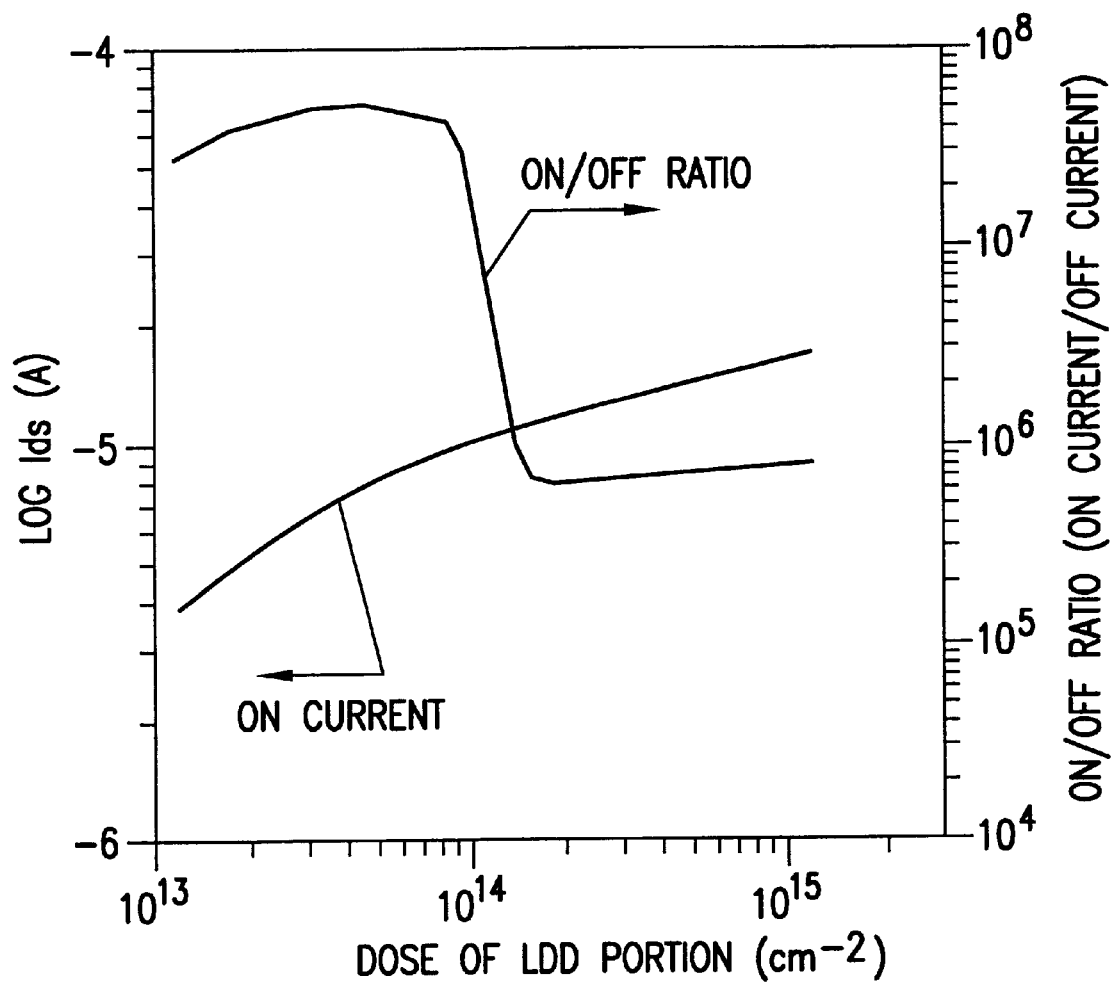
FIG. 36 is a characteristic diagram showing the relationship between dose of the LDD portion and ON/OFF ratio.
Figure 37:
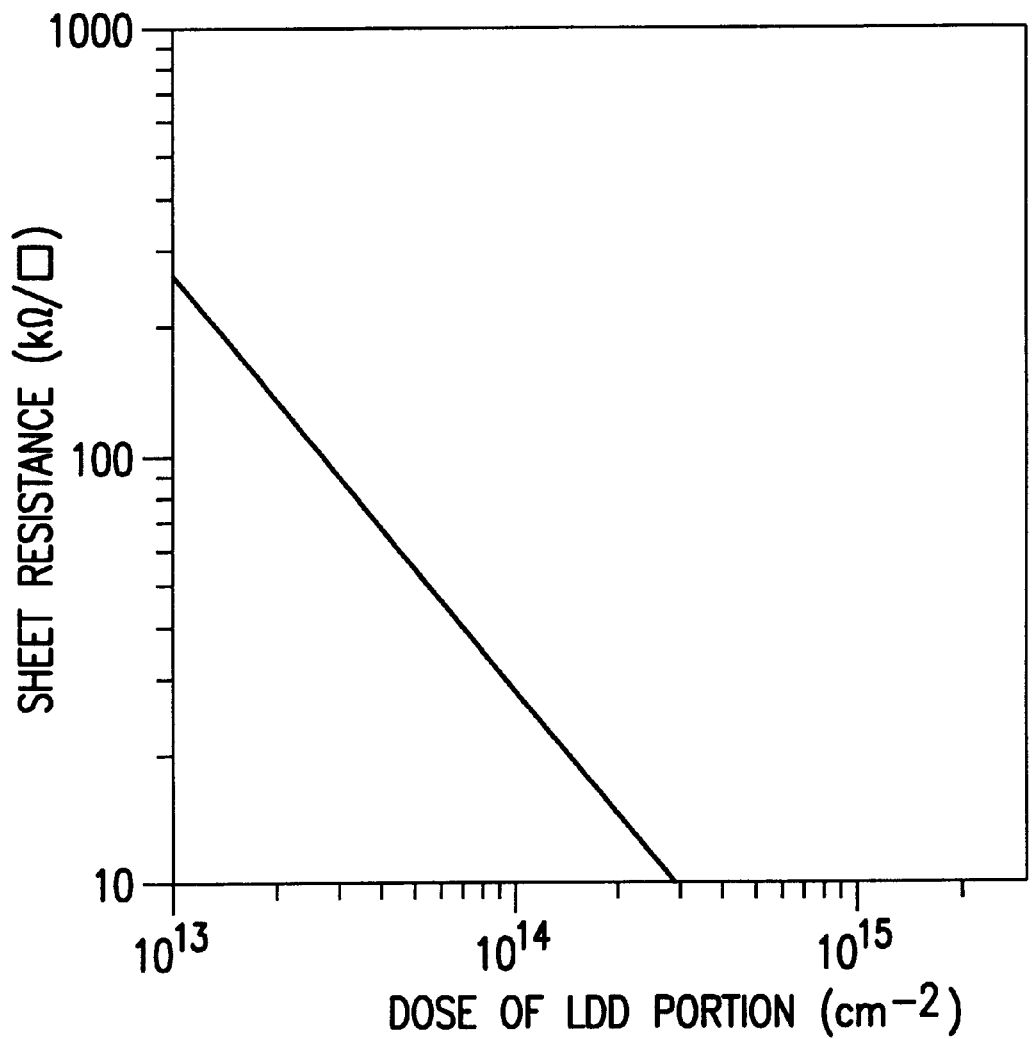
FIG. 37 is a characteristic diagram showing the relationship between dose of the LDD portion and sheet resistance.

The description first concerns the optimization of the maximum impurity concentration of the LDD portion. FIG. 35 shows a characteristic diagram of the relationship between dose of the LDD portion and ON and OFF currents; FIG. 36 shows a characteristic diagram of the relationship between dose of the LDD portion and ON/OFF ratio (ON current/OFF current); and FIG. 37 shows a characteristic diagram of the relationship between dose of the LDD portion and sheet resistance of the LDD portion. Polycrystalline semiconductor films are prepared in accordance with the first conventional fabrication method described earlier having a film thickness of approximately 500 Å. FIG. 35 shows that if the dose of the impurity implanted into the LDD portion is too high, the OFF current cannot be reduced. For example, FIG. 35 shows that the OFF current drops dramatically at doses of $1\times10^{14}$ $cm^{-2}$ or less. If the dose of the LDD portion is high, the concentration of electric field at the drain edges cannot be restrained, increasing the OFF current and lowering the breakdown voltages between the source and the drain and between the source and the gate. Therefore the dose of the LDD portion is preferably $1\times10^{14}$ $cm^{-2}$ or less, and the maximum impurity concentration of the LDD portion is preferably $1\times10^{19}$ $cm^{-3}$ or less.

If the dose of the LDD portion is too low, the ON current drops dramatically, as shown in FIG. 36, because a reduced dose of the LDD portion increases the sheet resistance at the LDD portion, as shown in FIG. 37. For example, if the dose of the LDD portion is less than $1\times10^{13}$ $cm^{-2}$, the sheet resistance becomes greater than 250 kΩ/□. This increase in the sheet resistance has strong negative influence on the total ON-resistance if, for example, the ON resistance of the transistor is as low as approximately 10 kΩ to 20 kΩ. Therefore, the dose of the LDD portion is preferably $1\times10^{13}$ $cm^{-2}$ or more.

The ON/OFF ratio is at a maximum when the dose is between $1\times10^{13}$ cm$^{-2}$ and $1\times10^{14}$ cm$^{-2}$, as shown in FIG. 36. Optimally the ON/OFF ratio is between approximately $2\times10^{13}$ cm$^{-2}$ and $5\times10^{13}$ cm$^{-2}$.

As described above, the dose of the LDD portion is preferably approximately between $1\times10^{13}$ cm$^{-2}$ and $1\times10^{14}$ cm$^{-2}$ and the maximum impurity concentration is preferably approximately between $1\times10^{18}$ cm$^{-3}$ and $1\times10^{19}$ cm$^{-3}$. More preferably, the dose of the LDD portion is approximately between $2\times10^{13}$ cm$^{-2}$ and $5\times10^{13}$ cm$^{-2}$ and the maximum impurity concentration is between approximately $2\times10^{18}$ cm$^{-3}$ to $5\times10^{18}$ cm$^{-3}$. This optimizes the maximum impurity concentration of the LDD portion.

As described in JP 6-102531, the dose of the LDD portion should be $1\times10^{14}$ cm$^{-2}$ or less but no lower limit is disclosed. JP 6-102531 fails to support a maximum value of the ON/OFF ratio between $1\times10^{14}$ cm$^{-2}$ to $1\times10^{13}$ cm$^{-2}$. The maximum impurity concentration of the LDD portion of single-crystal LDD-type MOSFETs are not optimized because the LDD length of a single-crystal LDD-type MOSFET is approximately 0.1 µm and thus the resistance of this LDD portion has minimal effect on operating speed. Therefore, it is unnecessary to consider the maximum impurity concentration of the LDD portion with an LDD-type MOSFET. However, because impurity ions diffusion accelerates along with the grain boundaries (accelerated diffusion) in a non-single-crystal LDD-type TFT, the LDD length must be made longer than the LDD length of a single-crystal MOSFET. Thus the sheet resistance of the LDD portion is not negligible and the maximum impurity concentration at the LDD portion must be optimized to increase operational speeds.

Page 43

Figure 38:
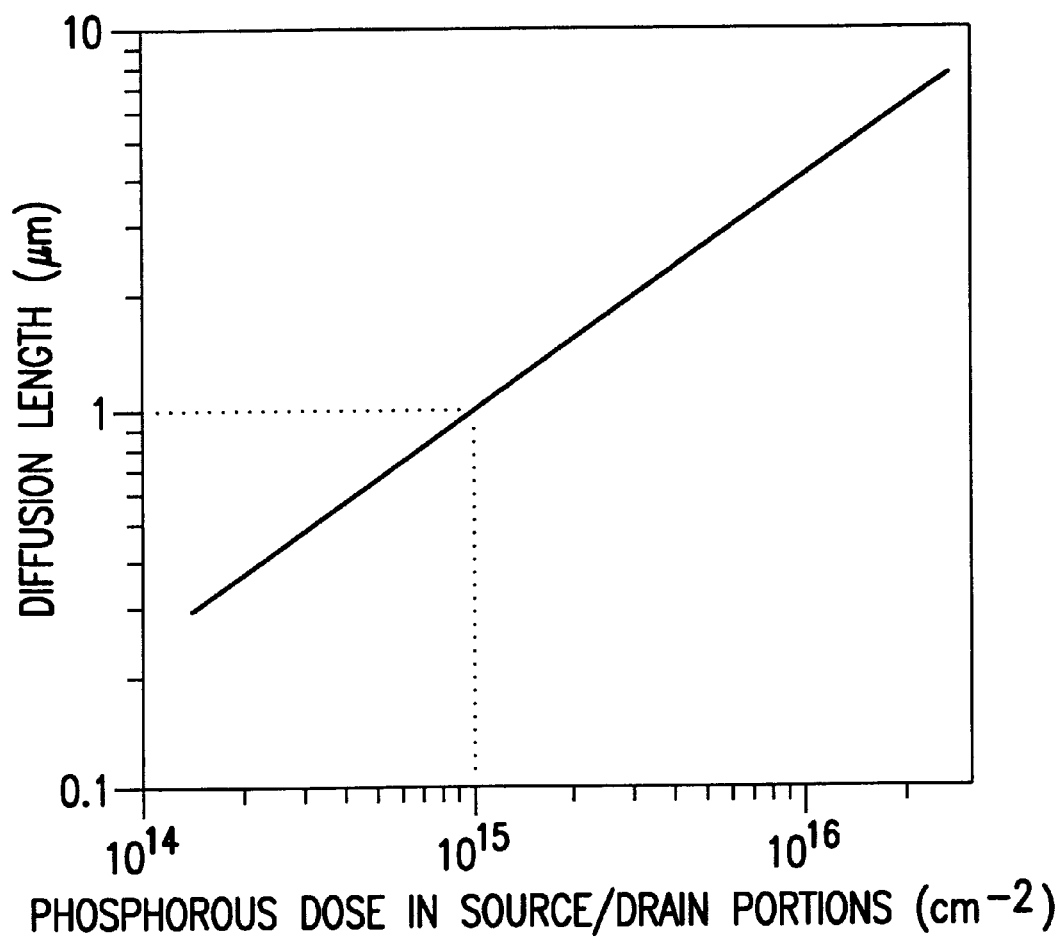
FIG. 38 is a characteristic diagram showing the relationship between dose of the source and drain portions and diffusion length.
Figure 39:
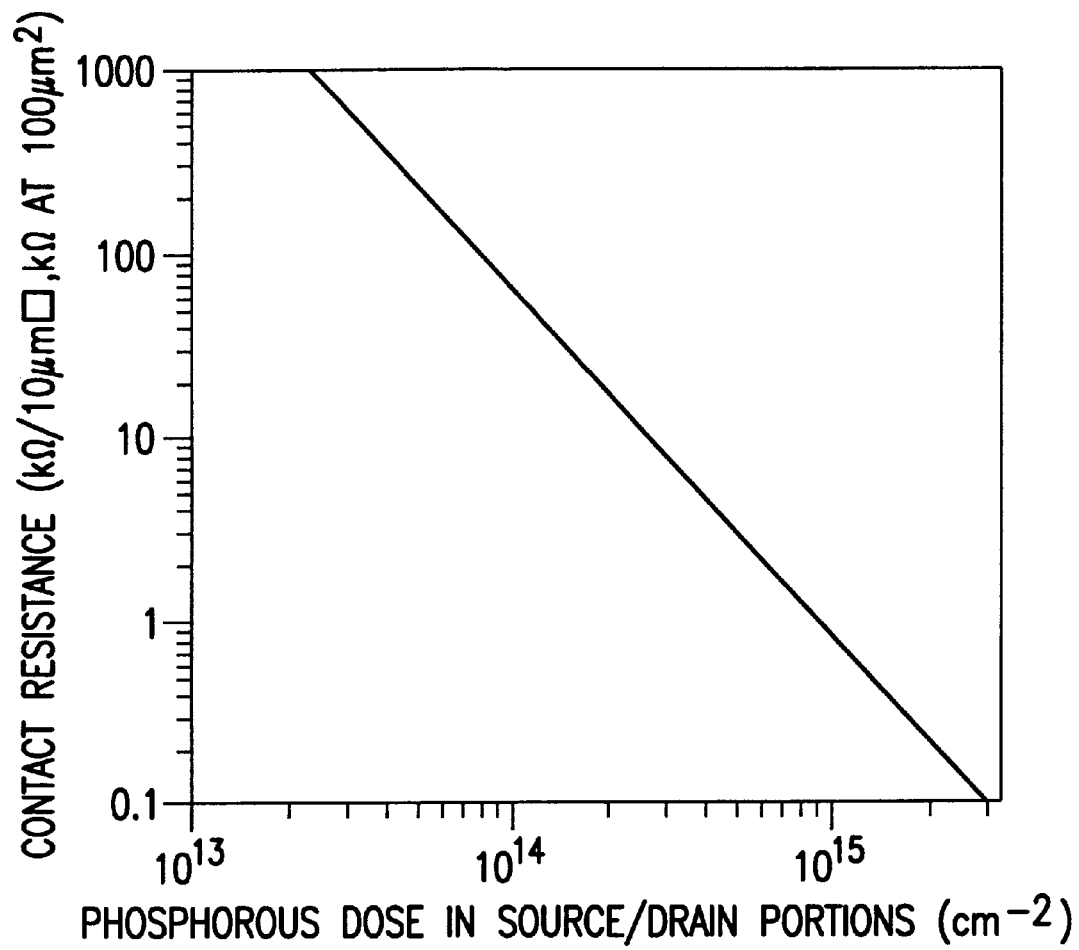
FIG. 39 is a characteristic diagram showing the relationship between dose of the source and drain portions and contact resistance.

The description now turns to the optimization of the maximum impurity concentration of the source and drain portions. FIG. 38 shows a characteristic diagram of the relationship between the dose of the source and the drain portions and diffusion length and FIG. 39 shows a characteristic diagram showing the relationship between the dose of the source and the drain portions and contact resistance in the source and the drain portions, the diffusion length increases as the dose of impurities implanted in the source and the drain portions increases. If the diffusion length becomes too large, impurities diffuse into the LDD portion from the drain or the source portion which may reduce the effective LDD length of the LDD portion to zero.

If the LDD portion is formed in a non-self-aligned manner using a photoresist, the LDD length is determined by the dimensions of the photoresist mask. For example, assume the LDD length is 4 µm as determined by the photoresist mask. If the dose of the source and the drain portions is larger than $1\times10^{16}$ cm$^{-2}$, the diffusion length is more than 4 µm, as shown in FIG. 38. The impurities from the source and the drain portions diffuse into the 4 µm LDD portion and thus the effective LDD length is zero. If the effective LDD length is zero, the function of the LDD portion is lost greatly reducing the breakdown voltage between the source and the drain. Therefore, it is preferable that the dose of the source and the drain portions is $1\times10^{16}$ cm$^{-2}$ or less.

If the dose of the source and the drain portions is too low, the contact resistance at the source and the drain portions (Rc1 and Rc2 in FIG. 56B) increases. Since the purpose for an LDD-type TFT is to reduce the contact resistance at the source and the drain portions, the contact resistance is set to, for example, 3 kΩ or less for a contact hole sized 10 µm□ (3 kΩ/100 µm$^2$). Thus, the dose of the source and the drain portions is set at least $5\times10^{14}$ cm$^{-2}$, as shown in FIG. 39 to reduce the contact resistance and increase the operational speed of the LDD-type TFT.

If the gate electrode length is 5 µm or less, the LDD length is preferably approximately between 1 µm and 2 µm to miniaturize the components. Therefore, the dose of the source and the drain portions is approximately between $1\times10^{15}$ cm$^{-2}$ and $3\times10^{15}$ cm$^{-2}$, derived from FIG. 38.

Page 44

Thus, to optimize the maximum impurity concentration of the source and the drain portions, the dose in the source and the drain portions is set to approximately between $5\times10^{14}$ cm$^{-2}$ and $1\times10^{16}$ cm$^{-2}$ and the maximum impurity concentration is set to approximately between $5\times10^{19}$ cm$^{-3}$ and $1\times10^{21}$ cm$^{-3}$. More preferably, the dose in the source and drain portions is approximately between $1\times10^{15}$ cm$^{-2}$ and $3\times10^{15}$ cm$^{-2}$ and the maximum impurity concentration is in the range of approximately between $1\times10^{20}$ cm$^{-3}$ and $3\times10^{20}$ cm$^{-3}$.

JP 6-102531 discloses that the dose of the source and the drain portions should be in the range of between $1\times10^{14}$ cm$^{-2}$ and $1\times10^{17}$ cm$^{-2}$. This lower numerical value, $1\times10^{14}$ cm$^{-2}$, ensures that the dose is greater than that of the LDD portion. Setting the dose to $1\times10^{14}$ cm$^{-2}$ results in the contact resistance of approximately 50 kΩ for a contact hole having the area of 100 µm$^2$ as shown in FIG. 39 which cannot be borne by the LDD-type TFT of this embodiment.

Since the gate channel length in JP 6-102531 is 6 µm and the ON resistance is so much higher than that of this embodiment, there is no need to lower the contact resistance. The upper limit of the dose in JP 6-102531 is $1\times10^{17}$ cm$^{-2}$, which is very large and excessively increases the diffusion length, as shown in FIG. 38. Since JP 6-102531 does not miniaturize the components, there is no motivation to shorten the gate channel length or the LDD length. Thus, the upper limit of the dose can be so large.

Thus, JP 6-102531 does not optimize the maximum impurity concentration of the source and the drain portions to increase the LDD-type TFTs operational speeds and to maintain a high breakdown voltage. Accelerated diffusion along the grain boundaries does not occur in a single-crystal LDD-type MOSFET, and thus there is no particular need to consider the effects of diffusion of the impurities from the source and drain portions. Thus, it is not necessary to optimize the maximum impurity concentrations of the source and drain portions. The LDD length of a single-crystal LDD-type MOSFET is extremely short at, for example, approximately 0.1 µm and need not be further shortened.

Figure 40:
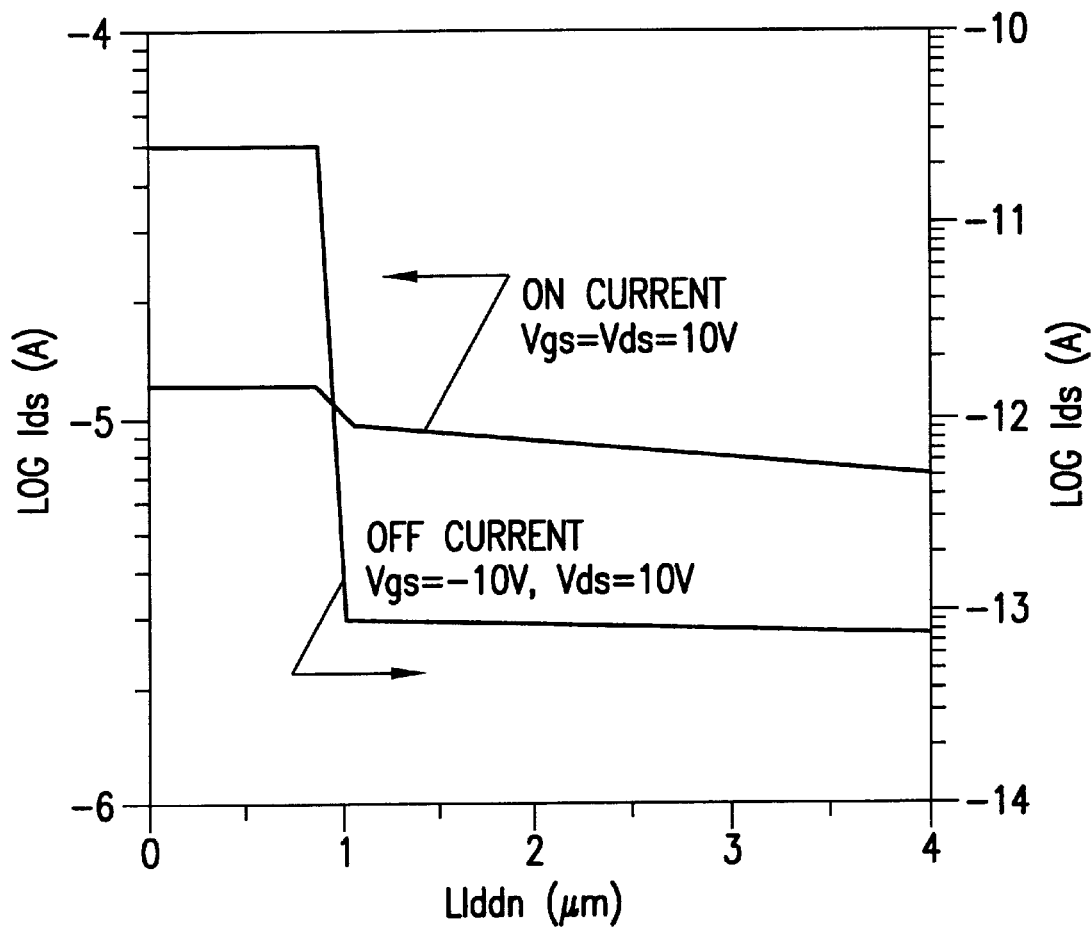
FIG. 40 is a characteristic diagram showing the relationship between LDD length and ON and OFF currents.
Figure 41:
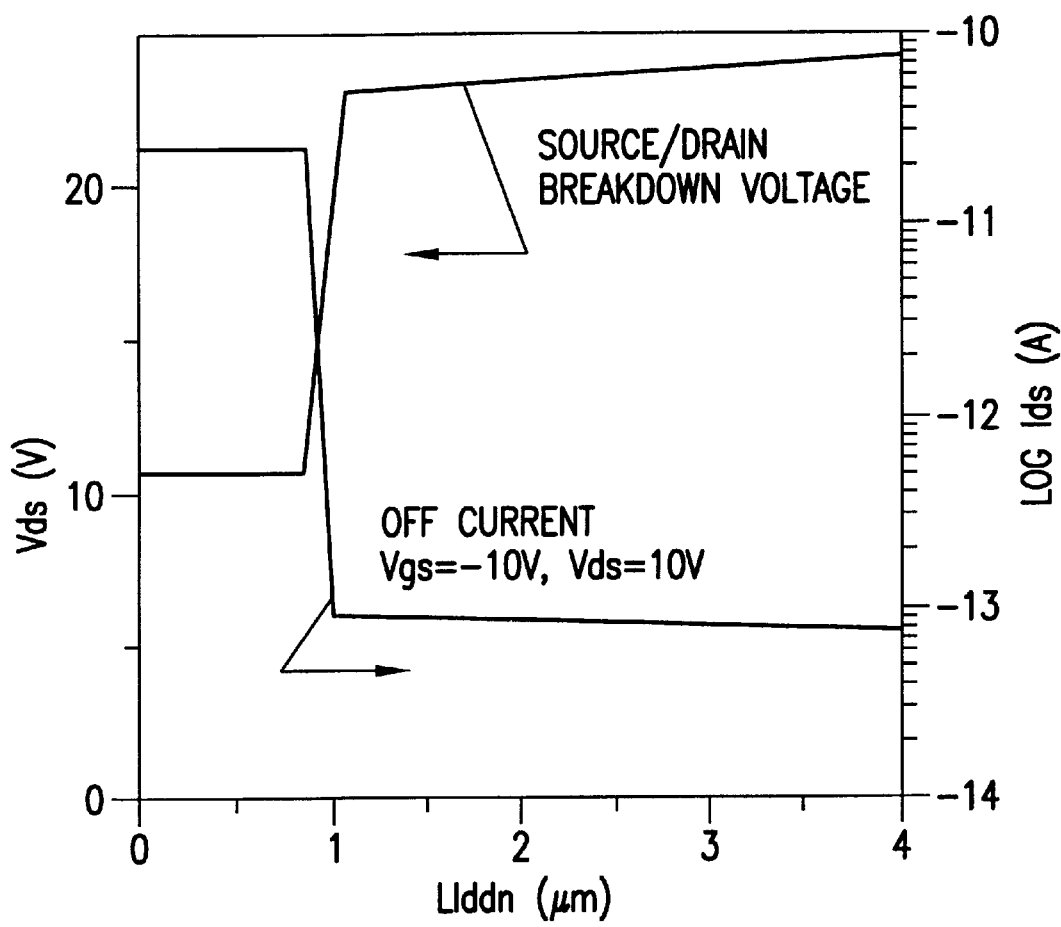
FIG. 41 is a characteristic diagram showing the relationship between LDD length and breakdown voltage between source and drain.

The description now turns to the optimization of the LDD length of the LDD portion. FIG. 40 shows a characteristic diagram of the relationship between LDD length and ON and OFF currents and FIG. 41 shows a characteristic diagram of the relationship between LDD length and source-drain breakdown voltage. The channel and LDD portions are thin polysilicon films with film thickness of 450 Å. The dose of the LDD portion is $3\times10^{13}$ cm$^{-2}$. FIG. 40 shows that the OFF current drops suddenly at a certain LDD length and it decreases only slightly at longer LDD lengths. Similarly, the ON current decreases only slightly at shorter LDD lengths and then the rate of decrease is larger at longer lengths, but the total decrease is by a factor of one half while, in contrast, the OFF current drops at least two orders of magnitude for the same charges in LDD length.

FIG. 41 shows a huge increase in the breakdown voltage between the source and the drain as well as a high increase in the breakdown voltage between the source and the gate where the OFF current suddenly decreases. Thus it is better to ensure that the LDD lengths of all the TFTs in a circuit are greater than length at which the OFF current drops suddenly.

If the LDD length is determined in a self-aligned manner by using side walls made by the insulation film, the thickness of that insulation film could be thicker than the necessary LDD length. The minimum value of variations in the LDD length can be at least 1 µm, even when the LDD length is varied by mask alignment. The differences in ON current are comparatively small with slightly large LDD lengths, as seen in FIG. 40, and is not a problem in a digital circuit. For analog circuits, the LDD length must be the resistance required in the circuit, even at the previously estimated maximum LDD length.

Page 45

The LDD length should be set to be in a range within which the effective LDD length is not reduced to zero by diffusion from the source and drain portions. Therefore, the LDD length corresponding to the optimal dose of the source and the drain portions (which is $5 \times 10^{14}$ cm$^{-2}$ to $1 \cdot 10^{16}$ cm$^{-2}$, preferably $1 \times 10^{15}$ cm$^{-2}$ to $3 \times 10^{15}$ cm$^{-2}$) is preferably approximately between 0.6 µm and 4 µm, and more preferably approximately between 1 µm and 2 µm.

The diffusion coefficient in a TFT using a non-single-crystal thin semiconductor film is at least one order of magnitude larger than that of a single-crystal semiconductor, because accelerated diffusion occurs along the grain boundaries. Thus a design method using single-crystal semiconductor MOSFETs can not be applied to an LDD-type CMOS TFT circuit using a non-single-crystal thin semiconductor film because it is difficult to accurately estimate the TFT current with a conventional MOSFET model. For example, for an LDD length of at least 1 µm for each of p-channel and n-channel polysilicon CMOS TFTs, a resistance of approximately 30% to 100% times the ON resistance of the channel portion is connected in series at each end of the channel in a TFT having an LDD length of at least 1 µm.

In particular, when a fabrication method is used in which the LDD length is determined in a non-self-aligned manner, the LDD length has large variations of between approximately 1 to 4 µm. In order to improve the TFT characteristics, it is necessary to reduce the film thickness of the channel and LDD portions to 1000 Å or less, preferably 500 Å or less, but this increases the likelihood for variations in the sheet resistance of the LDD portion.

The sheet resistance of the LDD portion and the LDD length are optimized to ensure necessary ON current to support operational speeds required by the TFT circuits, but this optimization may cause the increased variations in the sheet resistance. Thus, a special design method that allows for such cases is necessary. Dedicated LDD-type CMOS TFT circuit models have been developed, which take into account the large variations in the assumed range of the resistance of the LDD portion and calculate the resultant effective voltage applied to the channel portion to estimate the ON current, and thus simulations have been performed.

Page 46

Single-crystal semiconductor fabrication techniques are not employed in the fabrication method of LDD-type TFT. For example, with a single-crystal semiconductor, an LDD structure is formed by using side walls of a thin thermal oxidation film of about 1000 Å. However, defect-free side walls are difficult to form with an insulation film that is about 1 µm thick. Moreover, it is impractical to implant impurity ions into a thin semiconductor film of 1000 Å or less through a thick insulation film. Various fabrication methods have been considered, including a method in which the boundaries of the LDD and the source and the drain portions are not self-aligned using a photoresist, or a method in which the end surfaces of the gate electrode are overetched by 1 µm or more. All of these methods can be used for pixel TFTs that are part of an active matrix substrate. However, these methods are developed with a rigid main objective of reducing the OFF current, these methods cannot be used in CMOS TFT circuits designed with the objective of operating at high speeds because of the insufficient ON currents.

Thus, this embodiment concentrates on the ON current in the optimization of the LDD length and the amount of impurity implanted in the LDD portion, while greatly shortening the channels of both the p-channel and n-channel TFTs. This embodiment also enables impurity implantation at low energy but a high throughput, in order to implant impurities through a thin gate insulation film. As described above, optimization of the fabrication process enables the implementation of an LDD-type CMOS TFT that is the first to be suitable for high-speed operation.

Eighth Embodiment

Figure 42A:
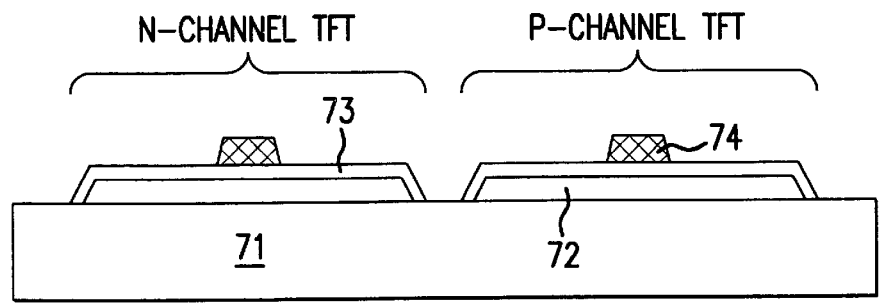
FIGS. 42A to 42D show the fabrication process of the invention.
Figure 42B:
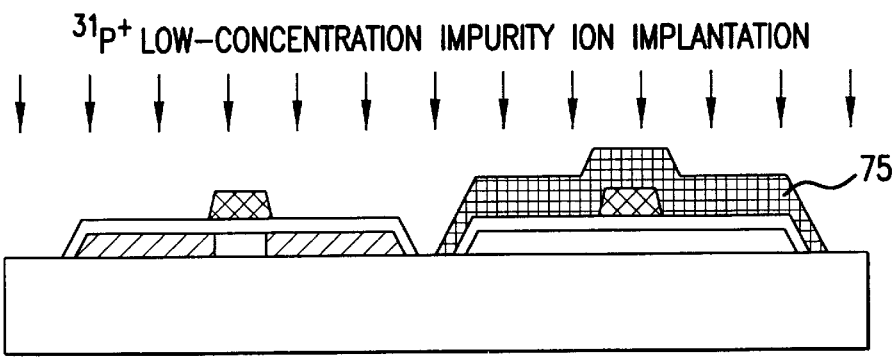
Figure 42C:
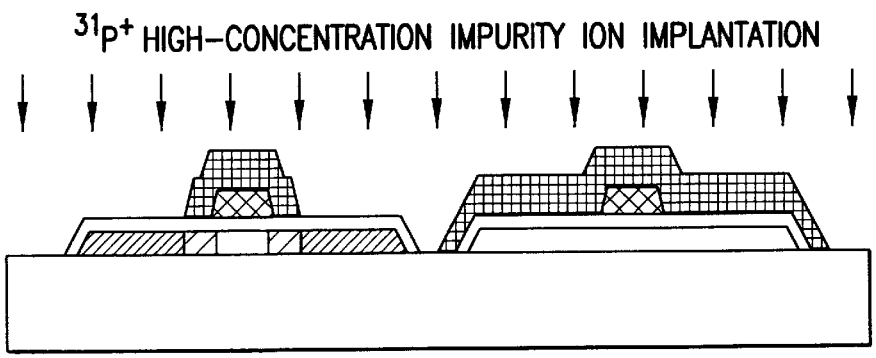
Figure 42D:
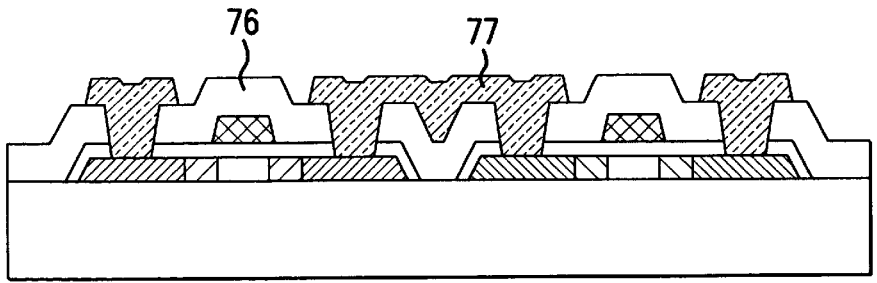

This embodiment relates to a method of fabricating a CMOS circuit in which an LDD-type TFT is used. FIGS. 42A–42D show process diagrams of a typical method of fabricating polysilicon TFTs. First a thin polysilicon film 72 patterned as islands is subjected to thermal oxidation to form a thermal oxidation $SiO_2$ film 73 for each TFT, then a gate electrode 74 is formed thereon as shown in FIG. 42A. Photoresist 75 is then coated over a p-channel TFT area, and a donor impurity is implanted at low concentration, as shown in FIG. 42B. Phosphorus ions are used. Photoresist is again coated over the entire surface of the p-channel TFT and an area larger than the gate electrode of the n-channel TFT, as shown in FIG. 42C, and the donor impurity is implanted at high concentration. This completes the source and drain and channel portions of the n-channel LDD-type TFT. Similarly, an acceptor impurity, such as boron ions, is implanted at low concentration and high concentration into regions of the p-channel TFT. Finally, an interlayer insulation film 76 is deposited and metal wiring 77 is patterned, as shown in FIG. 42D.

Since this method enables unrestricted setting of the LDD lengths by a mask pattern, differing LDD lengths can be used, depending on the type of circuit. If an element is always subjected to a fixed bias, the LDD structure of the element can be set for only a single electrode. For example, the LDD structure could be used for the drain portion only.

Page 47

Another method of forming an LDD-type TFT uses side walls made by an insulation film as a mask. For example, before the high-concentration ion implantation, the gate electrode is covered by an insulation film formed by thermal oxidation or anodic oxidation, or by depositing a new insulation film. For example, chemical vapor deposition can be used to deposit an insulation film which covers the electrode surface layer portion with the thickness of at least the necessary LDD length.

When a deposition method is used, the insulation film is also deposited on the source and drain portions, and thus high-energy ion implantation is required to implant donor or acceptor ions if the insulation film is thick. Sections of differing resistances are formed by ion implantation into the same thin semiconductor film. If the thin semiconductor film (a first thin semiconductor film) is patterned which already has differing resistances, then a second thin semiconductor film is deposited overlapping the first thin semiconductor film to form a channel portion.

Since amongst semiconductor films of the same crystallinity, the film with the thinner channel portion has better characteristics, a thicker film is deposited for reducing the contact resistance of the source and the drain portions and a second thin semiconductor film is formed for the thin channel for better device characteristics.

The method of fabricating a TFT of this embodiment can be applied to all LDD-type CMOS TFTs using non-single-crystal thin semiconductor films.

Ninth Embodiment

This ninth embodiment combines a fabrication method based on the principle that the nucleus generation rate is retarded and the island growth rate is accelerated with a method of fabricating an LDD-type TFT. A solid-phase crystallization method is used in this ninth embodiment to convert the deposited film of an amorphous state into a polycrystalline state. The fabrication method of the ninth embodiment is described below with reference to FIGS. 1A, 1B, and FIGS. 42A to 42D.

An intrinsic silicon film is deposited by LPCVD on a substrate 201. Quartz glass is used as the substrate without depositing an underlying protective film to simplify the process. However, a silicon dioxide ($SiO_2$) film could be deposited by CVD as an underlying protective film, before the semiconductor film is formed, as shown in FIG. 25A. This provides the following: a) the adhesion of the semiconductor film is improved, b) when low-quality inexpensive glass is used as the substrate, impurity ions (such as of Na, K, or Mg) can be prevented from diffusing into the semiconductor film, and c) nucleus generation can be stabilized and the variations in the nucleus generation rate between substrates can be reduced. Thus, the size of grains forming the semiconductor film, which becomes polycrystalline silicon after the thermal oxidation, is constant between substrates.

Using the same LPCVD apparatus as described with the first embodiment, an amorphous silicon film is first deposited. The thickness of the film after deposition is 950 Å. The deposition temperature is 495° C. At least 99.99% pure mono-silane ($SiH_4$) is used as the reactant gas, and the gas flow rate supplied into the reaction chamber is 200 sccm. The deposition pressure is 1.3 Torr and the deposition rate of the silicon film is 16 Å/minute. The deposited silicon film is subjected to patterning to obtain a silicon film 202. See FIG. 1A.

Page 48

The substrate is then subjected to furnace annealing for approximately 24 hours at 600° C. in a nitrogen atmosphere converting the amorphous silicon film into a polycrystalline silicon film (solid-phase crystallization method). The furnace annealing temperature in this case is not limited to 600° C. The preferable range is between 500° C. and 700° C., and more preferably between 550° C. and 650° C.

The patterned surface of the silicon film 202 is subjected to a thermal oxidation method to form a silicon dioxide film 203. This thermal oxidation is performed at a temperature of 1000° C. in a 100% oxygen environment alt one atmospheric pressure. The thickness of the silicon film is thus reduced to 600 Å, and a silicon dioxide film having film thickness of 700 Å is obtained. See FIG. 1B.

A gate electrode 74 is then formed on the thermal oxidation $SiO_2$ film. See FIG. 42A. Next, the p-channel TFT is covered with photoresist 75 and a donor impurity is implanted at low concentration. See FIG. 42B. Photoresist is again coated over the entire surface of the p-channel TFT and an area larger than the gate electrode of the n-channel TFT, and the donor impurity is implanted at high concentration. See FIG. 42C. This completes the source, the drain and the channel portions of the n-channel LDD-type TFT. In the same manner, an acceptor impurity, such as boron ions, is implanted at low and high concentration into regions of the p-channel TFT. Finally, an interlayer insulation film 76 is deposited and metal wiring 77 is patterned, as shown in FIG. 42D. The LDD lengths of the resulting LDD-type TFTs are 2.0 μm on both the p-channel side and the n-channel side. The dose of the LDD regions is $2 \times 10^{13}$ cm$^{-2}$ and the dose in the low-resistance source and drain portions (high-concentration regions) is $1 \times 10^{15}$ cm$^{-2}$.

Figure 43:
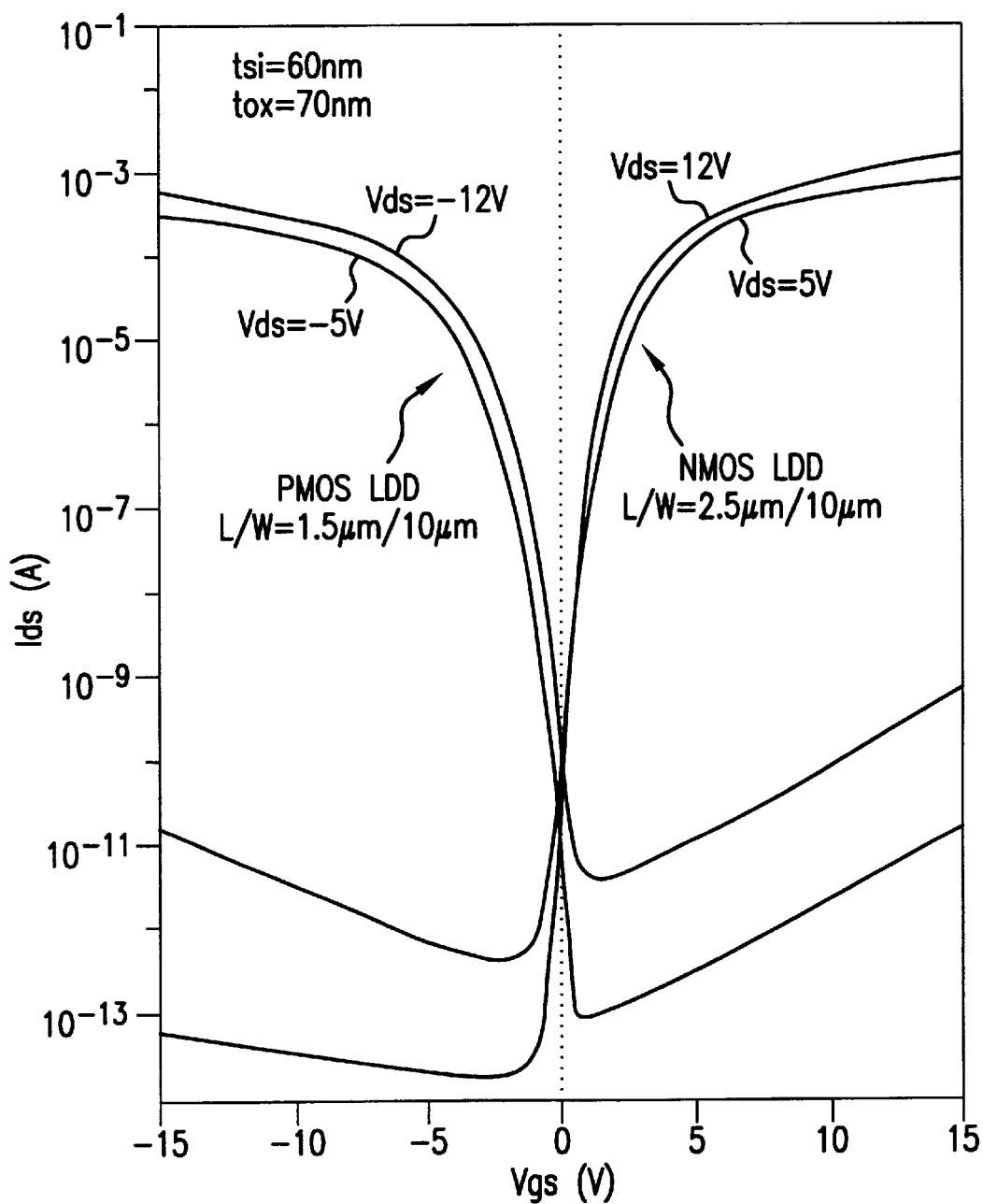
FIG. 43 is a graph of the transistor characteristics of an LDD-type TFT of the ninth embodiment.

FIG. 43 shows the transistor characteristics of the fabricated LDD-type TFT. The transistor dimensions of the n-channel LDD-type TFT (NMOS LDD) are L/W=2.5 μm/10 μm, the transistor dimensions of the p-channel LDD-type TFTs (PMOS LDD) are L/W=1.5 μm/10 μm, and the balance between the current supply capabilities of the NMOS LDD and the PMOS LDD is optimized. Comparing FIGS. 2 and 43, the OFF current in this ninth embodiment is extremely low. A sufficient ON current is obtained even when Vgs is 5 V or −5 V, thus the power voltage can be lowered. The ON current Ion of this NMOS LDD is 152 μA (Vds=Vgs=5 V) and the ON current Ion of the PMOS LDD is 30 μA (Vds=Vgs=−5 V).

In accordance with this embodiment, the threshold voltage dependency on Vds is greatly reduced for both the NMOS LDD and the PMOS LDD allowing the channel length to be shortened. Conventionally, when the channel length is 4 μm or less, the dependency of the threshold voltage on Vds is extremely large. The threshold voltage of the PMOS LDD only ranges over 1 V for Vds variations between Vds=−5 V and Vds=−12 V. The threshold voltage of the NMOS LDD only ranges over 0.3 V for the same Vds range. If the channel length is 5 μm or less for conventional devices, the corresponding variations in the threshold voltage due to the different values of Vds is at least several volts (5 V or more when L=4 μm). The contact resistance can also be reduced with this embodiment. Since the film quality of the polysilicon film of this embodiment is excellent, the sheet resistance is reduced even if the dose is lowered. The parasitic resistance of the source and the drain portions is reduced and the ON current is increased.

Page 49

Figure 44:
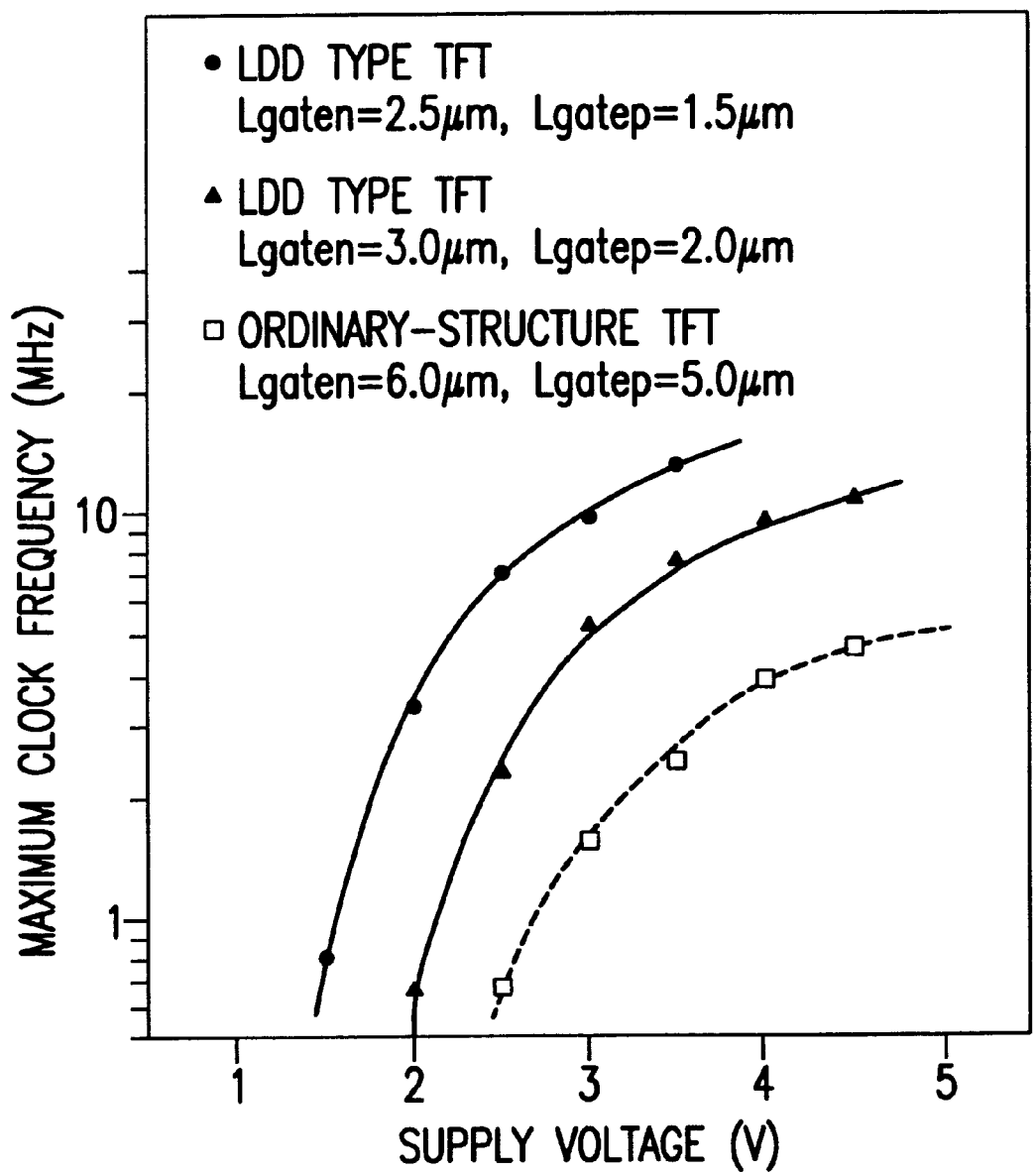
FIG. 44 is a graph of the maximum operating frequency of a shift register circuit using the LDD-type TFT of the ninth embodiment.

The relationship between the maximum clock frequency and supply voltage of a shift register circuit using the LDD-type TFT of this embodiment is shown by the characteristic diagrams in FIG. 44. The shift register circuit of this embodiment (Lgaten=2.5 μm, Lgatep=1.5 μm) operates at 10 MHz when the supply voltage is 3 V. The shift register operates at sufficient speeds even when the power voltage drops to 2 V or less. In contrast, the operational speed of an ordinary TFT is much slower at a power voltage of 3 V and a shift register circuit comprising the ordinary TFTs is virtually non-operable below a power voltage of 1.5 V.

FIG. 45 shows the measured contact resistance, the source and drain resistance, and the LDD resistance of the LDD-type TFTs in accordance with this embodiment and the comparative examples. The comparative examples are prepared by the first conventional fabrication method. As shown in FIG. 45, the contact resistance, the source and the drain resistance, and the LDD resistance of the transistors of this embodiment are all less than those of the comparative examples. In particular, it can be seen that the source and the drain resistances are far lower (one-fifth to one-fiftieth) than those of the comparative examples. Since the crystallinity of the polysilicon film of this embodiment is so high, the sheet resistance of the LDD portion is low, even when the dose of the LDD portion is low. Conventionally, when an LDD structure is used, the sheet resistance of the LDD portion is so high that a drop in the ON current is unavoidable. However, sheet resistance of the LDD portion in accordance with this embodiment is low enough that the parasitic resistance generated within the LDD portion can be minimized.

The relationship between the implantation dose and the maximum impurity concentration within the semiconductor film is discussed below. When the dose amount is denoted by N0 (cm$^{-2}$), the impurity concentration N(x) (cm$^{-3}$) is given by:

$$N(x) = N0/(2\pi)^{1/2}(\Delta Rp) \times \exp\{-(X-Rp)^2/2(\Delta Rp)^2\}$$

where

X: Distance from the surface

N(x): Concentration at x

Rp: Range

ΔRp: Range deviation

Therefore, the maximum impurity concentration Nmax is given by:

Page 50

$$Nmax = N(X=Rp) = N0/(2\pi)^{1/2}(\Delta Rp)$$

When the thickness of the gate insulation film (G-SiO$_2$) of the TFT is around 1000 Å to 1500 Å, the range deviation of ion implantation into the semiconductor film through the G-SiO$_2$ is about 400 Å (ΔRp~400 Å). Therefore, Nmax is given by:

$$Nmax = N0/(2\pi)^{1/2}(\Delta Rp)$$
$$= N0 \times 10^5$$

Thus, in FIG. 45, for example, when the dose N0 is 1×10$^{13}$ cm$^{-2}$, the maximum impurity concentration Nmax in the semiconductor film is 1×10$^{18}$ cm$^{-3}$.

Various calculations are performed below to compare the comparative examples and the TFTs of this embodiment, based on the data of FIG. 45. Since the contact resistance is inversely proportional to the area of the contact hole, the following values apply:

| Contact Hole Size | Comparative Example | Present Embodiment |
|---|---|---|
| 10 μm × 10 μm | 1.4 kΩ | 1.2 kΩ |
| 6 μm × 6 μm | 3.9 kΩ | 3.3 kΩ |
| 4 μm × 4 μm | 8.8 kΩ | 7.5 kΩ |
| 2 μm × 2 μm | 35 kΩ | 30 kΩ |
| 1 μm × 1 μm | 140 kΩ | 120 kΩ |

First, the parasitic resistances of NMOS and PMOS TFTs of comparative examples and this embodiment, when used in the shift register as shown in FIG. 44, are compared.

(1) This Embodiment (NMOS)

The dose of the LDD portion of the NMOS TFT in the shift register of FIG. 44 is 2×10$^{13}$ cm$^{-2}$. Therefore, it can be seen from FIG. 45 that the sheet resistance of the LDD portion is 36 kΩ/□. The parasitic resistance is calculated as follows:

Contact hole size=100 μm$^2$;

Contact resistance=1.2 kΩ;

Resistance of the source and the drain portions=(length of source and drain portions÷width of source and drain portions)×sheet resistance of source and drain portions=(7 μm/14 μm)×530 Ω/□=0.265 kΩ;

Resistance of LDD portion=(length of LDD portion÷width of LDD portion)×sheet resistance of the LDD portion=(2 μm/10 μm)×36 kΩ/□=7.2 kΩ;

Overall parasitic resistance=(contact resistance+resistance of source and drain portions+resistance of LDD portion)×2=(1.2 kΩ+0.265 kΩ+7.2 kΩ)×2=17.33 kΩ.

Since the ON-state channel resistance is 15.56 kΩ, the total ON-state resistance Ron is given by:

Page 51

Ron=17.33 kΩ+15.56 kΩ=32.89 kΩ.

Therefore, the ON current Ion is given by:

Ion=Vds/Ron=5 V/32.89 kΩ=152 μA.

(2) NMOS (Comparative Example)

Contact resistance=1.4 kΩ;

Resistance of source and drain portions=(7 μm/14 μm)× 2.6 kΩ/□=1.3 kΩ;

Resistance of LDD portion=(2 μm/10 μm)×180 kΩ/□=36 kΩ;

Overall parasitic resistance=(1.4 kΩ+1.3 kΩ+36 kΩ)×2= 77.4 kΩ.

Thus, since the overall parasitic resistance in the comparative example is large, it is not possible to lower the total ON-state resistance Ron, even when the channel is shortened and thus the ON-state channel resistance is not reduced. In contrast, the parasitic resistance in accordance with this embodiment does not become large even if LDD is implemented. This tendency is particularly obvious with a PMOS LDD, as shown below.

(3) PMOS (This Embodiment)

Contact resistance=1.18 kΩ;

Resistance of source and drain portions=(7 μm/14 μm)×50 kΩ=0.025 kΩ;

Resistance of LDD portion=(2 μm/10 μm)×13 kΩ=2.6 kΩ;

Overall parasitic resistance=(1.18 kΩ+0.025 kΩ+2.6 kΩ)×2=7.61 kΩ.

(4) PMOS (Comparative Example)

Contact resistance=1.4 kΩ;

p$^+$ source and drain resistance=(7 μm/14 μm)×2.6 kΩ=1.3 kΩ;

p$^-$ source and drain resistance=(2 μm/10 μm)×375 kΩ=75 kΩ;

Overall parasitic resistance=(1.4 kΩ+1.3 kΩ+75 kΩ)×2= 155.4 kΩ.

Thus there is a particularly dramatic difference between the overall parasitic resistance of a PMOS TFT of this embodiment and that of the comparative examples.

The description now turns to calculating the parasitic resistance when the contact holes become smaller as miniaturization increases. As an example, consider the case in which the contact hole size is 2 μm×2 μm=4 μm$^2$.

(5) This Embodiment (LDD Structure)

Contact resistance is reduced by placing the contact portion on the high-concentration source and drain portions where the dose is 3×10$^{15}$ cm$^{-2}$ and the dose in the LDD portion (low-concentration portion) is 2×10$^{13}$ cm$^{-2}$. Assume that the LDD length is 1 μm. First, from FIG. 39, if the dose of the source and the drain portions is set to 3×10$^{15}$ cm$^{-2}$, the contact resistance of a 10 μm×10 μm contact hole decreases to approximately 0.1 kΩ. Thus the contact resistance of a 2 μm×2 μm contact hole would be 2.5 kΩ.
Page 52

Contact resistance=(100 μm²/4 μm²)×0.1 kΩ=2.5 kΩ.

The resistances of the high-concentration source and drain portions and the LDD portion are determined as follows. From FIG. 46 the channel width is 10 μm and the channel length (gate length) is 2.5 μm. The distance from the edge portion of the gate electrode to the center of the contact hole is 4.5 μm, of which 1.0 μm is the LDD length. Since the LDD portion has a dose of $2\times10^{13}$ cm$^{-2}$, FIG. 45 shows that the sheet resistance is 36 kΩ/□. Since the LDD length is 1.0 μm and the width of the LDD portion is 10 μm, the resistance of the LDD portion is given by:

1 μm/10 μm×36 kΩ=3.6 kΩ.

Since the dose of the high-concentration source and drain portions is $3\times10^{15}$ cm$^{-2}$, three times that of the examples in FIG. 45, their sheet resistance is ⅓ or less than 530 Ω/□. The length of the high-concentration source and drain portions is the distance to the center of the contact hole (4.5 μm) less the LDD length (1 μm). Thus the resistance of the source and drain portions is:

(4.5 μm−1.0 μm)/10 μm 530 Ω/3=0.062 kΩ;

Overall parasitic resistance=(2.5 kΩ+0.062 kΩ+3.6 kΩ)×2=12.32 kΩ;

ON-state channel resistance=15.56 kΩ;

Ron=12.32 kΩ+15.56 kΩ=27.88 kΩ.

(6) Comparative Example (Ordinary Self-Aligned Structure)

With an ordinary self-aligned structure, the results are as described below. In order to avoid problems such as punch-through in the ordinary structure, the minimum channel length must be more than 5 μm and the implantation dose is $1\times10^{15}$ cm$^{-2}$ or more. The contact resistance taken from FIG. 45 is:

Contact resistance=(100 μm²/4 μm²)×1.2 kΩ=30 kΩ.

If the length of the high-concentration source and drain portions is the same as that described for the LDD structure of the embodiment in (5) above, and the length up to the center of the contact hole is 4.5 μm then:

Resistance of source and drain portions=4.5 μm/10 μm×530 Ω=0.24 kΩ;

Overall parasitic resistance=(30 kΩ+0.24 kΩ)×2=60.48 kΩ.

Since the channel length is long at 5 μm, the channel resistance in the ON state is increased more than twice in comparison with the 15.56 kΩ obtained when the channel length is 2.5 μm, and is approximately 33 kΩ. Thus,
Page 53

ON-state channel resistance=33 kΩ.

As a result:

Ron=60.48 kΩ+33 kΩ=93.48 kΩ.

As the devices are miniaturized, the contact holes become smaller, the overall parasitic resistance in the LDD-type TFT becomes much less than that of an ordinary structure. Moreover, since the channel length is shorter and the channel resistance is lower, Ron is effectively reduced even further.

(7) This Embodiment (LDD Structure with L=2.5 μm)

The ON current of the ordinary TFT is compared with the ON current of the LDD-type TFT in connection with FIGS. 29 and 46.

Consider a case in which the contact hole size is 6 μm×8 μm=48 μm², the dose of the source and the drain portions is $3\times10^{15}$ cm$^{-2}$, the dose of the LDD portion is $2\times10^{13}$ cm$^{-2}$, and the LDD length is 1.0 μm.

Contact resistance=(100 μm²/48 μm²)×0.1 kΩ=0.208 kΩ;

Resistance of source and drain portions=(4.5 μm−1.0 μm)/10 μm×(530 Ω Ω/3)=0.062 kΩ;

Resistance of LDD portion=(1 μm/10 μm)×36 kΩ=3.6 kΩ;

Overall parasitic resistance=(0.208 kΩ+0.062 kΩ+3.6 kΩ)×2=7.74 kΩ;

ON-state channel resistance (L/W=2.5 μm/10 μm)=15.56 kΩ.

Therefore, the total resistance in the ON state is given by:

Ron=7.74 kΩ+15.56 kΩ=23.3 kΩ.

(8) Comparative Example (Ordinary Structure)

Consider a case in which the minimum channel length is 5 μm and the dose of the source and drain portions for preventing punch-through is $1\times10^{15}$ cm$^{-2}$.

Contact resistance=(100 μm²/48 μm²)×1.2 kΩ=2.5 kΩ;

Length of source and drain portions=length to contact hole center=4.5 μm;

Resistance of source and drain portions=4.5 μm/10 μm×530 Ω=0.24 kΩ;

Overall parasitic resistance=(2.5 kΩ+0.24 kΩ)×2=5.48 kΩ;

Page 54

ON-state channel resistance (L/W=5 m/10 μm)=33 kΩ.

Therefore, the total resistance in the ON state is given by:

Ron=5.48 kΩ+33 kΩ=38.48 kΩ.

The overall parasitic resistance of an LDD structure is fairly large at 7.74 kΩ, but the total ON-state resistance can be made 40% smaller.

Since the maximum processing temperature is set to 1000° C. in this ninth embodiment, first, an amorphous semiconductor (a-Si) film is deposited at a deposition temperature of 495° C. and a deposition rate of 16 Å/minute. Secondly, the a-Si film is crystallized by solid phase crystallization method. Finally, thermal oxidation is performed. The throughput with a solid-phase crystallization method is poor and may be impractical from the fabrication viewpoint. If solid-phase crystallization is omitted for that reason, the thermal oxidation temperature could be increased by approximately 100° C. to produce exactly the same effect as a TFT obtained by solid-phase crystallization. Thus, if solid-phase crystallization is not performed in accordance with this embodiment, the thermal oxidation temperature can be set to 1100° C. to obtain the same quality film as the one using solid-phase crystallization.

To reduce the processing temperature and create a CMOS circuit from TFTs that operate at high speeds, the deposition of the amorphous film is performed at 530° C. or less, as shown in FIG. 16. In general, there are many defects within the crystals of a film obtained by solid-phase crystallization, but there are fewer defects within a film that is crystallized from a film deposited at a temperature of 530° C. or less. Both FIG. 16 and FIG. 45 demonstrate that, when atoms of an impurity such as boron (B) are implanted into a semiconductor film, polycrystalline silicon film, for example, of this embodiment, the sheet resistance of the source and the drain portions is as low as 50 Ω/□. The resistance of 2.6 kΩ/□ of the comparative examples is high in comparison.

After the boron atoms have been implanted into semiconductor film, these implanted impurity atoms are normally activated (positioning the boron or other atoms correctly at the Si lattice points) by annealing at 800° C. to 1000° C. For this embodiment, annealing is performed for 20 minutes at 1000° C. in a nitrogen atmosphere. If activation is for 20 minutes at 1000° C., nearly 100% of the implanted impurity atoms are activated.

Although the semiconductor films of this embodiment and of the comparative examples have the same impurity dose and the activation ratios of both are nearly 100%, there is a difference in the resultant source and drain resistances, as shown in FIG. 45. The semiconductor films of this embodiment have fewer crystal defects than in the comparative examples resulting in the resistance difference. Thus, the leakage current in the OFF state is reduced, as shown in FIG. 16. The collision times of the electrical conductors (holes with a PMOS device and electrons with an NMOS device) are extended and the probability of scattering due to crystal defects is reduced. Thus the source and drain resistance is reduced. Regardless of whether solid-phase crystallization is performed before the thermal oxidation, the poly-crystalline film converted from the amorphous film deposited at 530° C. or less has far fewer crystal defects.

A deposition rate of 6 Å/minute or more is preferable for making the grains of a polycrystalline film large. A deposition rate of 12 Å/minute or more provides for even better transistor characteristics as well as meeting mass production requirements. Further, the grains are larger and the carrier mobility is increased.

Page 52

The following are reasons why high-speed operation is implemented by a CMOS circuit of LDD-type TFTs fabricated by retarding the nucleus generation rate and accelerating the island growth rate.

A. Since the semiconductor film is made of large-area grains, the carrier mobility is large and there are few defects within the crystals. Thus, the leakage current in the OFF state is small and the subthreshold swing from the OFF state to the ON state is extremely small. The channel resistance Rch(on) in the ON state is reduced.

B. The sheet resistances of the LDD and the source and the drain portions are reduced. The use of the LDD structure restrains increases in parasitic resistance to a minimum.

C. The contact resistance is held low, even when components are miniaturized.

D. Channels are shortened.

E. Gate insulation films are thinner.

F. Yj (overlapping portions between source or drain and the gate electrode) are small.

The above reasons A to E increase the ON current, and reasons D and F reduce the transistor capacitance.

The method of fabricating an LDD-type TFT of this invention enables a broadening of the setting ranges of various fabrication-related parameters. The dose range of the LDD portion (particularly the lower limit) is required for setting conditions for optimizing the transistor ON/OFF ratio. For the ninth embodiment, the sheet resistance is ⅕ or less compared to devices fabricated conventionally, as shown in FIG. 45. The lower limit of the dose is set to be ⅕ or less for the same conventional sheet resistance. The dose of the LDD portion of the ninth embodiment is reduced to approximately $2\times10^{12}$ cm$^{-2}$. Thus the impurity dose of the LDD portion of an LDD-type TFT fabricated by retarding the nucleus generation rate and accelerating the island growth rate is preferably in the range of between $2\times10^{12}$ cm$^{-2}$ and $1\times10^{14}$ cm$^{-2}$. The preferable range of maximum impurity concentration is $2\times10^{17}$ cm$^{-3}$ to $1\times10^{19}$ cm$^{-3}$.

In the seventh embodiment (an LDD-type TFT fabricated without retarding the nucleus generation rate and accelerating the island growth rate), the range of LDD length is 0.6 μm to 4 μm, due to the restriction of accelerated diffusion along the grain boundaries from the high-dose-concentration regions. Since the grain boundaries in an LDD-type TFT fabricated by retarding the nucleus generation rate and accelerating the island growth rate are so much smaller, the accelerated diffusion is also less. See FIGS. 4 and 5. Therefore, retarding the nucleus generation rate and accelerating the island growth rate enables a shortening of the minimum LDD length to approximately 0.3 μm. This LDD length is now preferably in the range of between 0.3 μm and 4 μm. The shortened LDD length reduces the parasitic resistance based in the LDD portion.

Page 56

The positional relationship between LDD portions 216 and 218 and contact holes 232 and 234, with reference to the model of FIG. 46 is now described. In view of the above, the LDD length is shortened such that the effective LDD length is not reduced to zero by the accelerated diffusion from the high-dose-concentration source and drain portions. It is also preferable that the contact holes 232 and 234 are located close to a gate electrode 210 to reduce the sheet resistance of the corresponding source portion 212 and drain portion 214. This also increases the degree of circuit integration.

It is preferable that the contact holes 232 and 234 are opened within the high-dose-concentration source and drain portions 212 and 214 to reduce the contact resistance. The above conditions align the edges 224 and 226 of the contact holes 232 and 234 closest to the gate electrode 210 with the boundaries between LDD portions 216 and 218 and the source and drain portions 212 and 214. The boundaries 220 and 222 are indicated by broken lines in FIG. 46. This alignment reduces the contact resistance and the resistance of the source and the drain portions as well as allows miniaturization of the components.

However, factors such as slipping of masks make it extremely difficult to align the contact hole edges 224 and 226 with the boundaries 220 and 222. The contact holes 232 and 234 can be located slightly into the LDD portions 216 and 218. Alternatively, the contact holes 232 and 234 can be located slightly outside the LDD portions. Experiments have confirmed that if discrepancies in the locations of the edge 224 and 226 and the boundaries 220 and 222 lead to approximately 20% of the contact hole areas intruding into the LDD portions without adverse device effects. FIG. 46 shows that the length of each contact hole is 6.0 μm. The contact resistance is not greatly increased if the contact holes intrude by 1.2 μm into the LDD portions. For example, if the edges 224 and 226 are aligned to the boundaries 220 and 222 on the mask and a slippage of the mask causes the contact hole 232 on the source portion side to intrude by 1.2 μm into the LDD portion 216, the other contact hole 234 will be 1.2 μm outside the other LDD portion 218. Thus the distance from the edge 224 to the gate electrode 210 is 0.8 μm and the distance from the edge 226 to the gate electrode 210 is 3.2 μm.

The sum of the source-side LDD length Lldds and the drain-side LDD length Llddd (Lldds+Llddd) is equal to the sum of the distance Lconts from the source-side contact hole edge 224 to the gate electrode 210 and the distance Lcontd from the drain-side contact hole edge 226 to the gate electrode 210 (Lconts+Lcontd). To reduce the parasitic resistance, it is preferable that the following conditions are satisfied:

Page 57

$$0.8\times \text{Lldds} \leq \text{Lconts} \leq 1.2\times \text{Lldds};$$

$$0.8\times \text{Llddd} \leq \text{Lcontd} \leq 1.2\times \text{Llddd}.$$

The NMOS and PMOS TFTs of the CMOS TFT circuit of this embodiment both have an LDD-type configuration. When a semiconductor film is provided by a deposition method retarding the nucleus generation and accelerating the island growth, the PMOS source and drain sheet resistance, which is 50 Ω/□ even at a dose of 1×10$^{15}$ cm$^{-2}$, as shown in FIG. 45, is 1/50 or less of the 2.6 kΩ/□ of the comparative examples. The sheet resistance of the PMOS LDD portion, which is 13 kΩ/□, is also 1/30 or less than the 375 kΩ/□ of the comparative examples.

As previously described, the semiconductor film obtained by this embodiment is made up of large crystal grains and there are few defects within the crystals. Exploiting the high quality semiconductor film, the source and the drain portions, which are implanted with acceptors to a high concentration is omitted and the entire source and drain portion region is a low-concentration region, at least on the PMOS side. The NMOS side of the CMOS circuit has the same LDD structure as the NMOS TFT shown in FIG. 26, but the PMOS TFT is the ordinary self-aligned structure shown in FIG. 27 by implanting acceptors into the source and the drain regions at a low-concentration dose. Even though the PMOS TFT is implanted by the low-concentration impurity, the sheet resistance of this embodiment is still sufficiently low for high speed operations.

If the metal wiring is the electrically conductive material such as aluminum (Al), indium (In), indium tin oxide (ITO), palladium (Pd), or platinum (Pt), a p-type thin-film semiconductor layer is formed on the junction surface between the electrically conductive material and the semiconductor film. The contact resistance can be held low because this conductive material is in contact with silicon surface and forms a p-type semiconductive layer. This p-type semiconductor layer has the same electrical characteristics as a source and drain of a p-type semiconductor in which boron is implanted, and thus it exhibits good contact characteristics. Thus, if the PMOS source and drain portions are formed of an ordinary self-aligned structure and the concentration of the implanted impurity is set to be between 5×10$^{17}$ cm$^{-3}$ (in dose terms: 5×10$^{12}$ cm$^{-2}$) and 5×10$^{19}$ cm$^{-3}$ (in dose terms: 5×10$^{14}$ cm$^{-2}$), a CMOS circuit capable of high-speed operation is obtained, without having to use an LDD-type structure.

The maximum impurity concentration of the PMOS source and drain portions is preferably varied by adjusting the gate length Lgatep. If the gate length is 4 m or more, the maximum impurity concentration of the PMOS source and drain portions is preferably in the range of between 5×10$^{18}$ cm$^{-3}$ (dose: 5×10$^{13}$ cm$^{-2}$) and 5×10$^{19}$ cm$^{-3}$ (dose: 5×10$^{14}$ cm$^{-2}$). With a gate length of 4 μm or less, the maximum impurity concentration of the PMOS source and drain portions is preferably in the range of between 5×10$^{17}$ cm$^{-3}$ (dose: 5×10$^{12}$ cm$^{-2}$) and 5×10$^{18}$ cm$^{-3}$ (dose: 5×10$^{13}$ cm$^{-2}$). By making the entire region of the source and drain portions of low concentration in the PMOS side alone, the process of fabricating the TFT can be reduced by one photoprocessing step in comparison with the fabrication of a PMOS LDD-type TFT. This not only simplifies the process, but also provides for easier circuit integration.
Page 58

Tenth Embodiment

An active matrix liquid crystal display device 80 comprises three main components: an active matrix portion 81, a data driver portion 82, and a scan driver portion 83, as shown in FIG. 47. The active matrix portion 81 comprises signal lines 90, scan lines 91, and pixel TFTs 92 provided at the intersections between the signal and scan lines, a liquid crystal capacitance 94 and a storage capacitance 93 connected to the drain edges of each of the pixel TFTs. Since these pixel TFTs are of the same LDD-type as the TFT of the peripheral drive circuits, the OFF resistance is high compared to the liquid crystal and crosstalk is prevented. The liquid crystal material of the active matrix portion 81 can be different field effect type of liquid crystal materials and not limited to twisted nematic liquid crystals. An LDD-type CMOS TFT circuit having high value of breakdown voltage can easily drive a liquid crystal requiring high voltage to function, such as a polymer dispersed liquid crystal or a guest/host type of liquid crystal.

The data driver portion 82 comprises a shift register 84, a level shifter 85, video lines 87, and analog switches 86. If the video signal is serially driven, the number of the shift register stages is equal to the number of signal lines 90, but if it writes to n signal lines 90 simultaneously, the number of stages could be 1/n times the number of signal lines 90.

In a liquid crystal display device using color filters, it is common that the number of video lines is equal to the number of colors in the color filters multiplied by any integer. This configuration leaves out color rotation in the video signal. Since the analog switch 86 must be able to write the video signal to the signal lines 90 at an extremely high speed, the analog switch must have a high gate voltage. Therefore, the level shifter 85 raises the voltage of sampling pulses to a sufficiently high level.

The scan driver portion 83 comprises a shift register 88 and a level shifter 89. The scan driver portion 83 selects scan lines of the active matrix portion 81 in synchronization with the video signal. Since these peripheral drive circuits operate at the high speeds provided by the LDD-type CMOS TFT circuits fast operating speeds are achieved even at lower drive voltages.

For example, a shift register circuit using conventional TFTs requires a high drive voltage in the region of 10 V, but the shift register circuit using the LDD-type CMOS TFTs of the invention provides high operating speeds at the TTL level of 5 V. Thus, the outputs of an external timing controller can also operate using TTL levels. In addition the active matrix liquid crystal device circuitry can be more compact and requires lower power consumption. If a controller is also integrated on the substrate using TFTs, the device could be made even more compact.

FIG. 47 illustrates an active matrix liquid crystal display device that uses a dot-sequential analog method, but this embodiment can be applied equally well to a line-sequential analog method or digital method, using LDD-type CMOS TFT circuits to enable high-speed operation.

A specific pixel pattern is described. A plan view and cross-sectional view of a pixel portion of a liquid crystal display device using LDD-type TFTs in the pixels are shown in FIGS. 48A and 48B. In general, in order to obtain a bright screen for a liquid crystal display device, the aperture portion of each pixel must be large. Since an increase in resolution results in a decrease in pixel pitch, it is important to form as large an aperture portion as possible with a small pixel pattern.

In this embodiment, the design minimizes the decrease in aperture area due to the existence of the pixel TFT by using the gate line 102 without modification as a gate electrode and placing the pixel TFT under the metal line 103. The decrease in aperture area is further minimized by forming the storage capacitance with one electrode of a thin semiconductor film 104 which extends under the previous-stage gate line and another electrode of the previous-stage gate line. Since the metal line 103 is sandwiched between a first interlayer insulation film 105 and a second interlayer insulation film 106, a transparent conductive film 101 that directly drives the liquid crystal overlaps both the gate line and the metal line but does not short them. If a non-transparent film of a material such as a high-melting-point metal is used in the gate line 102, it can also function as a light-shielding layer as well as metal line, and thus it becomes unnecessary to use a black matrix that is ordinarily formed on opposing substrates, which enables a further increase in aperture efficiency.

Page 59

The above embodiment has been described with reference to a liquid crystal display device, but this LDD-type CMOS TFT can equally well be used in other type of flat-panel displays. For example, an active matrix display device could also be implemented by using an electro-optical material that is not a liquid crystal. Since an LDD-type TFT circuit has a high breakdown voltage, it is particularly suitable for driving a material with a high drive voltage.

If the switching circuitry of the active matrix portion is formed of electro-optical conversion circuits, this embodiment can also be used to implement electroluminescent displays and plasma displays.

Eleventh Embodiment

This embodiment provides a specific example of a CMOS circuit using the LDD-type TFTs. A circuit diagram and a timing chart of a bidirectional shift register are shown in FIGS. 49A and 49B. As shown in FIG. 49A, this shift register is a combination of four clocked gates. The attached arrows and symbols show that each gate operates as an inverter when the indicated signals are high and is at high impedance when the signals are low. When R is high and L is low, the shift register shifts to the right (a right shift) and when R is low and L is high, the shift register shifts to the left (a lift shift). A clock signal CL determines the timing of the shift and $\overline{CL}$ is a clock signal 180° out of phase with the dock signal CL.

The operation of this circuit is described with reference to FIG. 49B. For a right shift, one of the four gates connected to the L signal is always in the high-impedance state and data is transferred by the remaining three gates. If a signal waveform DR is input at the left end, as shown in FIG. 49A, the same waveform is shifted to the right at each half-cycle of the clock signal CL resulting in output signals P and Q as shown in FIG. 49B. Similarly, for a left shift, one of the four gates connected to the R signal is always in the high-impedance state, and data is transferred by the remaining three gates. If a signal waveform DL is input at the right end, as shown in FIG. 49A, the same waveform is shifted to the left at each half-cycle of the clock signal CL resulting in output signals P and Q as shown in FIG. 49B.

Page 60

In general, a bidirectional shift register has the disadvantage that it operates at a slower speed than a single-direction shift register. However, if the LDD-type CMOS TFT circuits of the invention are used, even a bidirectional shift register operates at a speed equal to or exceeding that of a single-direction shift register. When this bidirectional shift register is used in a liquid crystal display device, mirror-reflected inversion of the screen image is achieved so that the same device can be used for both a front projector and a rear projector, for example.

In a liquid crystal projector where each of three R, G, and B light is allowed to pass through their own liquid crystal display device and the lights are combined for projection, restrictions on the optical system dictate that at least one of the three liquid crystal display devices has to display a mirror-reflected image. If this bidirectional shift register is used, the same type of liquid crystal display device can be used for all three colors in the system.

A circuit diagram and a timing chart of an example of a single-direction shift register are shown in FIGS. 50A and 50B. FIG. 50A shows paired shift registers. A NOR gate shortens the pulse widths of outputs from these two shift registers. FIG. 50B shows that two clock signals CL2 are delayed by 90° from two clock signals CL1. In FIG. 50B, when the signal waveforms D1 and D2 are input to the left end of the circuit, the paired shift registers shift the waveforms to the right at each half-cycle of the clock signal. FIG. 50B shows the output waveforms P and Q output from the NOR gates. Since the frequency of the output pulses of this circuit can be four times the clock frequency, an extremely fast circuit is provided. If this circuit is made up of the LDD-type CMOS TFTs of the invention, an HDTV-compatible high-speed data driver is provided.

FIGS. 51A and 51B show a circuit diagram and a timing chart of a level shifter. This circuit converts the voltage of signals that drive the logic portion and active matrix of a liquid crystal display device. In FIG. 51 A, the input signals and inversions of the input signals are input to an n-channel TFT and a p-channel TFT. Outputs OUT1 and OUT2 are extracted from connecting portions between two cascade-connected p-channel TFTs and the input TFTs. The two cascade-connected p-channel TFTs are connected to a power voltage VDD at a level higher than the input signal levels. When a VCC-level input signal IN is applied, the two outputs OUT1 and OUT2 output VDD-level signals, as shown in FIG. 51B. This circuit has the p-channel TFTs connected on the input side, which control the current flowing to another p-channel TFTs on the VDD side to prevent misoperation of the circuit.

In general, a level shifter must operate at a high speed, even for low input voltage levels. The breakdown voltage between the source and the drain must allow the high output voltage. Both the n-channel and p-channel LDD-type TFTs of the invention enable the implementation of high operating speeds and high breakdown voltages, thus greatly improving the capabilities of level shifter TFT circuits.

Page 61

A circuit diagram of an example of an analog line-sequential data driver is shown in FIG. 52. Since a continuous current with a DC bias flows through this analog buffer circuit, it has been difficult to provide reliable TFT circuits for this function. However, since an LDD-type CMOS TFT is extremely reliable and its characteristics does not change appreciably while a current flow through the TFT for long periods of time, a driver using an TFT analog buffer circuit is provided.

A video signal from a video line Vid is temporarily held in an analog latch A. The video signal is transferred to an analog latch B by latch pulses LP. The signal in the analog latch B is supplied to an analog buffer, so that the analog buffer outputs to the signal line of a fairly large liquid crystal display device.

A circuit diagram of an example of a 2-bit digital data driver is shown in FIG. 53. In general, an n-bit digital driver inputs n digital input signals D1, D2 . . . Dn and with these input signals to a group of n latches A. The input signals are then transferred to a group of n latches B. The data in the latches B select one of $2^n$ analog switches according to a decoder, and one voltage from a group of $2^n$ drive signals V1, V2 . . . Vn is written to a signal line.

With a multi-bit digital driver, some of the drive voltages are generated internally. To simplify the driver circuit, a combination of methods are used, such as a frame rate control method that supplements gradation data by using a plurality of frames and an area gradation method that supplements gradations by a plurality of pixels. D/A conversion by a pulse width modulation can be used. Since the LDD-type CMOS TFT circuits of the invention permits digital circuits to operate at high speeds, a high-definition data display can be provided.

Complicated circuits can be designed by combining these simple circuits. For example, a timing controller that supplies timing signals to the peripheral drive circuits of a display device can be designed using the high-speed CMOS TFT circuits of the invention. Since these LDD-type CMOS TFTs are very reliable, op amps, digital-to-analog conversion circuits, analog-to-digital conversion circuits, and memory circuits can be implemented using the LDD-type CMOS TFTs. Thus, while only the peripheral drive circuit is integrated with conventional TFTs, the invention provides the integration of more complicated systems such as video signal amplification devices or signal frequency converters using the TFTs.

Twelfth Embodiment

This embodiment is a display system that uses the LDD-type CMOS TFTs. A block diagram of a display system using an active matrix liquid crystal display device is shown in FIG. 54. Video signals and timing signals from a video signal generation circuit of a computer or other video sources are simultaneously output. These video signals are necessary for a dedicated video signal amplification circuit that is required for amplifying the signals for a liquid crystal drive. If necessary, this amplification circuit also performs frequency conversion and γ correction of the video signal. If an analog video signal requires frequency conversion, A/D conversion circuits, memory circuits, and D/A conversion circuits are also necessary.

Page 62

The timing controller shapes timing signals for driving the data driver and scan driver. By applying the optimal signals to this liquid crystal display device, the capabilities of the liquid crystal display device are demonstrated. Since a liquid crystal display device using the LDD-type CMOS TFT circuits of the invention operates at high speeds, the frequencies at the video signal amplification circuit need not be reduced. Since the logic portion can be driven at a low voltage, the output levels of the timing controller can be TTL compatible. Further, part or all of the video signal amplification circuit and the timing controller and the video signal generator can be integrated using TFTs. By integrating such a complicated system with high-speed TFT circuits, an ultra-small information device is provided. The range of possible applications for TFT circuits is beyond display systems.

The invention is not limited to the above described embodiments. The invention can be embodied in various forms within the scope of the claims of the invention.

For example, the thin-film semiconductor device of the invention is not only applicable to liquid crystal display devices, but can be used in a wide range of circuits that use single-crystal MOSFETs such as digital circuits and analog circuits. The carrier mobility and ON current of each of an amorphous TFT, prior art polycrystalline TFTs (of LDD and ordinary structures), thin-film semiconductor devices of this invention (of LDD and ordinary structures), and a single-crystal MOSFET are listed in FIG. 55. As shown in FIG. 55, the present invention enables an ON current that is not inferior to that of a single-crystal MOSFET. Since the thin-film semiconductor device is formed on an insulating substance, virtually no noise is transmitted from the substrate. Therefore, if the thin-film semiconductor device of the invention is used in a high-performance analog circuit, the characteristics are markedly improved. Comparing FIG. 34 with FIG. 33B in terms of integration density, the thin-film semiconductor device of the invention using the short channel length is equal to a single-crystal MOSFET. Thus the thin-film semiconductor device of the invention can be used in circuits in an extremely wide range of fields.

What is claimed is:

1. A thin-film semiconductor device comprising an N type polycrystalline thin film transistor formed on an insulating material portion which covers at least one portion of a surface of a substrate, wherein said N type polycrystalline thin film transistor comprises:
    a first impurity-doped semiconductor film located in a source portion and a drain portion of the thin-film semiconductor device and a maximum impurity concentration of said first impurity-doped semiconductor film being between approximately $5 \times 10^{19}$ cm$^{-3}$ and approximately $1 \times 10^{21}$ cm$^{-3}$; and
    a second impurity-doped semiconductor film located in one of at least an area between the drain portion and a channel portion and an area between the source portion and the channel portion of said thin-film semiconductor device, and a maximum impurity concentration of said second impurity-doped semiconductor film being between approximately $1 \times 10^{18}$ cm$^{-3}$ and approximately $1 \times 10^{19}$ cm$^{-3}$, an LDD length in one of said drain portion and said source portion being between approximately 1 μm and approximately 4 μm, and a length of a gate electrode being 5 μm or less.

2. A thin-film semiconductor device comprising a non-single-crystal semiconductor film formed on an insulating material portion which covers at least one portion of a surface of a substrate, wherein said non-single-crystal semiconductor film comprises:
    a first impurity-doped semiconductor film located in a source portion and a drain portion of the thin-film semiconductor device; and
    a second impurity-doped semiconductor film located in at least one of an area between the drain portion and a channel portion and an area between the source and the channel portions of said thin-film semiconductor device, and wherein an LDD length of a drain portion is Llddd, a distance from a channel portion side edge of a contact hole in said drain portion to a gate electrode is Lcontd, and $$0.8 \times Llddd \leq Lcontd \leq 1.2 \times Llddd.$$

3. A thin-film semiconductor device comprising a non-single-crystal semiconductor film formed on an insulating material portion which covers at least one portion of a surface of a substrate, wherein said non-single-crystal semiconductor film comprises:
    a first impurity-doped semiconductor film located in a source portion and a drain portion of the thin-film semiconductor device; and
    a second impurity-doped semiconductor film located in at least one of an area between the drain portion and a channel portion and an area between the source and the channel portions of said thin-film semiconductor device, and wherein an LDD length of said source portion is Lldds, a distance from a channel portion side edge of a contact hole in said source portion to a gate electrode is Lconts, and $$0.8 \times Lldds \leq Lconts \leq 1.2 \times Lldds.$$

4. A thin-film semiconductor device comprising a non-single-crystal semiconductor film formed on an insulating material portion which covers at least one portion of a surface of a substrate, wherein said non-single-crystal semiconductor film is deposited by a chemical vapor deposition method and has an average grain area of at least approximately 10,000 nm², said non-single-crystal semiconductor film comprising:

a first impurity-doped semiconductor film located in a source portion and a drain portion of the thin-film semiconductor device; and a second impurity-doped semiconductor film located in at least one of an area between the drain portion and a channel portion and an area between the source portion and the channel portion of said thin-film semiconductor device, wherein a maximum impurity concentration of said second impurity-doped semiconductor film is between approximately $2 \times 10^{17}$ cm$^{-3}$ and approximately $1 \times 10^{19}$ cm$^{-3}$.

5. A thin-film semiconductor device comprising a non-single-crystal semiconductor film formed on an insulating material portion which covers at least one portion of a surface of a substrate, wherein said non-single-crystal semiconductor film is deposited by a chemical vapor deposition method and has an average grain area of at least approximately 10,000 nm², said non-single-crystal semiconductor film comprising:

a first impurity-doped semiconductor film located in a source portion and a drain portion of the thin-film semiconductor device; and a second impurity-doped semiconductor film located in at least one of a first area between the drain portion and a channel portion and a second area between the source portion and the channel portion of said thin-film semiconductor device, wherein an LDD length of at least one of said second impurity-doped semiconductor film located in the first area between the drain portion and the channel portion and said second impurity-doped semiconductor film located in the second area between the source portion and the channel portion is between approximately 0.3 μm and approximately 4 μm.

6. A thin-film semiconductor device comprising a non-single-crystal semiconductor film formed on an insulating material portion which covers at least one portion of a surface of a substrate, wherein said non-single-crystal semiconductor film is deposited by a chemical vapor deposition method and has an average grain area of at least approximately 10,000 nm², said non-single-crystal semiconductor film comprising:

a first impurity-doped semiconductor film located in a source portion and a drain portion of the thin-film semiconductor device; and a second impurity-doped semiconductor film located in at least one of an area between the drain portion and a channel portion and an area between the source portion and the channel portion of said thin-film semiconductor device, wherein a length of a gate electrode formed on said non-single-crystal semiconductor film is approximately 5 μm or less, a gate insulation film being formed between said gate electrode and said non-single-crystal semiconductor film.

7. A thin-film semiconductor device comprising a non-single-crystal semiconductor film formed on an insulating material portion which covers at least one portion of a surface of a substrate, wherein said non-single-crystal semiconductor film is deposited by a chemical vapor deposition method and has an average grain area of at least approximately 10,000 nm², said non-single-crystal semiconductor film comprising:

a first impurity-doped semiconductor film located in a source portion and a drain portion of the thin-film semiconductor device; and a second impurity-doped semiconductor film located in at least one of a first area between the drain portion and a channel portion and a second area between the source portion and the channel portion of said thin-film semiconductor device, wherein an LDD length of said second impurity-doped semiconductor film located in the first area between the drain portion and the channel portion is Llddd and a distance from a channel portion side edge of a contact hole in said drain portion to a gate electrode is Lcontd, and $$0.8 \times \text{Llddd} \leq \text{Lcontd} \leq 1.2 \times \text{Llddd}.$$

8. A thin-film semiconductor device comprising a non-single-crystal semiconductor film formed on an insulating material portion which covers at least one portion of a surface of a substrate, wherein said non-single-crystal semiconductor film is deposited by a chemical vapor deposition method and has an average grain area of at least approximately 10,000 nm, said non-single-crystal semiconductor film comprising:

a first impurity-doped semiconductor film located in a source portion and a drain portion of the thin-film semiconductor device; and a second impurity-doped semiconductor film located in at least one of a first area between the drain portion and a channel portion and a second area between the source portion and the channel portion of said thin-film semiconductor device, wherein an LDD length of said second impurity-doped semiconductor film located in the second area between the source portion and the channel portion is Lldds and a distance from a channel portion side edge of a contact hole in said source portion to a gate electrode is Lconts, and $$0.8 \times \text{Lldds} \leq \text{Lconts} \leq 1.2 \times \text{Lldds}.$$

9. A CMOS circuit comprising a thin-film semiconductor device and a non-LDD type transistor, the CMOS circuit comprising a non-single-crystal semiconductor film formed on an insulating material portion which covers at least one portion of a surface of a substrate, wherein said non-single-crystal semiconductor film is deposited by a chemical vapor deposition method and has an average grain area of at least approximately 10,000 nm², said non-single-crystal semiconductor film comprising:

a first impurity-doped semiconductor film located in a source portion and a drain portion of the thin-film semiconductor device; and a second impurity-doped semiconductor film located in at least one of an area between the drain portion and a channel portion and an area between the source portion and the channel portion of said thin-film semiconductor device, wherein an n-type thin-film transistor of the CMOS circuit is the thin-film semiconductor device and a p-type thin-film transistor is the non-LDD type transistor, the p-type thin film transistor having said second impurity-doped semiconductor film arranged over an entire region of a source portion and a drain portion of the p-type thin-film transistor having an impurity-doped semiconductor film implanted with a p-type impurity.

10. A thin-film semiconductor device comprising a p-type polycrystalline thin film transistor formed on an insulating material portion which covers at least one portion of a surface of a substrate, wherein said p-type polycrystalline thin film transistor comprises:

a first impurity-doped semiconductor film located in a source portion and a drain portion of the thin-film semiconductor device and a maximum impurity concentration of said first impurity-doped semiconductor film is between approximately $5 \times 10^{19}$ cm$^{-3}$ and approximately $1 \times 10^{21}$ cm$^{-3}$; and a second impurity-doped semiconductor film located one of at least an area between the drain portion and a channel portion and an area between the source portion and the channel portion of said thin-film semiconductor device, and a maximum impurity concentration of said second impurity-doped semiconductor film being between approximately $1 \times 10^{18}$ cm$^{-3}$ and approximately $1 \times 10^{19}$ cm$^{-3}$, an LDD length in one of said drain portion and said source portion being between approximately 1 μm and approximately 4 μm and a length of a gate electrode being 5 μm or less.

11. A CMOS circuit comprising a p-type thin film transistor and an n-type thin film transistor, the CMOS circuit comprising:

the p-type thin film transistor having a first p-typed impurity-doped semiconductor film implanted with p-type impurities and a second p-typed impurity-doped semiconductor film implanted with p-type impurities, the first p-typed impurity-doped semiconductor film located in a p-type source portion and a p-type drain portion of the p-type thin film transistor, the second p-typed impurity-doped semiconductor film located in at least one of an area between the p-type drain portion and a channel portion of the p-type thin film transistor and an area between the p-type source portion and the channel portion of the p-type thin film transistor;

the n-type thin film transistor having a first n-typed impurity-doped semiconductor film implanted with n-type impurities and a second n-typed impurity-doped semiconductor film implanted with n-type impurities, the first n-typed impurity-doped semiconductor film located in an n-type source portion and an n-type drain portion of the n-type thin film transistor, and the second n-typed impurity-doped semiconductor film located in at least one of an area between the n-type drain portion and a channel portion of the n-type thin film transistor and an area between the n-type source portion and the channel portion of the n-type thin film transistor, wherein a gate electrode length of said p-typed thin film transistor is shorter than a gate electrode length of said n-type thin film transistor.

12. The CMOS circuit as defined in claim 11, wherein the gate electrode length of said p-type thin-film transistor and the gate electrode length of said n-type thin-film transistor are each approximately 5 μm or less.

13. The CMOS circuit as defined in claim 11, wherein a channel width of said n-type thin-film transistor is less than a channel width of said p-type thin-film transistor.

14. The CMOS circuit as defined in claim 13, wherein a gate electrode length of said p-type thin-film transistor and a gate electrode length of said n-type thin-film transistor are each approximately 5 μm or less.

* * * * *